(12) United States Patent
Liao et al.

(10) Patent No.: US 12,406,189 B2
(45) Date of Patent: Sep. 2, 2025

(54) MULTI-THREAD DISTRIBUTED TRAINING OF A RECOMMENDER MODEL

(71) Applicant: SAS INSTITUTE INC., Cary, NC (US)

(72) Inventors: Xuejun Liao, Cary, NC (US); Patrick Nathan Koch, Morrisville, NC (US)

(73) Assignee: SAS INSTITUTE INC., Cary, NC (US)

( * ) Notice: Subject to any disclaimer, the term of this patent is extended or adjusted under 35 U.S.C. 154(b) by 0 days.

(21) Appl. No.: 18/583,837

(22) Filed: Feb. 21, 2024

(65) Prior Publication Data

US 2025/0068927 A1    Feb. 27, 2025

Related U.S. Application Data

(60) Provisional application No. 63/540,315, filed on Sep. 25, 2023, provisional application No. 63/534,561, filed on Aug. 24, 2023.

(51) Int. Cl.
*G06N 3/098* (2023.01)
*G06F 16/9536* (2019.01)
(Continued)

(52) U.S. Cl.
CPC ......... *G06N 3/098* (2023.01); *G06F 16/9536* (2019.01); *G06F 17/16* (2013.01); *G06F 30/27* (2020.01); *G06N 20/00* (2019.01)

(58) Field of Classification Search
CPC .... G06N 3/098; G06N 20/00; G06F 16/9536; G06F 17/16; G06F 30/27
See application file for complete search history.

(56) References Cited

U.S. PATENT DOCUMENTS 10,235,403 B2 * 3/2019 Rossi ............... G06Q 30/02
11,379,743 B2   7/2022 Liao et al.
(Continued)

OTHER PUBLICATIONS

Wang et al., "Generative Recommendation: Towards Next-generation Recommender Paradigm" Apr. 7, 2023, arXiv: 2304.03516v1, pp. 1-10. (Year: 2023).*

(Continued)

*Primary Examiner* — Miranda M Huang
*Assistant Examiner* — Chase P. Hinckley
(74) *Attorney, Agent, or Firm* — Padowithz Alce; Quintin Scheitlin; Alce PLLC

(57) ABSTRACT

A system, method, and computer-program product includes receiving an input comprising a plurality of pre-defined factor matrices and an implicit feedback dataset partitioned into a plurality of implicit feedback data subsets; distributing the input across a controller node and a plurality of worker nodes implemented in a distributed computing environment; and training a model using the controller node and the plurality of worker nodes, wherein training the model includes: initializing, by the controller node, a controller-specific user parameters matrix and a controller-specific item parameters matrix, broadcasting, by the controller node, the controller-specific user parameters matrix and the controller-specific item parameters matrix to each worker node of the plurality of worker nodes, and concurrently executing an aggregation model training algorithm at the controller node and a plurality of localized model training algorithms across the plurality of worker nodes until a training termination condition is satisfied.

30 Claims, 26 Drawing Sheets

(51) Int. Cl.
  *G06F 17/16*  (2006.01)
  *G06F 30/27*  (2020.01)
  *G06N 20/00*  (2019.01)

(56) References Cited

U.S. PATENT DOCUMENTS

| | | | |
|---|---|---|---|
| 11,544,767 B2 | 1/2023 | Liao et al. | |
| 2012/0030159 A1* | 2/2012 | Pilaszy | G06Q 10/00 706/46 |
| 2015/0213389 A1* | 7/2015 | Modarresi | G06Q 10/06393 705/7.39 |
| 2015/0248618 A1* | 9/2015 | Johnson | G06F 16/635 706/46 |
| 2017/0116157 A1* | 4/2017 | Fong | G06F 17/16 |
| 2017/0132509 A1* | 5/2017 | Li | G06N 3/045 |
| 2017/0148085 A1* | 5/2017 | Tang | G06Q 30/0631 |
| 2017/0206551 A1* | 7/2017 | Gupta | G06Q 30/0254 |
| 2018/0330192 A1* | 11/2018 | Atasu | G06F 18/2321 |
| 2019/0362220 A1* | 11/2019 | Yap | G06N 3/045 |
| 2020/0134490 A1* | 4/2020 | Chen | G06Q 30/02 |
| 2020/0143448 A1* | 5/2020 | Steck | G06N 3/08 |
| 2020/0320072 A1* | 10/2020 | Hormati | G06F 16/2453 |
| 2021/0056126 A1* | 2/2021 | Pham | G06F 17/18 |
| 2021/0383254 A1* | 12/2021 | Renders | G06N 3/045 |
| 2022/0107872 A1* | 4/2022 | Kondrashkin | G06F 18/2113 |
| 2022/0114643 A1* | 4/2022 | Raziperchikolaei | G06Q 30/0282 |
| 2022/0237685 A1* | 7/2022 | Liao | G06Q 30/0631 |
| 2022/0253688 A1* | 8/2022 | Wu | G06Q 30/0631 |
| 2022/0253722 A1* | 8/2022 | Wu | G06Q 30/0631 |
| 2022/0270155 A1* | 8/2022 | Volkovs | G06N 3/08 |
| 2023/0021233 A1* | 1/2023 | Ammad-Ud-Din | G06Q 30/0201 |
| 2023/0153579 A1* | 5/2023 | Sun | G06N 3/0464 706/25 |
| 2023/0161905 A1* | 5/2023 | Zhou | G06N 3/045 726/26 |
| 2023/0162262 A1* | 5/2023 | Zhou | G06Q 30/0631 705/26.7 |
| 2023/0252304 A1* | 8/2023 | Kim | G06Q 30/0631 706/15 |
| 2023/0419123 A1* | 12/2023 | Luo | G06N 3/098 |
| 2024/0046330 A1* | 2/2024 | Fan | G06Q 30/0631 |
| 2024/0070525 A1* | 2/2024 | Sun | G06F 21/6245 |
| 2024/0143348 A1* | 5/2024 | Jin | G06F 17/16 |
| 2024/0193463 A1* | 6/2024 | Qin | G06N 20/00 |
| 2024/0242069 A1* | 7/2024 | Inan | G06Q 30/0631 |
| 2024/0256894 A1* | 8/2024 | Chen | G06N 3/098 |

OTHER PUBLICATIONS

Ding et al., "Efficient federated item similarity model for privacy-preserving" Jul. 31, 2023, pp. 1-17. (Year: 2023).*
Eren et al., "FedSplit: One-Shot Federated Recommendation System Base on Non-negative Joint Matrix Factorization and Knowledge Distillation" May 4, 2022, arXiv: 2205.02359v1, pp. 1-17. (Year: 2022).*
Wu et al., "Adapting Triplet Importance of Implicit Feedback for Personalized Recommendation" Dec. 17, 2022, arXiv: 2208.01709v4, (Year: 2022).*
Zhang et al., "Graph-guided Personalization for Federated Recommendation" May 13, 2023, arXiv: 2305.07866v1, pp. 1-11. (Year: 2023).*
Zhang et al., "Dual Personalization on Federated Recommendation" May 13, 2023, arXiv: 2301.08143v2, pp. 1-9. (Year: 2023).*
Minto et al., "Stronger Privacy for Federated Collaborative Filtering with Implicit Feedback" 2021, pp. 1-9. (Year: 2021).*
Zhiyuli et al., "BookGPT: A General Framework for Book Recommendation Based on a Large Language Model" May 25, 2023, arXiv: 2305.15673v1, pp. 1-15. (Year: 2023).*
Togashi et al., "Fair Matrix Factorisation for Large-Scale Recommender Systems" Nov. 19, 2022, arXiv: 2209.04394v2, pp. 1-12. (Year: 2022).*
Perifanis et Efraimidis, "Federated Neural Collaborative Filtering" Feb. 16, 2022, arXiv: 2106.04405v2, pp. 1-19. (Year: 2022).*
Yang et al., "DPMF: Decentralized Probabilistic Matrix Factorization for Privacy-Preserving Recommendation" Nov. 2, 2022, pp. 1-15. (Year: 2022).*
Fan et al., "Improving Implicit Alternating Least Squares with Ring-based Regularization" Jul. 2022, pp. 102-111. (Year: 2022).*
Yao et al., "FedRule: Federated Rule Recommendation System with Graph Neural Networks" Nov. 13, 2022, arXiv: 2211.06812v1, pp. 1-12. (Year: 2022).*
Lin et al., "Meta Matrix Factorization for Federated Rating Predictions" Mar. 4, 2023, arXiv: 1910.10086v4, pp. 1-10. (Year: 2023).*
Yuan et al., "HeteFedRec: Federated Recommender Systems with Model Heterogeneity" Jul. 24, 2023, arXiv: 2307.12810v1, pp. 1-14. (Year: 2023).*
Lian et al., "PERSIA: An Open, Hybrid System Scaling Deep Learning-based Recommenders up to 100 Trillion Parameters" Aug. 2022, pp. 3288-3298. (Year: 2022).*
Liu et al., "User-Centric Federated Matrix Factorization Based on Differential Privacy" May 9, 2023, pp. 21-27. (Year: 2023).*
Chen et al., "Recommendation Unlearning" Apr. 2022, pp. 2768-2777. (Year: 2022).*
Liu et al., "Recommendation Unlearning via Matrix Correction" Jul. 29, 2023, arXiv: 2307.15960v1, pp. 1-14. (Year: 2023).*
Zhang et al., "LightFR: Lightweight Federated Recommendation with Privacy-Preserving Matrix Factorization" Mar. 2023, pp. 1-28. (Year: 2023).*
Chen et al. "Distributed Matrix Factorization based on fast optimization for implicit feedback recommendation" Jun. 10, 2020, pp. 49-72. (Year: 2020).*
Nguyen et al., "Using Stochastic Gradient Decent Algorithm for Incremental Matrix Factorization in Recommendation System" Jul. 2019, pp. 308-319. (Year: 2019).*
Jameel et al., "Towards Distributed Pairwise Ranking using Implicit Feedback" Jul. 2018, pp. 973-976. (Year: 2018).*
Huang et al., "A Novel Multi-CPU/GPU Collaborative Computing Framework for SGD-based Matrix Factorization" Aug. 2021. (Year: 2021).*
Gulcan et al., "Load balanced locality-aware parallel SGD on multicore architectures for latent factor based collaborative filtering" Apr. 20, 2023, pp. 207-221. (Year: 2023).*
Chen et al., "BALS: Blocked Alternating Least Squares for Parallel Sparse Matrix Factorization on GPUs" 2021, pp. 2291-2302. (Year: 2021).*
Li et al., "MSGD: A Novel Matrix Factorization Approach for Large-Scale Collaborative Filtering Recommender Systems for GPUs" Jul. 2018, pp. 1530-1543. (Year: 2018).*
Nommay, Theo, "Drift: A Federated Recommender System with Implicit Feedback on the Items" Apr. 17, 2023, arXiv: 2304.09084v1, pp. 1-34. (Year: 2023).*
Feng et al., "Recommender Forest for Efficient Retrieval" 2022, NeurIPS, pp. 1-13. (Year: 2022).*
Feng et al., "Forest-based Deep Recommender" Jul. 2022, pp. 523-532. (Year: 2022).*
Zhu et al., "Joint Optimization of Tree-based Index and Deep Model for Recommender Systems" 2019, NeurIPS, pp. 1-10. (Year: 2019).*
Mehta et al., "ALX: Large Scale Matrix Factorization on TPUs" Mar. 29, 2022, arXiv: 2112.02194v2, pp. 1-16. (Year: 2022).*
Aljunid et al., "IntegrateCF: Integrating explicit and implicit feedback based on deep learning collaborative filtering algorithm" Jun. 27, 2022, pp. 1-11. (Year: 2022).*
Xu et al., "Bayesian Multi-scale Modeling of Factor Matrix without using Partition Tree" Feb. 25, 2020, arXiv: 2002.09606v2, pp. 1-10. (Year: 2020).*
Hu et al., "Collaborative Filtering for Implicit Feedback Datasets," IEEE, 2008, pp. 1-10.

* cited by examiner

1400 ↴

1410 ↴
Receiving an input comprising a plurality of pre-defined factor matrices and an implicit feedback dataset partitioned into a plurality of implicit feedback data subsets 1420 ↴
Distributing the input across a controller node and a plurality of worker nodes implemented in a distributed computing environment 1430 ↴
Training a model using the controller node and the plurality of worker nodes, wherein training the model includes:

1432 ↴
Initializing, by the controller node, a controller-specific user parameters matrix and a controller-specific item parameters matrix 1434 ↴
Broadcasting, by the controller node, the controller-specific user parameters matrix and the controller-specific item parameters matrix to each worker node of the plurality of worker nodes 1436 ↴
Concurrently executing an aggregation model training algorithm at the controller node and a plurality of localized model training algorithms across the plurality of worker nodes until a training termination condition is satisfied, wherein the aggregation model training algorithm and the plurality of localized model training algorithms iteratively update the controller-specific user parameters matrix and the controller-specific item parameters matrix until the training termination condition is satisfied

FIG. 14

Table 1: Multithread computation of matrix product trace ← 1702

Input:
- Matrices $A, B \in R^{k \times k}$.
- Assuming H threads indexed by $1, 2, \ldots, H$.

Output: The trace of matrix product $c = tr(AB)$

Parallel computation: for any $h \in \{1, 2, \ldots, H\}$, do
1. $j \leftarrow h$
2. If $j > k$, exit the loop
3. $c^{(h)} \leftarrow A_{j:} B_{:j}$
4. $j \leftarrow j + H$
5. Go to Sep 2.

Aggregation:
1. $c \leftarrow 0$
2. For $h = 1, 2, \ldots, H$, do
$$c \leftarrow c + c^{(h)}$$

FIG. 17A

Table 2: Multithread update of data-dependent D, $g_{2t+1}$

Input:
- $\Omega_l = \{(u, i, \Delta_{ui}) : R_{ui} = 1 \text{ is stored at Worker } l\}$.
- X, Y, and zero initial D.
- Assuming H threads indexed by $1, 2, \ldots, H$.
- m is the number of rows in X Output: partially computed D and $g_{2t+1}$, intermediate variables $\{e_{ui}\}$ Parallel computation: for any $h \in \{1, 2, \ldots, H\}$, do
1. $u \leftarrow h$, $g_{2t+1}^{(h)} \leftarrow 0$
2. If $u > m$, exit the loop
3. For $i \in \{i : (u, i) \in \Omega_l\}$, do
   $e_{ui} \leftarrow R_{ui} - X_{u:} Y_{:i}$
   $\epsilon_{ui} \leftarrow \Delta_{ui} e_{ui} + R_{ui}$
   $D_{u:} \leftarrow D_{u:} + \epsilon_{ui} Y^T_{:i}$
   $g_{2t+1}^{(h)} \leftarrow g_{2t+1}^{(h)} + E_{ui}^2 - 2\epsilon_{ui}(X_{u:} Y_{:i})$
4. $u \leftarrow u + H$
5. Go to Sep 2.

Aggregation:
1. $g_{2t+1} \leftarrow 0$
2. For $h = 1, 2, \ldots, H$, do
$$g_{2t+1} \leftarrow g_{2t+1} + g_{2t+1}^{(h)}$$

Table 3: Multithread update of data-dependent $a_1, b_1$ for $X_{:p}$

1706a → Input:
- $\Omega_l = \{(u, i, \Delta_{ui}) : R_{ui} = 1 \text{ is stored at Worker } l\}$.
- X, Y, and fully initial D
- Intermediate variables $\{e_{ui}\}$
- Assuming H threads indexed by 1, 2, ..., H.
- m is the number of rows in X 1706b → Output partially computed $a_1$ and $b_1$ for $X_{:p}$ Parallel computation: for any $h \in \{1,2,...,H\}$, do
1706c → 1. $u \leftarrow h$, $a_1^{(h)} \leftarrow 0$, $b_1^{(h)} \leftarrow 0$
1706d → 2. If $u > m$, exit the loop
1706e → 3. For $i \in \{i : (u, i) \in \Omega_l\}$, do
1706f →     $a_1^{(h)} \leftarrow a_1^{(h)} + (\Delta_{ui} D_{u:} Y_{pi})(\Delta_{ui} + 1)e_{ui}$
1706g →     $b_1^{(h)} \leftarrow b_1^{(h)} + (\Delta_{ui}^2 + 2\Delta_{ui})(D_{u:} Y_{pi})^2$
1706h → 4. $u \leftarrow u + H$
5. Go to Step 2. ← 1706i Aggregation:
1706j → 1. $a_1 \leftarrow 0$, $b_1 \leftarrow 0$
2. For $h = 1, 2, \ldots, H$, do
    $a_1 \leftarrow a_1 + a_1^{(h)}$ ← 1706k
    $b_1 \leftarrow b_1 + b_1^{(h)}$

FIG. 17C

Table 4: Multithread update of data-dependent Z, $g_{2t+2}$

Input:
- $\Omega_l = \{(u, i, \Delta_{ui}) : R_{ui} = 1$ is stored at Worker l$\}$.
- X, Y, and zero initial Z.
- Assuming H threads indexed by 1, 2, ..., H.
- n is the number of columns in Y Output: partially computed Z and $g_{2t+1}$, intermediate variables $\{e_{ui}\}$ Parallel computation: for any $h \in \{1,2,...,H\}$, do
1. $i \leftarrow h$, $g_{2t+1}^{(h)} \leftarrow 0$
2. If $i > m$, exit the loop
3. For $u \in \{u : (u, i) \in \Omega_l\}$, do
   $e_{ui} \leftarrow R_{ui} - X_{u:} Y_{:i}$
   $\epsilon_{ui} \leftarrow \Delta_{ui} e_{ui} + R_{ui}$
   $Z_{:i} \leftarrow D_{:i} + \epsilon_{ui} X^T_{u\Omega}$
   $g_{2t+1}^{(h)} \leftarrow g_{2t+1}^{(h)} + \epsilon_{ui}^2 - 2\epsilon_{ui}(X_{u:} Y_{:i})$
4. $i \leftarrow i + H$
5. Go to Sep 2.

Aggregation:
1. $g_{2t+1} \leftarrow 0$
2. For $h = 1, 2, ..., H$, do
   $g_{2t+2} \leftarrow g_{2t+2} + g_{2t+2}^{(h)}$

FIG. 17D

Table 5: Multithread update of data-dependent $a_1, b_1$ for $Y_Q$:

Input:
- $\Omega_l = \{(u, i, \Delta_{ui}) : R_{ui} = 1 \text{ is stored at Worker } l\}$.
- X, Y, and fully updated Z
- Intermediate variables $\{e_{ui}\}$
- Assuming H threads indexed by 1, 2, ..., H.
- n is the number of columns in Y Output partially computed $a_1$ and $b_1$ for $Y_Q$:

Parallel computation: for any $h \in \{1,2,...,H\}$, do
1. $i \leftarrow h$, $a_1^{(h)} \leftarrow 0$, $b_1^{(h)} \leftarrow 0$
2. If $i > n$, exit the loop
3. For $u \in \{u : (u, i) \in \Omega_l\}$, do
   $a_1^{(h)} \leftarrow a_1^{(h)} + (\Delta_{ui} X_{uQ} Z_{:i})(\Delta_{ui} + 1) e_{ui}$
   $b_1^{(h)} \leftarrow b_1^{(h)} + (\Delta_{ui}^2 + 2\Delta_{ui})(X_{uQ} Z_{:i})^2$
4. $i \leftarrow i + H$
5. Go to Sep 2.

Aggregation:
1. $a_1 \leftarrow 0$, $b1 \leftarrow 0$
2. For $h = 1, 2, ..., H$, do
   $a_1 \leftarrow a_1 + a_1^{(h)}$
   $b_1 \leftarrow b_1 + b_1^{(h)}$

FIG. 17E

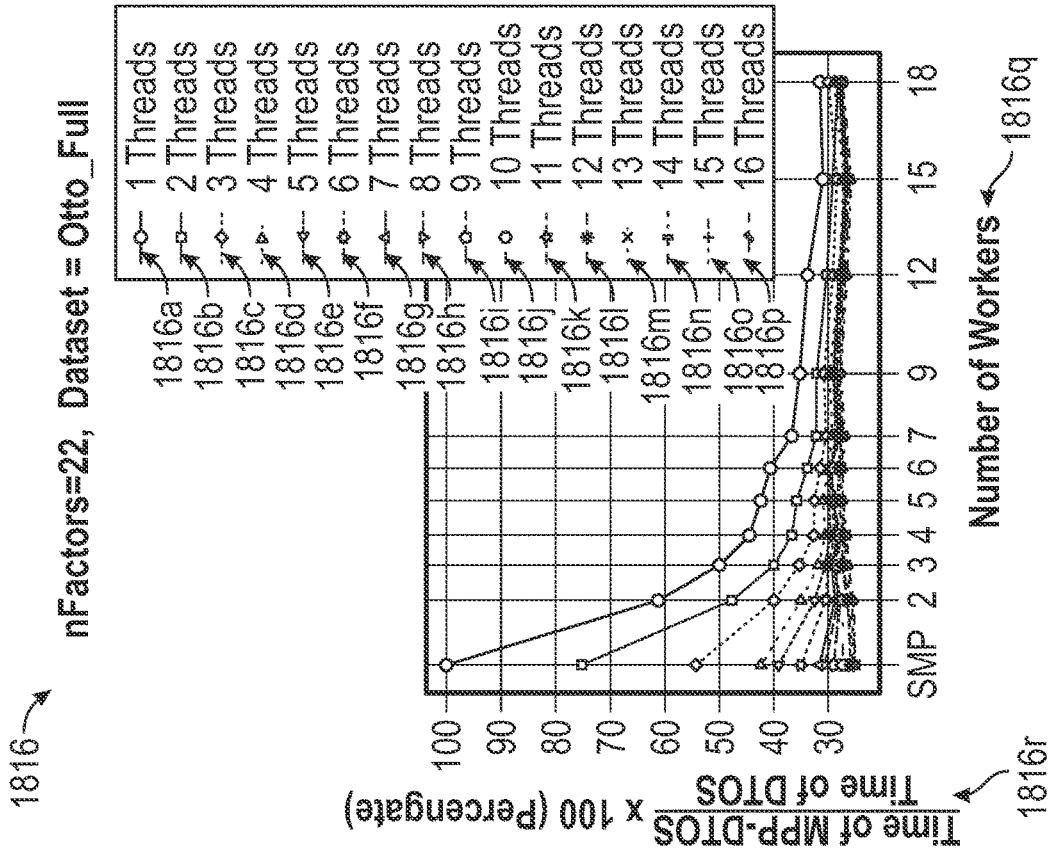
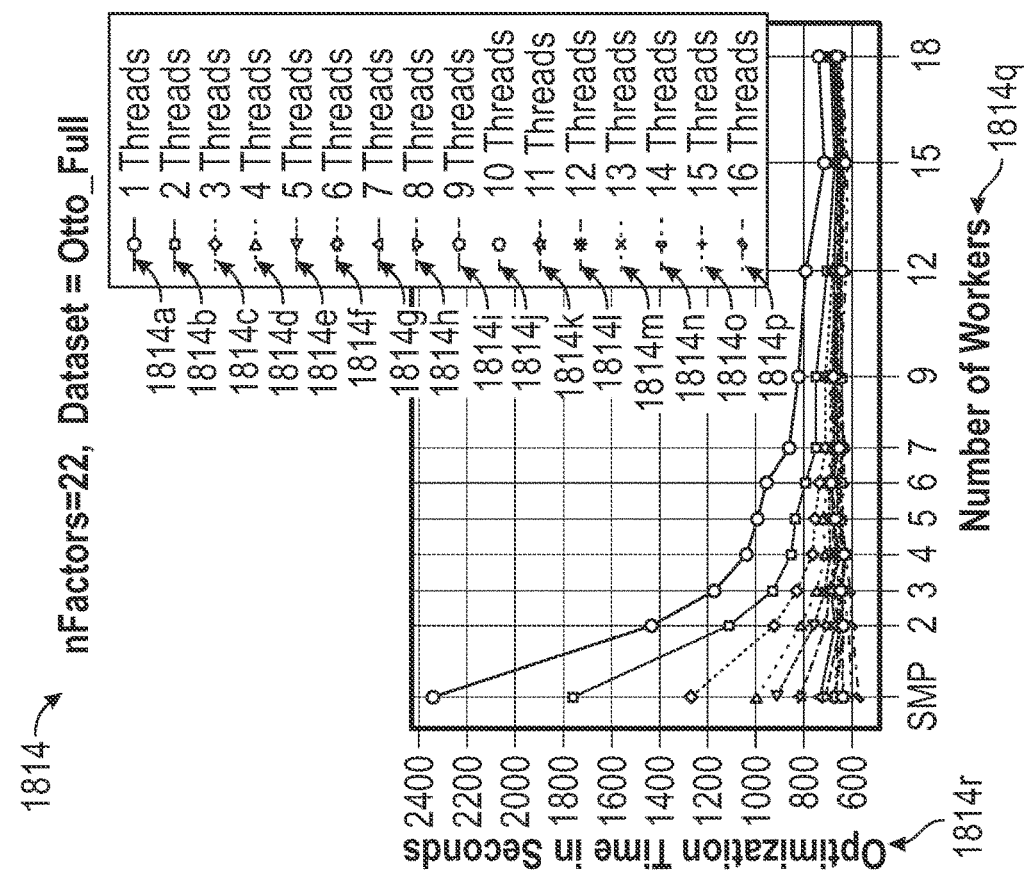
FIG. 18B (Continued)

MULTI-THREAD DISTRIBUTED TRAINING OF A RECOMMENDER MODEL

CROSS-REFERENCE TO RELATED APPLICATIONS

This application claims the benefit of U.S. Provisional Application No. 63/540,315, filed on 25 Sep. 2023, and U.S. Provisional Application No. 63/534,561, filed on 24 Aug. 2023, which are incorporated in their entireties by this reference.

TECHNICAL FIELD

This invention relates generally to the model training field and, more specifically, to new and useful systems and methods for training a recommender model.

BACKGROUND

Recommender models are typically trained using centralized training algorithms. However, these centralized algorithms are not well-suited for use within a distributed computing environment as such algorithms often include training computations that require the full training dataset. This inherent requirement not only causes the centralized algorithms to be computationally expensive, but also negatively impacts the performance of such algorithms as the size of the training dataset grows.

Accordingly, there is a need for new and useful systems and methods capable of training recommender models in a distributed manner. The embodiments of the present application provide technical solutions that at least address the needs described above, as well as the deficiencies of the start of the art.

BRIEF SUMMARY OF THE INVENTION(S)

In some embodiments, a computer-program product embodied in a non-transitory machine-readable storage medium storing computer instructions that, when executed by one or more processors, perform operations comprising receiving an input comprising a plurality of pre-defined factor matrices and an implicit feedback dataset partitioned into a plurality of implicit feedback data subsets; distributing the input across a controller node and a plurality of worker nodes implemented in a distributed computing environment; and training a model using the controller node and the plurality of worker nodes, wherein training the model includes initializing, by the controller node, a controller-specific user parameters matrix and a controller-specific item parameters matrix, broadcasting, by the controller node, the controller-specific user parameters matrix and the controller-specific item parameters matrix to each worker node of the plurality of worker nodes, and concurrently executing an aggregation model training algorithm at the controller node and a plurality of localized model training algorithms across the plurality of worker nodes until a training termination condition is satisfied, wherein the aggregation model training algorithm and the plurality of localized model training algorithms iteratively update the controller-specific user parameters matrix and the controller-specific item parameters matrix until the training termination condition is satisfied.

In some embodiments, the implicit feedback dataset comprises a plurality of user-item interaction tuples, wherein a respective user-item interaction tuple of the plurality of user-item interaction tuples represents an interaction between a respective user and a respective item and a weight of the interaction, and the plurality of implicit feedback data subsets are disjoint subsets, wherein a first respective implicit feedback data subset and a second implicit feedback data subset are disjoint subsets when the first respective implicit feedback data subset and the second respective implicit feedback data subset do not share a common user-item interaction tuple.

In some embodiments, the plurality of pre-defined factor matrices include a pre-defined user factors matrix and a pre-defined item factors matrix, and distributing the input across the controller node and the plurality of worker nodes includes distributing a copy of the pre-defined user factors matrix to the controller node and each of the plurality of worker nodes, distributing a copy of the pre-defined item factors matrix to the controller node and each of the plurality of worker nodes, and distributing each of the plurality of implicit feedback data subsets to a respective worker node of the plurality of worker nodes.

In some embodiments, the implicit feedback dataset comprises a plurality of user-item interaction tuples that represent interactions between a plurality of users and a plurality of items, the training termination condition is satisfied when the controller-specific user parameters matrix and the controller-specific item parameters matrix satisfy convergence criteria, and the model is a matrix factorization model that, once trained, utilizes the controller-specific user parameters matrix and the controller-specific item parameters matrix derived from the training to recommend one or more items of the plurality of items to a user.

In some embodiments, the training termination condition is further satisfied when a number of iterations for training the model exceeds a pre-determined maximum number of training iterations.

In some embodiments, training the model includes performing a first type of computations and a second type of computations, the first type of computations requires a user-to-item feedback matrix and a user-item interaction weight matrix, the second type of computations do not require the user-to-item feedback matrix and the user-item interaction weight matrix, the plurality of localized model training algorithms executing across the plurality of worker nodes perform the first type of computations, and the aggregation model training algorithm executing at the controller node performs the second type of computations.

In some embodiments, a respective localized model training algorithm executing at a respective worker node of the plurality of worker nodes generates a plurality of worker-specific model parameters based on a respective implicit feedback data subset allocated to the respective worker node, and transmits, at one or more pre-determined stages of execution, the plurality of worker-specific model parameters to the controller node.

In some embodiments, the aggregation model training executing at the controller node updates a plurality of global model parameters, including the controller-specific user parameters matrix and the controller-specific item parameters matrix, based on a plurality of worker-specific model parameters received from each of the plurality of worker nodes, and transmits, at one or more pre-determined stages of execution, one or more of the plurality of global model parameters to the plurality of worker nodes.

In some embodiments, a respective localized model training algorithm executing at a respective worker node of the plurality of worker nodes alternates in updating a worker-specific user parameters matrix and a worker-specific item parameters matrix based at least on an implicit feedback data subset allocated to the respective worker node and a plurality of global model parameters received from the controller node.

In some embodiments, the respective localized model training algorithm executing at the respective worker node updates the worker-specific user parameters matrix by initializing and updating a first worker-specific direction matrix and a first worker-specific objective function, transmitting at least a portion of the first worker-specific direction matrix to the controller node, receiving, from the controller node, a first aggregated direction matrix that is computed from the portion of the first worker-specific direction matrix received from each of the plurality of worker nodes, initializing and updating a plurality of worker-specific model parameters based on the first aggregated direction matrix, transmitting the plurality of worker-specific model parameters and the first worker-specific objective function to the controller node, receiving, from the controller node, a subset of the plurality of global model parameters that aggregate the plurality of worker-specific model parameters computed by each of the plurality of worker nodes, and updating the worker-specific user parameters matrix based at least on the subset of the plurality of global model parameters and the first aggregated direction matrix.

In some embodiments, the respective model training algorithm executing at the respective worker node updates the worker-specific item parameters matrix by initializing and updating a second worker-specific direction matrix and a second worker-specific objective function, transmitting at least a portion of the second worker-specific direction matrix to the controller node, receiving, from the controller node, a second aggregated direction matrix that is computed from the portion of the second worker-specific direction matrix received from each of the plurality of worker nodes, updating a plurality of worker-specific model parameters based on the second aggregated direction matrix, transmitting the plurality of worker-specific model parameters and the second worker-specific objective function to the controller node, receiving, from the controller node, updates to at least a subset of the plurality of global model parameters, and updating the worker-specific item parameters matrix based at least on the updates to the subset of the plurality of global model parameters and the second aggregated direction matrix.

In some embodiments, the aggregation model training algorithm executing at the controller node alternates in updating the controller-specific user parameters matrix and the controller-specific item parameters matrix, and updating the controller-specific user parameters matrix includes initializing and computing an item parameters transformation matrix, a user parameters transformation matrix, a first global direction matrix, and a first global objective function, receiving a first worker-specific direction matrix from each of the plurality of worker nodes, updating the first global direction matrix based at least on the first worker-specific direction matrix received from each of the plurality of worker nodes, receiving a plurality of worker-specific model parameters from each of the plurality of worker nodes, initializing and updating a plurality of global model parameters based at least on the plurality of worker-specific model parameters received from each of the plurality of worker nodes, and updating the controller-specific user parameters matrix based on the plurality of global model parameters and the first global direction matrix.

In some embodiments, updating the controller-specific item parameters matrix includes updating the user parameters transformation matrix and the item parameters transformation matrix, computing a second global direction matrix and a second global objective function, receiving a second worker-specific direction matrix from each of the plurality of worker nodes, updating the second global direction matrix based at least on the second worker-specific direction matrix received from each of the plurality of worker nodes, receiving a plurality of updated worker-specific model parameters from each of the plurality of worker nodes, updating the plurality of global model parameters based at least on the plurality of updated worker-specific model parameters, and updating the controller-specific item parameters matrix based on the plurality of global model parameters.

In some embodiments, the aggregation model training algorithm executing at the controller node alternates in updating the controller-specific user parameters matrix and the controller-specific item parameters matrix, and a respective localized model training algorithm executing at a respective worker node of the plurality of worker nodes alternates in updating a worker-specific user parameters matrix and a worker-specific item parameters matrix based on an implicit feedback data subset allocated to the respective worker node and a plurality of global model parameters received from the controller node.

In some embodiments, a computer-implemented method comprises receiving an input comprising a plurality of pre-defined factor matrices and an implicit feedback dataset partitioned into a plurality of implicit feedback data subsets; distributing the input across a controller node and a plurality of worker nodes implemented in a distributed computing environment; and training a model using the controller node and the plurality of worker nodes, wherein training the model includes initializing, by the controller node, a controller-specific user parameters matrix and a controller-specific item parameters matrix, broadcasting, by the controller node, the controller-specific user parameters matrix and the controller-specific item parameters matrix to each worker node of the plurality of worker nodes, and concurrently executing an aggregation model training algorithm at the controller node and a plurality of localized model training algorithms across the plurality of worker nodes until a training termination condition is satisfied, wherein the aggregation model training algorithm and the plurality of localized model training algorithms iteratively update the controller-specific user parameters matrix and the controller-specific item parameters matrix until the training termination condition is satisfied.

In some embodiments, the implicit feedback dataset comprises a plurality of user-item interaction tuples, wherein a respective user-item interaction tuple of the plurality of user-item interaction tuples represents an interaction between a respective user and a respective item and a weight of the interaction, and the plurality of implicit feedback data subsets are disjoint subsets, wherein a first respective implicit feedback data subset and a second implicit feedback data subset are disjoint subsets when the first respective implicit feedback data subset and the second respective implicit feedback data subset do not share a common user-item interaction tuple.

In some embodiments, the plurality of pre-defined factor matrices include a pre-defined user factors matrix and a pre-defined item factors matrix, and distributing the input across the controller node and the plurality of worker nodes includes distributing a copy of the pre-defined user factors matrix to the controller node and each of the plurality of worker nodes, distributing a copy of the pre-defined item factors matrix to the controller node and each of the plurality of worker nodes, and distributing each of the plurality of implicit feedback data subsets to a respective worker node of the plurality of worker nodes.

In some embodiments, the implicit feedback dataset comprises a plurality of user-item interaction tuples that represent interactions between a plurality of users and a plurality of items, the training termination condition is satisfied when the controller-specific user parameters matrix and the controller-specific item parameters matrix satisfy convergence criteria, and the model is a matrix factorization model that, once trained, utilizes the controller-specific user parameters matrix and the controller-specific item parameters matrix derived from the training to recommend one or more items of the plurality of items to a user.

In some embodiments, the training termination condition is further satisfied when a number of iterations for training the model exceeds a pre-determined maximum number of training iterations.

In some embodiments, training the model includes performing a first type of computations and a second type of computations, the first type of computations requires a user-to-item feedback matrix and a user-item interaction weight matrix, the second type of computations do not require the user-to-item feedback matrix and the user-item interaction weight matrix, the plurality of localized model training algorithms executing across the plurality of worker nodes perform the first type of computations, and the aggregation model training algorithm executing at the controller node performs the second type of computations.

In some embodiments, a respective localized model training algorithm executing at a respective worker node of the plurality of worker nodes generates a plurality of worker-specific model parameters based on a respective implicit feedback data subset allocated to the respective worker node, and transmits, at one or more pre-determined stages of execution, the plurality of worker-specific model parameters to the controller node.

In some embodiments, the aggregation model training executing at the controller node updates a plurality of global model parameters, including the controller-specific user parameters matrix and the controller-specific item parameters matrix, based on a plurality of worker-specific model parameters received from each of the plurality of worker nodes, and transmits, at one or more pre-determined stages of execution, one or more of the plurality of global model parameters to the plurality of worker nodes.

In some embodiments, a computer-implemented system comprises one or more processors; a memory; a computer-readable medium operably coupled to the one or more processors, the computer-readable medium having computer-readable instructions stored thereon that, when executed by the one or more processors, cause a computing device to perform operations comprising receiving an input comprising a plurality of pre-defined factor matrices and an implicit feedback dataset partitioned into a plurality of implicit feedback data subsets; distributing the input across a controller node and a plurality of worker nodes implemented in a distributed computing environment; and training a model using the controller node and the plurality of worker nodes, wherein training the model includes initializing, by the controller node, a controller-specific user parameters matrix and a controller-specific item parameters matrix, broadcasting, by the controller node, the controller-specific user parameters matrix and the controller-specific item parameters matrix to each worker node of the plurality of worker nodes, and concurrently executing an aggregation model training algorithm at the controller node and a plurality of localized model training algorithms across the plurality of worker nodes until a training termination condition is satisfied, wherein the aggregation model training algorithm and the plurality of localized model training algorithms iteratively update the controller-specific user parameters matrix and the controller-specific item parameters matrix until the training termination condition is satisfied.

In some embodiments, the aggregation model training executing at the controller node updates a plurality of global model parameters, including the controller-specific user parameters matrix and the controller-specific item parameters matrix, based on a plurality of worker-specific model parameters received from each of the plurality of worker nodes, and transmits, at one or more pre-determined stages of execution, one or more of the plurality of global model parameters to the plurality of worker nodes.

In some embodiments, a respective localized model training algorithm executing at a respective worker node of the plurality of worker nodes alternates in updating a worker-specific user parameters matrix and a worker-specific item parameters matrix based at least on an implicit feedback data subset allocated to the respective worker node and a plurality of global model parameters received from the controller node.

In some embodiments, the respective localized model training algorithm executing at the respective worker node updates the worker-specific user parameters matrix by initializing and updating a first worker-specific direction matrix and a first worker-specific objective function, transmitting at least a portion of the first worker-specific direction matrix to the controller node, receiving, from the controller node, a first aggregated direction matrix that is computed from the portion of the first worker-specific direction matrix received from each of the plurality of worker nodes, initializing and updating a plurality of worker-specific model parameters based on the first aggregated direction matrix, transmitting the plurality of worker-specific model parameters and the first worker-specific objective function to the controller node, receiving, from the controller node, a subset of the plurality of global model parameters that aggregate the plurality of worker-specific model parameters computed by each of the plurality of worker nodes, and updating the worker-specific user parameters matrix based at least on the subset of the plurality of global model parameters and the first aggregated direction matrix.

In some embodiments, the respective model training algorithm executing at the respective worker node updates the worker-specific item parameters matrix by initializing and updating a second worker-specific direction matrix and a second worker-specific objective function, transmitting at least a portion of the second worker-specific direction matrix to the controller node, receiving, from the controller node, a second aggregated direction matrix that is computed from the portion of the second worker-specific direction matrix received from each of the plurality of worker nodes, updating a plurality of worker-specific model parameters based on the second aggregated direction matrix, transmitting the plurality of worker-specific model parameters and the second worker-specific objective function to the controller node, receiving, from the controller node, updates to at least a subset of the plurality of global model parameters, and updating the worker-specific item parameters matrix based at least on the updates to the subset of the plurality of global model parameters and the second aggregated direction matrix.

In some embodiments, the aggregation model training algorithm executing at the controller node alternates in updating the controller-specific user parameters matrix and the controller-specific item parameters matrix, and updating the controller-specific user parameters matrix includes initializing and computing an item parameters transformation matrix, a user parameters transformation matrix, a first global direction matrix, and a first global objective function, receiving a first worker-specific direction matrix from each of the plurality of worker nodes, updating the first global direction matrix based at least on the first worker-specific direction matrix received from each of the plurality of worker nodes, receiving a plurality of worker-specific model parameters from each of the plurality of worker nodes, initializing and updating a plurality of global model parameters based at least on the plurality of worker-specific model parameters received from each of the plurality of worker nodes, and updating the controller-specific user parameters matrix based on the plurality of global model parameters and the first global direction matrix.

In some embodiments, updating the controller-specific item parameters matrix includes updating the user parameters transformation matrix and the item parameters transformation matrix, computing a second global direction matrix and a second global objective function, receiving a second worker-specific direction matrix from each of the plurality of worker nodes, updating the second global direction matrix based at least on the second worker-specific direction matrix received from each of the plurality of worker nodes, receiving a plurality of updated worker-specific model parameters from each of the plurality of worker nodes, updating the plurality of global model parameters based at least on the plurality of updated worker-specific model parameters, and updating the controller-specific item parameters matrix based on the plurality of global model parameters.

In some embodiments, the aggregation model training algorithm executing at the controller node alternates in updating the controller-specific user parameters matrix and the controller-specific item parameters matrix, and a respective localized model training algorithm executing at a respective worker node of the plurality of worker nodes alternates in updating a worker-specific user parameters matrix and a worker-specific item parameters matrix based on an implicit feedback data subset allocated to the respective worker node and a plurality of global model parameters received from the controller node.

BRIEF DESCRIPTION OF THE FIGURES

FIG. 14 illustrates an example of a method for training a model in a distributed computing environment, according to some embodiments of the present technology.

FIGS. 17A-17E illustrate examples of sub-algorithms implemented by the multithread distributed DTOS algorithm, according to some embodiments of the present technology.

DESCRIPTION OF THE PREFERRED EMBODIMENTS

The following description of the preferred embodiments of the inventions are not intended to limit the inventions to these preferred embodiments, but rather to enable any person skilled in the art to make and use these inventions.

DETAILED DESCRIPTION

In the following description, for the purposes of explanation, specific details are set forth in order to provide a thorough understanding of embodiments of the technology. However, it will be apparent that various embodiments may be practiced without these specific details. The figures and description are not intended to be restrictive.

The ensuing description provides example embodiments only, and is not intended to limit the scope, applicability, or configuration of the disclosure. Rather, the ensuing description of the example embodiments will provide those skilled in the art with an enabling description for implementing an example embodiment. It should be understood that various changes may be made in the function and arrangement of elements without departing from the spirit and scope of the technology as set forth in the appended claims.

Specific details are given in the following description to provide a thorough understanding of the embodiments. However, it will be understood by one of ordinary skill in the art that the embodiments may be practiced without these specific details. For example, circuits, systems, networks, processes, and other components may be shown as components in block diagram form in order not to obscure the embodiments in unnecessary detail. In other instances, well-known circuits, processes, algorithms, structures, and techniques may be shown without unnecessary detail in order to avoid obscuring the embodiments.

Also, it is noted that individual embodiments may be described as a process which is depicted as a flowchart, a flow diagram, a data flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed, but could have additional operations not included in a figure. A process may correspond to a method, a function, a procedure, a subroutine, a subprogram, etc. When a process corresponds to a function, its termination can correspond to a return of the function to the calling function or the main function.

Example Systems

Systems depicted in some of the figures may be provided in various configurations. In some embodiments, the systems may be configured as a distributed system where one or more components of the system are distributed across one or more networks in a cloud computing system.

Figure 1:
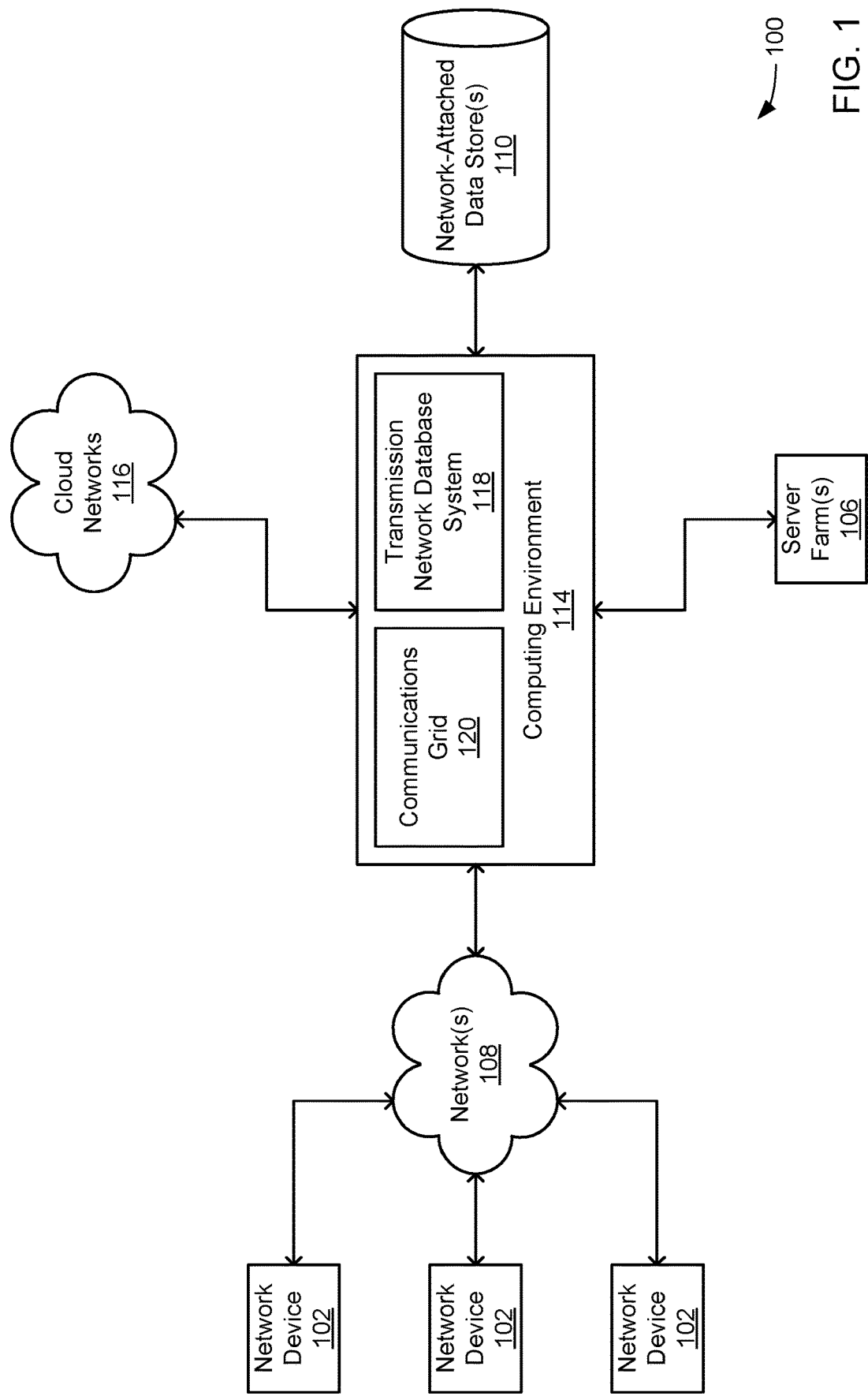
FIG. 1 illustrates a block diagram that provides an illustration of the hardware components of a computing system, according to some embodiments of the present technology.

FIG. 1 is a block diagram that provides an illustration of the hardware components of a data transmission network 100, according to embodiments of the present technology. Data transmission network 100 is a specialized computer system that may be used for processing large amounts of data where a large number of computer processing cycles are required.

Data transmission network 100 may also include computing environment 114. Computing environment 114 may be a specialized computer or other machine that processes the data received within the data transmission network 100. Data transmission network 100 also includes one or more network devices 102. Network devices 102 may include client devices that attempt to communicate with computing environment 114. For example, network devices 102 may send data to the computing environment 114 to be processed, may send signals to the computing environment 114 to control different aspects of the computing environment or the data it is processing, among other reasons. Network devices 102 may interact with the computing environment 114 through a number of ways, such as, for example, over one or more networks 108. As shown in FIG. 1, computing environment 114 may include one or more other systems. For example, computing environment 114 may include a database system 118 and/or a communications grid 120.

Figure 8:
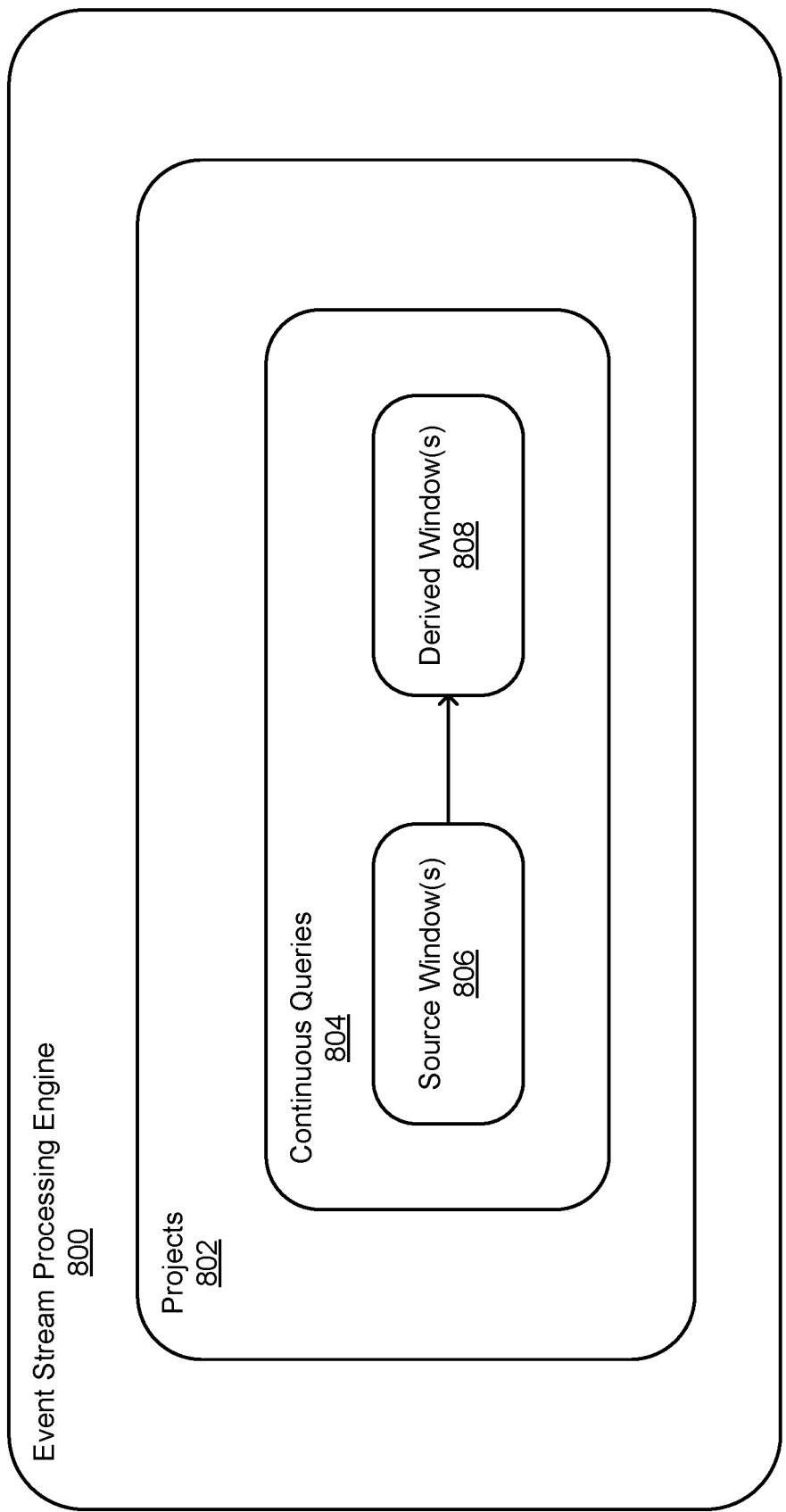
FIG. 8 illustrates a block diagram including components of an Event Stream Processing Engine (ESPE), according to some embodiments of the present technology.
Figure 9:
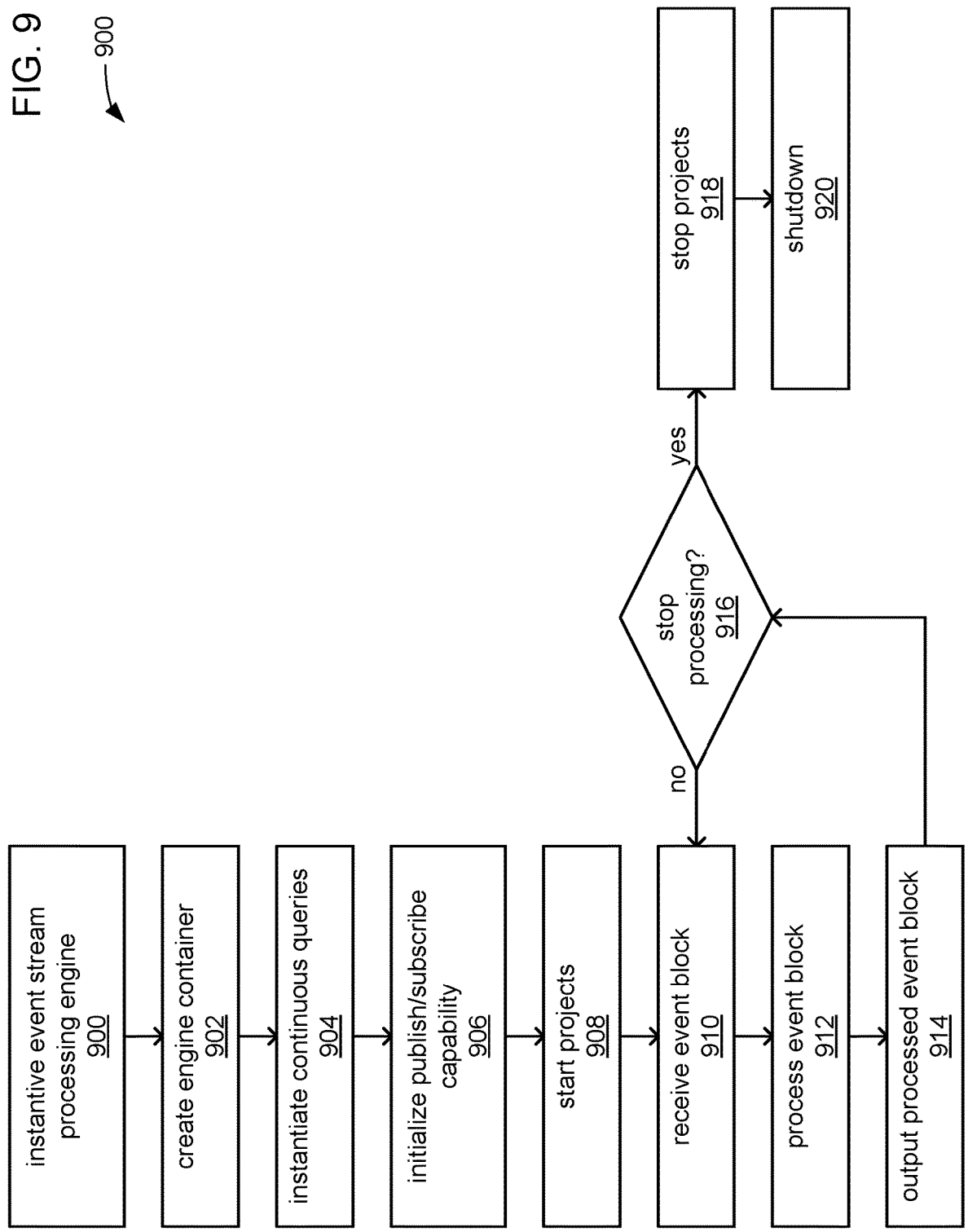
FIG. 9 illustrates a flow chart showing an example process including operations performed by an event stream processing engine, according to some embodiments of the present technology.
Figure 10:
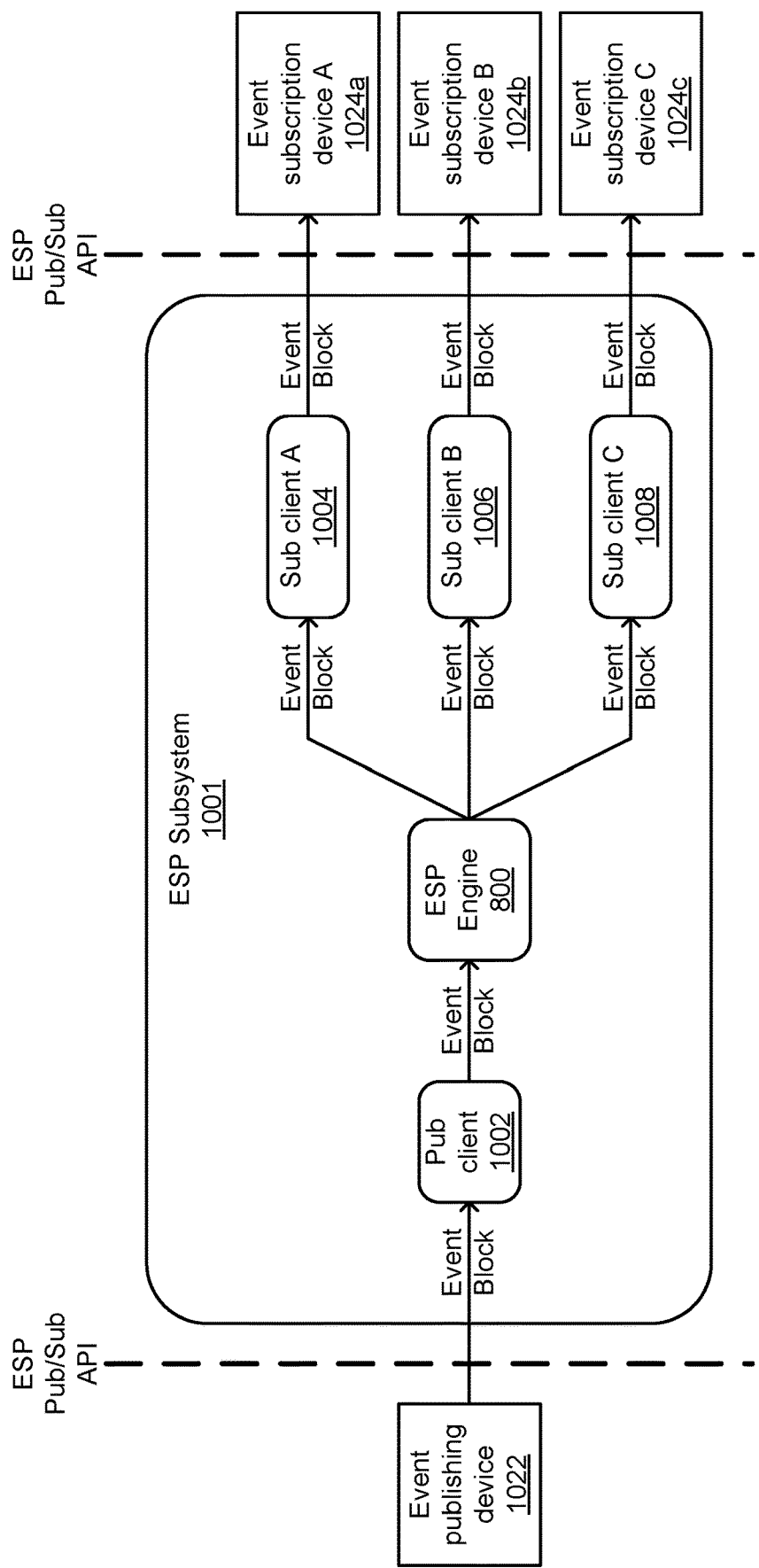
FIG. 10 illustrates an ESP system interfacing between a publishing device and multiple event subscribing devices, according to some embodiments of the present technology.

In other embodiments, network devices may provide a large amount of data, either all at once or streaming over a period of time (e.g., using event stream processing (ESP), described further with respect to FIGS. 8-10), to the computing environment 114 via networks 108. For example, network devices 102 may include network computers, sensors, databases, or other devices that may transmit or otherwise provide data to computing environment 114. For example, network devices may include local area network devices, such as routers, hubs, switches, or other computer networking devices. These devices may provide a variety of stored or generated data, such as network data or data specific to the network devices themselves. Network devices may also include sensors that monitor their environment or other devices to collect data regarding that environment or those devices, and such network devices may provide data they collect over time. Network devices may also include devices within the internet of things, such as devices within a home automation network. Some of these devices may be referred to as edge devices, and may involve edge computing circuitry. Data may be transmitted by network devices directly to computing environment 114 or to network-attached data stores, such as network-attached data stores 110 for storage so that the data may be retrieved later by the computing environment 114 or other portions of data transmission network 100.

Data transmission network 100 may also include one or more network-attached data stores 110. Network-attached data stores 110 are used to store data to be processed by the computing environment 114 as well as any intermediate or final data generated by the computing system in non-volatile memory. However, in certain embodiments, the configuration of the computing environment 114 allows its operations to be performed such that intermediate and final data results can be stored solely in volatile memory (e.g., RAM), without a requirement that intermediate or final data results be stored to non-volatile types of memory (e.g., disk). This can be useful in certain situations, such as when the computing environment 114 receives ad hoc queries from a user and when responses, which are generated by processing large amounts of data, need to be generated on-the-fly. In this non-limiting situation, the computing environment 114 may be configured to retain the processed information within memory so that responses can be generated for the user at different levels of detail as well as allow a user to interactively query against this information.

Network-attached data stores may store a variety of different types of data organized in a variety of different ways and from a variety of different sources. For example, network-attached data storage may include storage other than primary storage located within computing environment 114 that is directly accessible by processors located therein. Network-attached data storage may include secondary, tertiary or auxiliary storage, such as large hard drives, servers, virtual memory, among other types. Storage devices may include portable or non-portable storage devices, optical storage devices, and various other mediums capable of storing, containing data. A machine-readable storage medium or computer-readable storage medium may include a non-transitory medium in which data can be stored and that does not include carrier waves and/or transitory electronic signals. Examples of a non-transitory medium may include, for example, a magnetic disk or tape, optical storage media such as compact disk or digital versatile disk, flash memory, memory or memory devices. A computer-program product may include code and/or machine-executable instructions that may represent a procedure, a function, a subprogram, a program, a routine, a subroutine, a module, a software package, a class, or any combination of instructions, data structures, or program statements. A code segment may be coupled to another code segment or a hardware circuit by passing and/or receiving information, data, arguments, parameters, or memory contents. Information, arguments, parameters, data, etc. may be passed, forwarded, or transmitted via any suitable means including memory sharing, message passing, token passing, network transmission, among others. Furthermore, the data stores may hold a variety of different types of data. For example, network-attached data stores 110 may hold unstructured (e.g., raw) data, such as manufacturing data (e.g., a database containing records identifying products being manufactured with parameter data for each product, such as colors and models) or product sales databases (e.g., a database containing individual data records identifying details of individual product sales).

The unstructured data may be presented to the computing environment 114 in different forms such as a flat file or a conglomerate of data records, and may have data values and accompanying time stamps. The computing environment 114 may be used to analyze the unstructured data in a variety of ways to determine the best way to structure (e.g., hierarchically) that data, such that the structured data is tailored to a type of further analysis that a user wishes to perform on the data. For example, after being processed, the unstructured time stamped data may be aggregated by time (e.g., into daily time period units) to generate time series data and/or structured hierarchically according to one or more dimensions (e.g., parameters, attributes, and/or variables). For example, data may be stored in a hierarchical data structure, such as a ROLAP OR MOLAP database, or may be stored in another tabular form, such as in a flat-hierarchy form.

Data transmission network 100 may also include one or more server farms 106. Computing environment 114 may route select communications or data to the one or more sever farms 106 or one or more servers within the server farms. Server farms 106 can be configured to provide information in a predetermined manner. For example, server farms 106 may access data to transmit in response to a communication. Server farms 106 may be separately housed from each other device within data transmission network 100, such as computing environment 114, and/or may be part of a device or system.

Server farms 106 may host a variety of different types of data processing as part of data transmission network 100. Server farms 106 may receive a variety of different data from network devices, from computing environment 114, from cloud network 116, or from other sources. The data may have been obtained or collected from one or more sensors, as inputs from a control database, or may have been received as inputs from an external system or device. Server farms 106 may assist in processing the data by turning raw data into processed data based on one or more rules implemented by the server farms. For example, sensor data may be analyzed to determine changes in an environment over time or in real-time.

Data transmission network 100 may also include one or more cloud networks 116. Cloud network 116 may include a cloud infrastructure system that provides cloud services. In certain embodiments, services provided by the cloud network 116 may include a host of services that are made available to users of the cloud infrastructure system on demand. Cloud network 116 is shown in FIG. 1 as being connected to computing environment 114 (and therefore having computing environment 114 as its client or user), but cloud network 116 may be connected to or utilized by any of the devices in FIG. 1. Services provided by the cloud network can dynamically scale to meet the needs of its users.

The cloud network 116 may include one or more computers, servers, and/or systems. In some embodiments, the computers, servers, and/or systems that make up the cloud network 116 are different from the user's own on-premises computers, servers, and/or systems. For example, the cloud network 116 may host an application, and a user may, via a communication network such as the Internet, on demand, order and use the application.

While each device, server and system in FIG. 1 is shown as a single device, it will be appreciated that multiple devices may instead be used. For example, a set of network devices can be used to transmit various communications from a single user, or remote server 140 may include a server stack. As another example, data may be processed as part of computing environment 114.

Each communication within data transmission network 100 (e.g., between client devices, between servers 106 and computing environment 114 or between a server and a device) may occur over one or more networks 108. Networks 108 may include one or more of a variety of different types of networks, including a wireless network, a wired network, or a combination of a wired and wireless network. Examples of suitable networks include the Internet, a personal area network, a local area network (LAN), a wide area network (WAN), or a wireless local area network (WLAN). A wireless network may include a wireless interface or combination of wireless interfaces. As an example, a network in the one or more networks 108 may include a short-range communication channel, such as a BLUETOOTH® communication channel or a BLUETOOTH® LOW Energy communication channel. A wired network may include a wired interface. The wired and/or wireless networks may be implemented using routers, access points, bridges, gateways, or the like, to connect devices in the network 114, as will be further described with respect to FIG. 2. The one or more networks 108 can be incorporated entirely within or can include an intranet, an extranet, or a combination thereof. In one embodiment, communications between two or more systems and/or devices can be achieved by a secure communications protocol, such as secure sockets layer (SSL) or transport layer security (TLS). In addition, data and/or transactional details may be encrypted.

Some aspects may utilize the Internet of Things (IoT), where things (e.g., machines, devices, phones, sensors) can be connected to networks and the data from these things can be collected and processed within the things and/or external to the things. For example, the IoT can include sensors in many different devices, and high value analytics can be applied to identify hidden relationships and drive increased efficiencies. This can apply to both big data analytics and real-time (e.g., ESP) analytics. This will be described further below with respect to FIG. 2.

As noted, computing environment 114 may include a communications grid 120 and a transmission network database system 118. Communications grid 120 may be a grid-based computing system for processing large amounts of data. The transmission network database system 118 may be for managing, storing, and retrieving large amounts of data that are distributed to and stored in the one or more network-attached data stores 110 or other data stores that reside at different locations within the transmission network database system 118. The compute nodes in the grid-based computing system 120 and the transmission network database system 118 may share the same processor hardware, such as processors that are located within computing environment 114.

Figure 2:
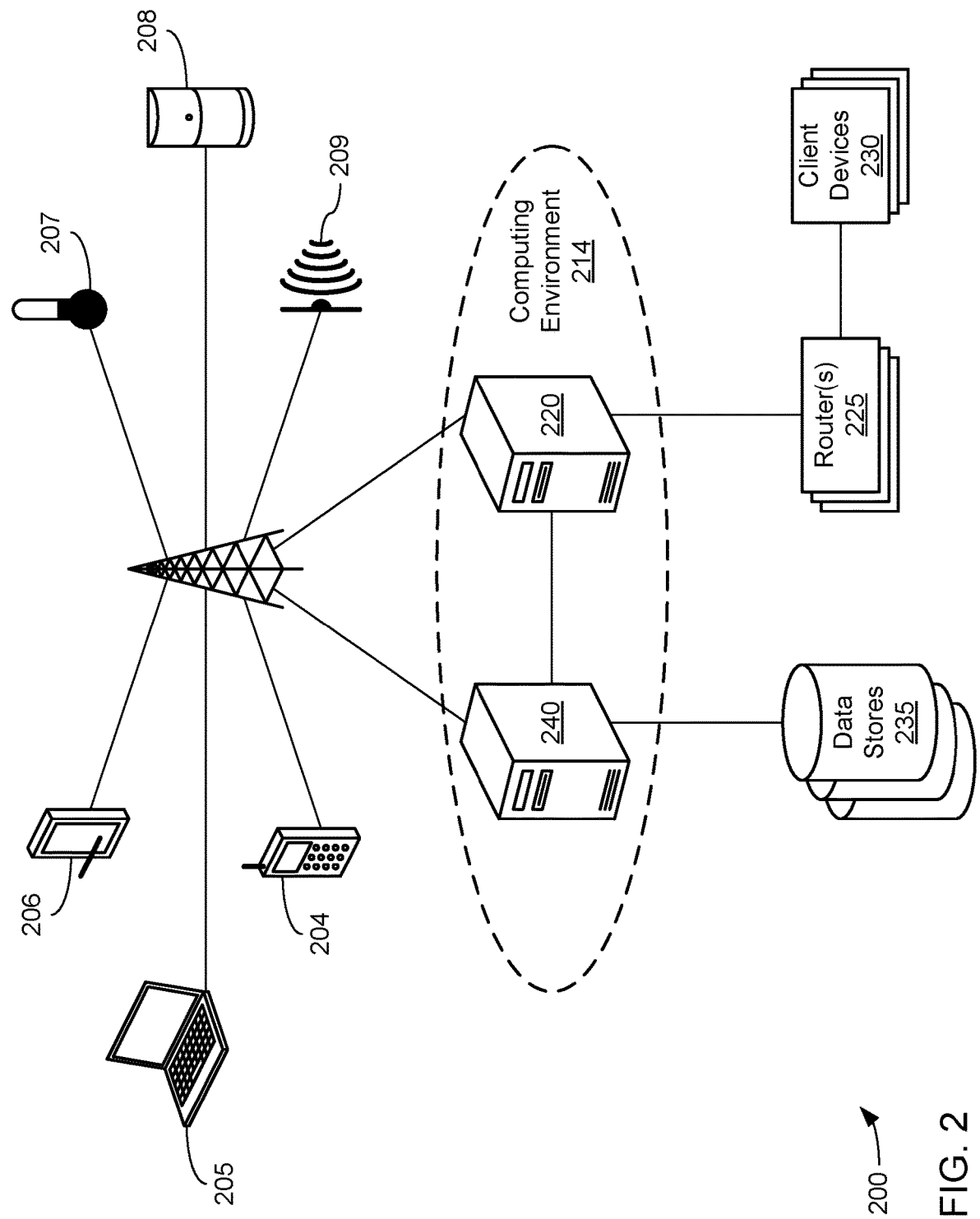
FIG. 2 illustrates an example network including an example set of devices communicating with each other over an exchange system and via a network, according to some embodiments of the present technology.

FIG. 2 illustrates an example network including an example set of devices communicating with each other over an exchange system and via a network, according to embodiments of the present technology. As noted, all communication within data transmission network 100 may occur over one or more networks. System 200 includes a network device 204 configured to communicate with a variety of types of client devices, for example client devices 230, over a variety of types of communication channels.

As shown in FIG. 2, network device 204 can transmit a communication over a network (e.g., a cellular network via a base station 210). The communication can be routed to another network device, such as network devices 205-209, via base station 210. The communication can also be routed to computing environment 214 via base station 210. For example, network device 204 may collect data either from its surrounding environment or from other network devices (such as network devices 205-209) and transmit that data to computing environment 214.

Although network devices 204-209 are shown in FIG. 2 as a mobile phone, laptop computer, tablet computer, temperature sensor, motion sensor, and audio sensor respectively, the network devices may be or include sensors that are sensitive to detecting aspects of their environment. For example, the network devices may include sensors such as water sensors, power sensors, electrical current sensors, chemical sensors, optical sensors, pressure sensors, geographic or position sensors (e.g., GPS), velocity sensors, acceleration sensors, flow rate sensors, among others. Examples of characteristics that may be sensed include force, torque, load, strain, position, temperature, air pressure, fluid flow, chemical properties, resistance, electromagnetic fields, radiation, irradiance, proximity, acoustics, moisture, distance, speed, vibrations, acceleration, electrical potential, and electrical current, among others. The sensors may be mounted to various components used as part of a variety of different types of systems (e.g., an oil drilling operation). The network devices may detect and record data related to the environment that it monitors and transmit that data to computing environment 214.

As noted, one type of system that may include various sensors that collect data to be processed and/or transmitted to a computing environment according to certain embodiments includes an oil drilling system. For example, the one or more drilling operation sensors may include surface sensors that measure a hook load, a fluid rate, a temperature and a density in and out of the wellbore, a standpipe pressure, a surface torque, a rotation speed of a drill pipe, a rate of penetration, a mechanical specific energy, etc. and downhole sensors that measure a rotation speed of a bit, fluid densities, downhole torque, downhole vibration (axial, tangential, lateral), a weight applied at a drill bit, an annular pressure, a differential pressure, an azimuth, an inclination, a dog leg severity, a measured depth, a vertical depth, a downhole temperature, etc. Besides the raw data collected directly by the sensors, other data may include parameters either developed by the sensors or assigned to the system by a client or other controlling device. For example, one or more drilling operation control parameters may control settings such as a mud motor speed to flow ratio, a bit diameter, a predicted formation top, seismic data, weather data, etc. Other data may be generated using physical models such as an earth model, a weather model, a seismic model, a bottom hole assembly model, a well plan model, an annular friction model, etc. In addition to sensor and control settings, predicted outputs, of for example, the rate of penetration, mechanical specific energy, hook load, flow in fluid rate, flow out fluid rate, pump pressure, surface torque, rotation speed of the drill pipe, annular pressure, annular friction pressure, annular temperature, equivalent circulating density, etc. may also be stored in the data warehouse.

In another example, another type of system that may include various sensors that collect data to be processed and/or transmitted to a computing environment according to certain embodiments includes a home automation or similar automated network in a different environment, such as an office space, school, public space, sports venue, or a variety of other locations. Network devices in such an automated network may include network devices that allow a user to access, control, and/or configure various home appliances located within the user's home (e.g., a television, radio, light, fan, humidifier, sensor, microwave, iron, and/or the like), or outside of the user's home (e.g., exterior motion sensors, exterior lighting, garage door openers, sprinkler systems, or the like). For example, network device 102 may include a home automation switch that may be coupled with a home appliance. In another embodiment, a network device can allow a user to access, control, and/or configure devices, such as office-related devices (e.g., copy machine, printer, or fax machine), audio and/or video related devices (e.g., a receiver, a speaker, a projector, a DVD player, or a television), media-playback devices (e.g., a compact disc player, a CD player, or the like), computing devices (e.g., a home computer, a laptop computer, a tablet, a personal digital assistant (PDA), a computing device, or a wearable device), lighting devices (e.g., a lamp or recessed lighting), devices associated with a security system, devices associated with an alarm system, devices that can be operated in an automobile (e.g., radio devices, navigation devices), and/or the like. Data may be collected from such various sensors in raw form, or data may be processed by the sensors to create parameters or other data either developed by the sensors based on the raw data or assigned to the system by a client or other controlling device.

In another example, another type of system that may include various sensors that collect data to be processed and/or transmitted to a computing environment according to certain embodiments includes a power or energy grid. A variety of different network devices may be included in an energy grid, such as various devices within one or more power plants, energy farms (e.g., wind farm, solar farm, among others) energy storage facilities, factories, homes and businesses of consumers, among others. One or more of such devices may include one or more sensors that detect energy gain or loss, electrical input or output or loss, and a variety of other efficiencies. These sensors may collect data to inform users of how the energy grid, and individual devices within the grid, may be functioning and how they may be made more efficient.

Network device sensors may also perform processing on data it collects before transmitting the data to the computing environment 114, or before deciding whether to transmit data to the computing environment 114. For example, network devices may determine whether data collected meets certain rules, for example by comparing data or values calculated from the data and comparing that data to one or more thresholds. The network device may use this data and/or comparisons to determine if the data should be transmitted to the computing environment 214 for further use or processing.

Computing environment 214 may include machines 220 and 240. Although computing environment 214 is shown in FIG. 2 as having two machines, 220 and 240, computing environment 214 may have only one machine or may have more than two machines. The machines that make up computing environment 214 may include specialized computers, servers, or other machines that are configured to individually and/or collectively process large amounts of data. The computing environment 214 may also include storage devices that include one or more databases of structured data, such as data organized in one or more hierarchies, or unstructured data. The databases may communicate with the processing devices within computing environment 214 to distribute data to them. Since network devices may transmit data to computing environment 214, that data may be received by the computing environment 214 and subsequently stored within those storage devices. Data used by computing environment 214 may also be stored in data stores 235, which may also be a part of or connected to computing environment 214.

Computing environment 214 can communicate with various devices via one or more routers 225 or other inter-network or intra-network connection components. For example, computing environment 214 may communicate with devices 230 via one or more routers 225. Computing environment 214 may collect, analyze and/or store data from or pertaining to communications, client device operations, client rules, and/or user-associated actions stored at one or more data stores 235. Such data may influence communication routing to the devices within computing environment 214, how data is stored or processed within computing environment 214, among other actions.

Notably, various other devices can further be used to influence communication routing and/or processing between devices within computing environment 214 and with devices outside of computing environment 214. For example, as shown in FIG. 2, computing environment 214 may include a web server 240. Thus, computing environment 214 can retrieve data of interest, such as client information (e.g., product information, client rules, etc.), technical product details, news, current or predicted weather, and so on.

In addition to computing environment 214 collecting data (e.g., as received from network devices, such as sensors, and client devices or other sources) to be processed as part of a big data analytics project, it may also receive data in real time as part of a streaming analytics environment. As noted, data may be collected using a variety of sources as communicated via different kinds of networks or locally. Such data may be received on a real-time streaming basis. For example, network devices may receive data periodically from network device sensors as the sensors continuously sense, monitor and track changes in their environments. Devices within computing environment 214 may also perform pre-analysis on data it receives to determine if the data received should be processed as part of an ongoing project. The data received and collected by computing environment 214, no matter what the source or method or timing of receipt, may be processed over a period of time for a client to determine results data based on the client's needs and rules.

Figure 3:
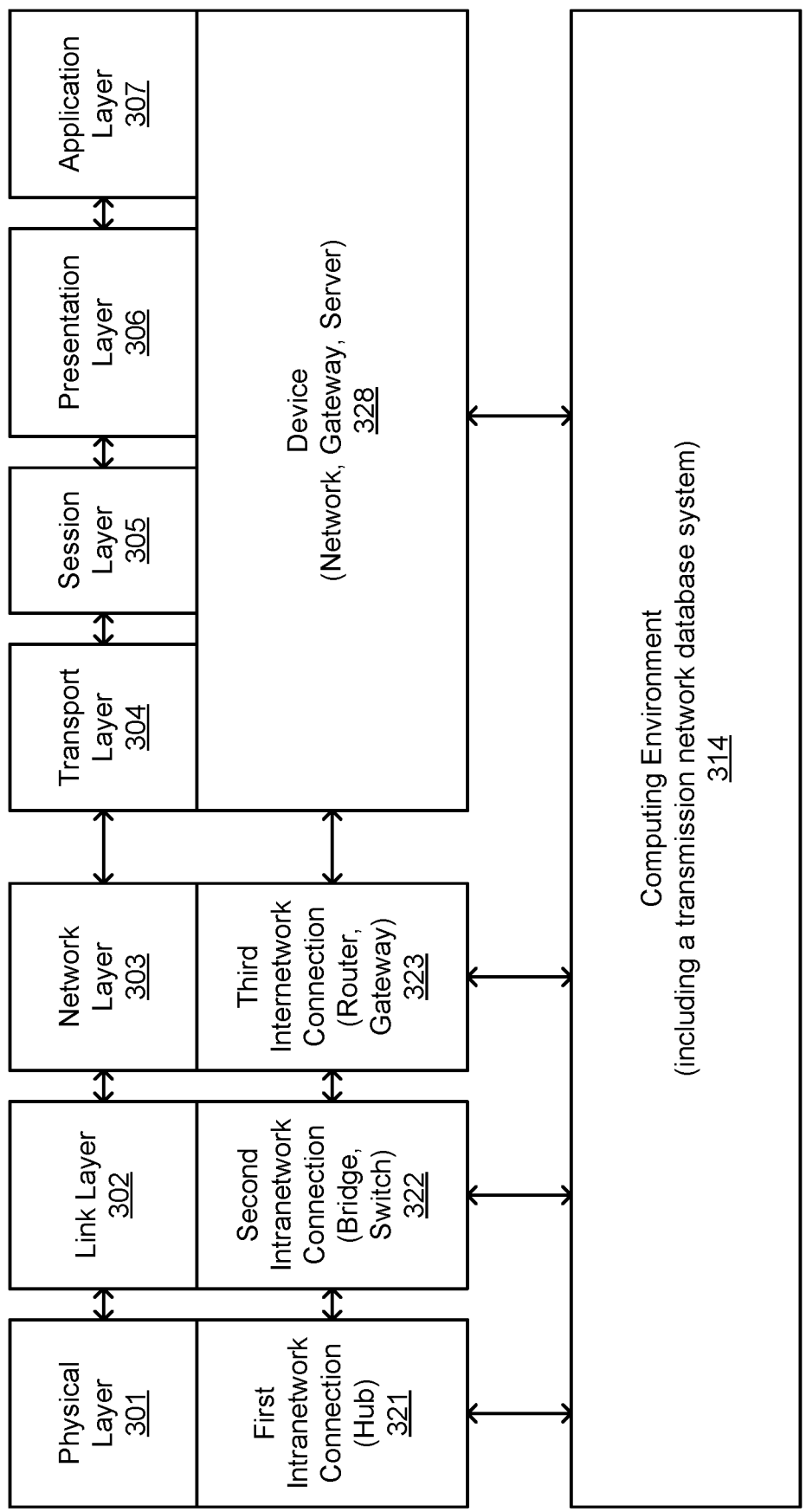
FIG. 3 illustrates a representation of a conceptual model of a communications protocol system, according to some embodiments of the present technology.

FIG. 3 illustrates a representation of a conceptual model of a communications protocol system, according to embodiments of the present technology. More specifically, FIG. 3 identifies operation of a computing environment in an Open Systems Interaction model that corresponds to various connection components. The model 300 shows, for example, how a computing environment, such as computing environment 314 (or computing environment 214 in FIG. 2) may communicate with other devices in its network, and control how communications between the computing environment and other devices are executed and under what conditions.

The model can include layers 301-307. The layers are arranged in a stack. Each layer in the stack serves the layer one level higher than it (except for the application layer, which is the highest layer), and is served by the layer one level below it (except for the physical layer, which is the lowest layer). The physical layer is the lowest layer because it receives and transmits raw bites of data, and is the farthest layer from the user in a communications system. On the other hand, the application layer is the highest layer because it interacts directly with a software application.

As noted, the model includes a physical layer 301. Physical layer 301 represents physical communication, and can define parameters of that physical communication. For example, such physical communication may come in the form of electrical, optical, or electromagnetic signals. Physical layer 301 also defines protocols that may control communications within a data transmission network.

Link layer 302 defines links and mechanisms used to transmit (i.e., move) data across a network. The link layer 302 manages node-to-node communications, such as within a grid computing environment. Link layer 302 can detect and correct errors (e.g., transmission errors in the physical layer 301). Link layer 302 can also include a media access control (MAC) layer and logical link control (LLC) layer.

Network layer 303 defines the protocol for routing within a network. In other words, the network layer coordinates transferring data across nodes in a same network (e.g., such as a grid computing environment). Network layer 303 can also define the processes used to structure local addressing within the network.

Transport layer 304 can manage the transmission of data and the quality of the transmission and/or receipt of that data. Transport layer 304 can provide a protocol for transferring data, such as, for example, a Transmission Control Protocol (TCP). Transport layer 304 can assemble and disassemble data frames for transmission. The transport layer can also detect transmission errors occurring in the layers below it.

Session layer 305 can establish, maintain, and manage communication connections between devices on a network. In other words, the session layer controls the dialogues or nature of communications between network devices on the network. The session layer may also establish checkpointing, adjournment, termination, and restart procedures.

Presentation layer 306 can provide translation for communications between the application and network layers. In other words, this layer may encrypt, decrypt and/or format data based on data types and/or encodings known to be accepted by an application or network layer.

Application layer 307 interacts directly with software applications and end users, and manages communications between them. Application layer 307 can identify destinations, local resource states or availability and/or communication content or formatting using the applications.

Intra-network connection components 321 and 322 are shown to operate in lower levels, such as physical layer 301 and link layer 302, respectively. For example, a hub can operate in the physical layer, a switch can operate in the link layer, and a router can operate in the network layer. Inter-network connection components 323 and 328 are shown to operate on higher levels, such as layers 303-307. For example, routers can operate in the network layer and network devices can operate in the transport, session, presentation, and application layers.

As noted, a computing environment 314 can interact with and/or operate on, in various embodiments, one, more, all or any of the various layers. For example, computing environment 314 can interact with a hub (e.g., via the link layer) so as to adjust which devices the hub communicates with. The physical layer may be served by the link layer, so it may implement such data from the link layer. For example, the computing environment 314 may control which devices it will receive data from. For example, if the computing environment 314 knows that a certain network device has turned off, broken, or otherwise become unavailable or unreliable, the computing environment 314 may instruct the hub to prevent any data from being transmitted to the computing environment 314 from that network device. Such a process may be beneficial to avoid receiving data that is inaccurate or that has been influenced by an uncontrolled environment. As another example, computing environment 314 can communicate with a bridge, switch, router or gateway and influence which device within the system (e.g., system 200) the component selects as a destination. In some embodiments, computing environment 314 can interact with various layers by exchanging communications with equipment operating on a particular layer by routing or modifying existing communications. In another embodiment, such as in a grid computing environment, a node may determine how data within the environment should be routed (e.g., which node should receive certain data) based on certain parameters or information provided by other layers within the model.

As noted, the computing environment 314 may be a part of a communications grid environment, the communications of which may be implemented as shown in the protocol of FIG. 3. For example, referring back to FIG. 2, one or more of machines 220 and 240 may be part of a communications grid computing environment. A gridded computing environment may be employed in a distributed system with non-interactive workloads where data resides in memory on the machines, or compute nodes. In such an environment, analytic code, instead of a database management system, controls the processing performed by the nodes. Data is co-located by pre-distributing it to the grid nodes, and the analytic code on each node loads the local data into memory. Each node may be assigned a particular task such as a portion of a processing project, or to organize or control other nodes within the grid.

Figure 4:
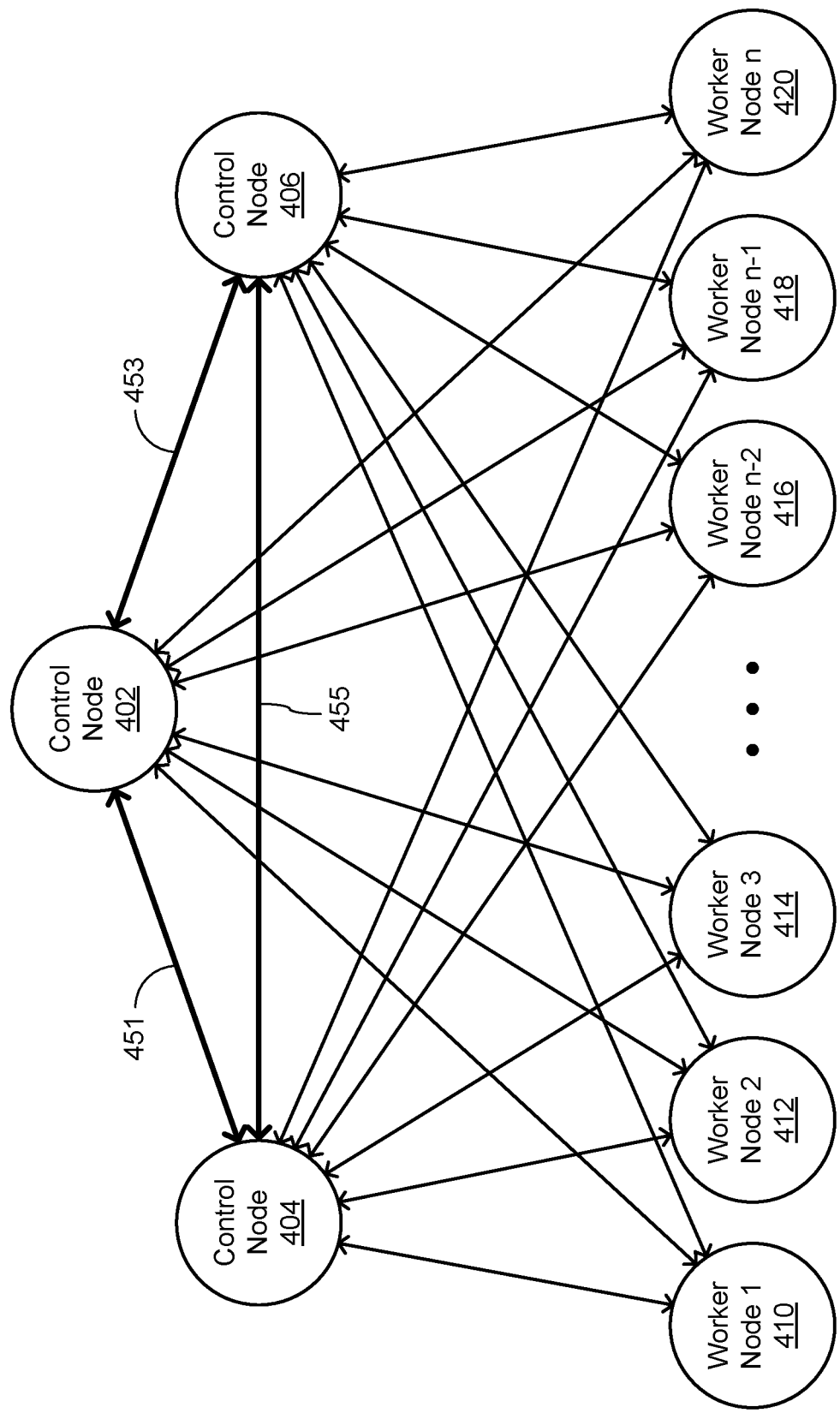
FIG. 4 illustrates a communications grid computing system including a variety of control and worker nodes, according to some embodiments of the present technology.

FIG. 4 illustrates a communications grid computing system 400 including a variety of control and worker nodes, according to embodiments of the present technology. Communications grid computing system 400 includes three control nodes and one or more worker nodes. Communications grid computing system 400 includes control nodes 402, 404, and 406. The control nodes are communicatively connected via communication paths 451, 453, and 455. Therefore, the control nodes may transmit information (e.g., related to the communications grid or notifications), to and receive information from each other. Although communications grid computing system 400 is shown in FIG. 4 as including three control nodes, the communications grid may include more or less than three control nodes.

Communications grid computing system (or just "communications grid") 400 also includes one or more worker nodes. Shown in FIG. 4 are six worker nodes 410-420. Although FIG. 4 shows six worker nodes, a communications grid according to embodiments of the present technology may include more or less than six worker nodes. The number of worker nodes included in a communications grid may be dependent upon how large the project or data set is being processed by the communications grid, the capacity of each worker node, the time designated for the communications grid to complete the project, among others. Each worker node within the communications grid 400 may be connected (wired or wirelessly, and directly or indirectly) to control nodes 402-406. Therefore, each worker node may receive information from the control nodes (e.g., an instruction to perform work on a project) and may transmit information to the control nodes (e.g., a result from work performed on a project). Furthermore, worker nodes may communicate with each other (either directly or indirectly). For example, worker nodes may transmit data between each other related to a job being performed or an individual task within a job being performed by that worker node. However, in certain embodiments, worker nodes may not, for example, be connected (communicatively or otherwise) to certain other worker nodes. In an embodiment, worker nodes may only be able to communicate with the control node that controls it, and may not be able to communicate with other worker nodes in the communications grid, whether they are other worker nodes controlled by the control node that controls the worker node, or worker nodes that are controlled by other control nodes in the communications grid.

A control node may connect with an external device with which the control node may communicate (e.g., a grid user, such as a server or computer, may connect to a controller of the grid). For example, a server or computer may connect to control nodes and may transmit a project or job to the node. The project may include a data set. The data set may be of any size. Once the control node receives such a project including a large data set, the control node may distribute the data set or projects related to the data set to be performed by worker nodes. Alternatively, for a project including a large data set, the data set may be received or stored by a machine other than a control node (e.g., a HADOOP® standard-compliant data node employing the HADOOP® Distributed File System, or HDFS).

Control nodes may maintain knowledge of the status of the nodes in the grid (i.e., grid status information), accept work requests from clients, subdivide the work across worker nodes, and coordinate the worker nodes, among other responsibilities. Worker nodes may accept work requests from a control node and provide the control node with results of the work performed by the worker node. A grid may be started from a single node (e.g., a machine, computer, server, etc.). This first node may be assigned or may start as the primary control node that will control any additional nodes that enter the grid.

When a project is submitted for execution (e.g., by a client or a controller of the grid) it may be assigned to a set of nodes. After the nodes are assigned to a project, a data structure (i.e., a communicator) may be created. The communicator may be used by the project for information to be shared between the project codes running on each node. A communication handle may be created on each node. A handle, for example, is a reference to the communicator that is valid within a single process on a single node, and the handle may be used when requesting communications between nodes.

A control node, such as control node 402, may be designated as the primary control node. A server, computer or other external device may connect to the primary control node. Once the control node receives a project, the primary control node may distribute portions of the project to its worker nodes for execution. For example, when a project is initiated on communications grid 400, primary control node 402 controls the work to be performed for the project in order to complete the project as requested or instructed. The primary control node may distribute work to the worker nodes based on various factors, such as which subsets or portions of projects may be completed most efficiently and in the correct amount of time. For example, a worker node may perform analysis on a portion of data that is already local (e.g., stored on) the worker node. The primary control node also coordinates and processes the results of the work performed by each worker node after each worker node executes and completes its job. For example, the primary control node may receive a result from one or more worker nodes, and the control node may organize (e.g., collect and assemble) the results received and compile them to produce a complete result for the project received from the end user.

Any remaining control nodes, such as control nodes 404 and 406, may be assigned as backup control nodes for the project. In an embodiment, backup control nodes may not control any portion of the project. Instead, backup control nodes may serve as a backup for the primary control node and take over as primary control node if the primary control node were to fail. If a communications grid were to include only a single control node, and the control node were to fail (e.g., the control node is shut off or breaks) then the communications grid as a whole may fail and any project or job being run on the communications grid may fail and may not complete. While the project may be run again, such a failure may cause a delay (severe delay in some cases, such as overnight delay) in completion of the project. Therefore, a grid with multiple control nodes, including a backup control node, may be beneficial.

To add another node or machine to the grid, the primary control node may open a pair of listening sockets, for example. A socket may be used to accept work requests from clients, and the second socket may be used to accept connections from other grid nodes. The primary control node may be provided with a list of other nodes (e.g., other machines, computers, servers) that will participate in the grid, and the role that each node will fill in the grid. Upon startup of the primary control node (e.g., the first node on the grid), the primary control node may use a network protocol to start the server process on every other node in the grid. Command line parameters, for example, may inform each node of one or more pieces of information, such as: the role that the node will have in the grid, the host name of the primary control node, the port number on which the primary control node is accepting connections from peer nodes, among others. The information may also be provided in a configuration file, transmitted over a secure shell tunnel, recovered from a configuration server, among others. While the other machines in the grid may not initially know about the configuration of the grid, that information may also be sent to each other node by the primary control node. Updates of the grid information may also be subsequently sent to those nodes.

For any control node other than the primary control node added to the grid, the control node may open three sockets. The first socket may accept work requests from clients, the second socket may accept connections from other grid members, and the third socket may connect (e.g., permanently) to the primary control node. When a control node (e.g., primary control node) receives a connection from another control node, it first checks to see if the peer node is in the list of configured nodes in the grid. If it is not on the list, the control node may clear the connection. If it is on the list, it may then attempt to authenticate the connection. If authentication is successful, the authenticating node may transmit information to its peer, such as the port number on which a node is listening for connections, the host name of the node, information about how to authenticate the node, among other information. When a node, such as the new control node, receives information about another active node, it will check to see if it already has a connection to that other node. If it does not have a connection to that node, it may then establish a connection to that control node.

Any worker node added to the grid may establish a connection to the primary control node and any other control nodes on the grid. After establishing the connection, it may authenticate itself to the grid (e.g., any control nodes, including both primary and backup, or a server or user controlling the grid). After successful authentication, the worker node may accept configuration information from the control node.

When a node joins a communications grid (e.g., when the node is powered on or connected to an existing node on the grid or both), the node is assigned (e.g., by an operating system of the grid) a universally unique identifier (UUID). This unique identifier may help other nodes and external entities (devices, users, etc.) to identify the node and distinguish it from other nodes. When a node is connected to the grid, the node may share its unique identifier with the other nodes in the grid. Since each node may share its unique identifier, each node may know the unique identifier of every other node on the grid. Unique identifiers may also designate a hierarchy of each of the nodes (e.g., backup control nodes) within the grid. For example, the unique identifiers of each of the backup control nodes may be stored in a list of backup control nodes to indicate an order in which the backup control nodes will take over for a failed primary control node to become a new primary control node. However, a hierarchy of nodes may also be determined using methods other than using the unique identifiers of the nodes. For example, the hierarchy may be predetermined, or may be assigned based on other predetermined factors.

The grid may add new machines at any time (e.g., initiated from any control node). Upon adding a new node to the grid, the control node may first add the new node to its table of grid nodes. The control node may also then notify every other control node about the new node. The nodes receiving the notification may acknowledge that they have updated their configuration information.

Primary control node 402 may, for example, transmit one or more communications to backup control nodes 404 and 406 (and, for example, to other control or worker nodes within the communications grid). Such communications may be sent periodically, at fixed time intervals, between known fixed stages of the project's execution, among other protocols. The communications transmitted by primary control node 402 may be of varied types and may include a variety of types of information. For example, primary control node 402 may transmit snapshots (e.g., status information) of the communications grid so that backup control node 404 always has a recent snapshot of the communications grid. The snapshot or grid status may include, for example, the structure of the grid (including, for example, the worker nodes in the grid, unique identifiers of the nodes, or their relationships with the primary control node) and the status of a project (including, for example, the status of each worker node's portion of the project). The snapshot may also include analysis or results received from worker nodes in the communications grid. The backup control nodes may receive and store the backup data received from the primary control node. The backup control nodes may transmit a request for such a snapshot (or other information) from the primary control node, or the primary control node may send such information periodically to the backup control nodes.

As noted, the backup data may allow the backup control node to take over as primary control node if the primary control node fails without requiring the grid to start the project over from scratch. If the primary control node fails, the backup control node that will take over as primary control node may retrieve the most recent version of the snapshot received from the primary control node and use the snapshot to continue the project from the stage of the project indicated by the backup data. This may prevent failure of the project as a whole.

A backup control node may use various methods to determine that the primary control node has failed. In one example of such a method, the primary control node may transmit (e.g., periodically) a communication to the backup control node that indicates that the primary control node is working and has not failed, such as a heartbeat communication. The backup control node may determine that the primary control node has failed if the backup control node has not received a heartbeat communication for a certain predetermined period of time. Alternatively, a backup control node may also receive a communication from the primary control node itself (before it failed) or from a worker node that the primary control node has failed, for example because the primary control node has failed to communicate with the worker node.

Different methods may be performed to determine which backup control node of a set of backup control nodes (e.g., backup control nodes 404 and 406) will take over for failed primary control node 402 and become the new primary control node. For example, the new primary control node may be chosen based on a ranking or "hierarchy" of backup control nodes based on their unique identifiers. In an alternative embodiment, a backup control node may be assigned to be the new primary control node by another device in the communications grid or from an external device (e.g., a system infrastructure or an end user, such as a server or computer, controlling the communications grid). In another alternative embodiment, the backup control node that takes over as the new primary control node may be designated based on bandwidth or other statistics about the communications grid.

A worker node within the communications grid may also fail. If a worker node fails, work being performed by the failed worker node may be redistributed amongst the operational worker nodes. In an alternative embodiment, the primary control node may transmit a communication to each of the operable worker nodes still on the communications grid that each of the worker nodes should purposefully fail also. After each of the worker nodes fail, they may each retrieve their most recent saved checkpoint of their status and re-start the project from that checkpoint to minimize lost progress on the project being executed.

Figure 5:
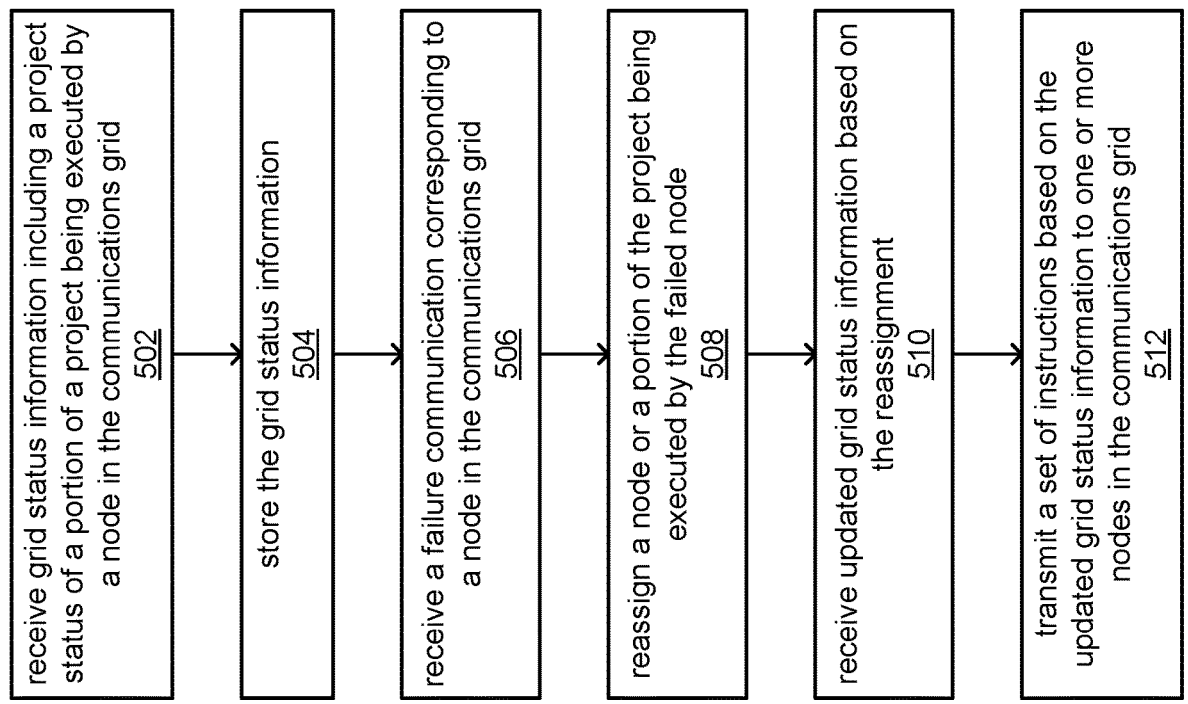
FIG. 5 illustrates a flow chart showing an example process for adjusting a communications grid or a work project in a communications grid after a failure of a node, according to some embodiments of the present technology.

FIG. 5 illustrates a flow chart showing an example process 500 for adjusting a communications grid or a work project in a communications grid after a failure of a node, according to embodiments of the present technology. The process may include, for example, receiving grid status information including a project status of a portion of a project being executed by a node in the communications grid, as described in operation 502. For example, a control node (e.g., a backup control node connected to a primary control node and a worker node on a communications grid) may receive grid status information, where the grid status information includes a project status of the primary control node or a project status of the worker node. The project status of the primary control node and the project status of the worker node may include a status of one or more portions of a project being executed by the primary and worker nodes in the communications grid. The process may also include storing the grid status information, as described in operation 504. For example, a control node (e.g., a backup control node) may store the received grid status information locally within the control node. Alternatively, the grid status information may be sent to another device for storage where the control node may have access to the information.

The process may also include receiving a failure communication corresponding to a node in the communications grid in operation 506. For example, a node may receive a failure communication including an indication that the primary control node has failed, prompting a backup control node to take over for the primary control node. In an alternative embodiment, a node may receive a failure that a worker node has failed, prompting a control node to reassign the work being performed by the worker node. The process may also include reassigning a node or a portion of the project being executed by the failed node, as described in operation 508. For example, a control node may designate the backup control node as a new primary control node based on the failure communication upon receiving the failure communication. If the failed node is a worker node, a control node may identify a project status of the failed worker node using the snapshot of the communications grid, where the project status of the failed worker node includes a status of a portion of the project being executed by the failed worker node at the failure time.

The process may also include receiving updated grid status information based on the reassignment, as described in operation 510, and transmitting a set of instructions based on the updated grid status information to one or more nodes in the communications grid, as described in operation 512. The updated grid status information may include an updated project status of the primary control node or an updated project status of the worker node. The updated information may be transmitted to the other nodes in the grid to update their stale stored information.

Figure 6:
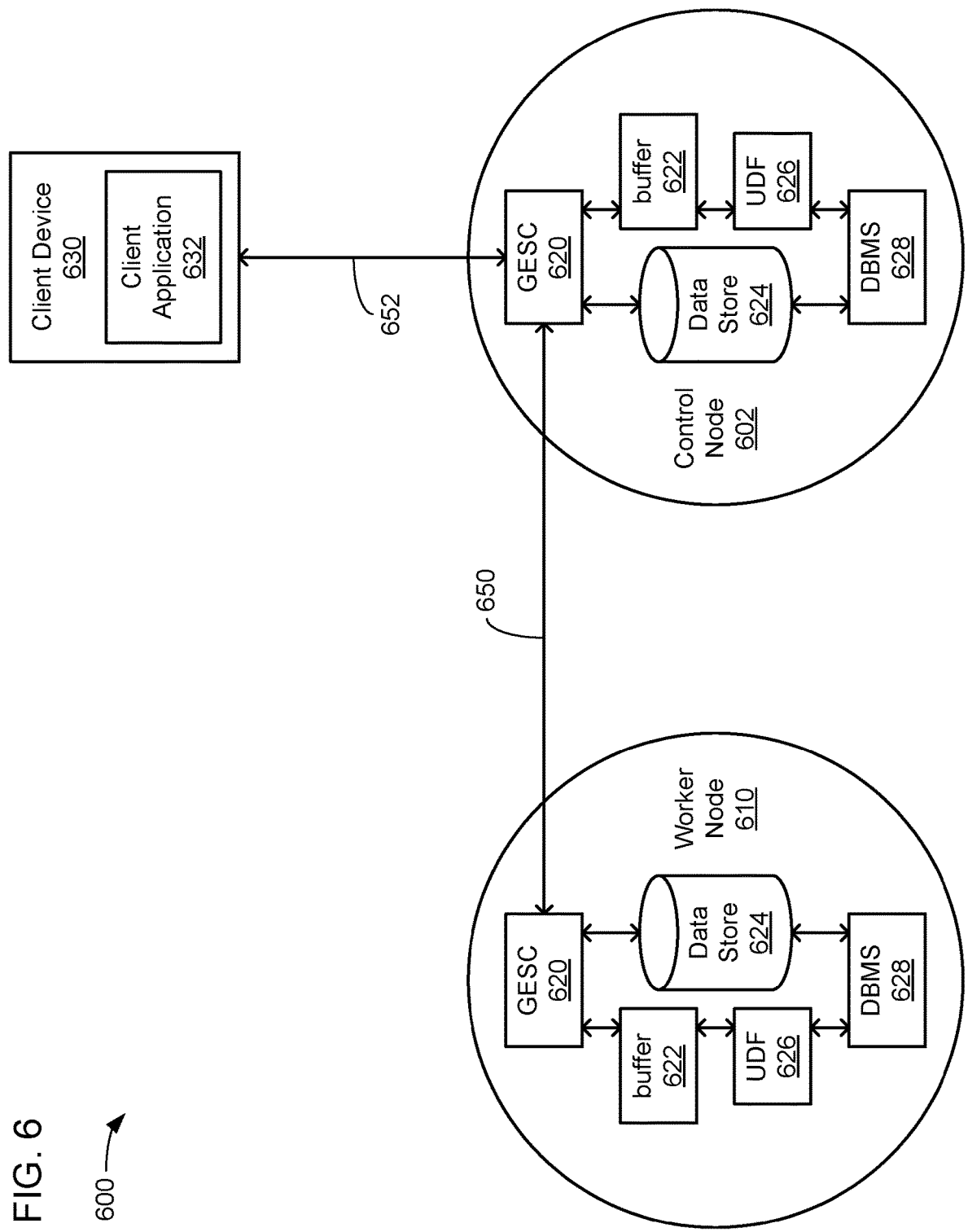
FIG. 6 illustrates a portion of a communications grid computing system including a control node and a worker node, according to some embodiments of the present technology.

FIG. 6 illustrates a portion of a communications grid computing system 600 including a control node and a worker node, according to embodiments of the present technology. Communications grid 600 computing system includes one control node (control node 602) and one worker node (worker node 610) for purposes of illustration, but may include more worker and/or control nodes. The control node 602 is communicatively connected to worker node 610 via communication path 650. Therefore, control node 602 may transmit information (e.g., related to the communications grid or notifications), to and receive information from worker node 610 via path 650.

Similar to in FIG. 4, communications grid computing system (or just "communications grid") 600 includes data processing nodes (control node 602 and worker node 610). Nodes 602 and 610 include multi-core data processors. Each node 602 and 610 includes a grid-enabled software component (GESC) 620 that executes on the data processor associated with that node and interfaces with buffer memory 622 also associated with that node. Each node 602 and 610 includes database management software (DBMS) 628 that executes on a database server (not shown) at control node 602 and on a database server (not shown) at worker node 610.

Each node also includes a data store 624. Data stores 624, similar to network-attached data stores 110 in FIG. 1 and data stores 235 in FIG. 2, are used to store data to be processed by the nodes in the computing environment. Data stores 624 may also store any intermediate or final data generated by the computing system after being processed, for example in non-volatile memory. However, in certain embodiments, the configuration of the grid computing environment allows its operations to be performed such that intermediate and final data results can be stored solely in volatile memory (e.g., RAM), without a requirement that intermediate or final data results be stored to non-volatile types of memory. Storing such data in volatile memory may be useful in certain situations, such as when the grid receives queries (e.g., ad hoc) from a client and when responses, which are generated by processing large amounts of data, need to be generated quickly or on-the-fly. In such a situation, the grid may be configured to retain the data within memory so that responses can be generated at different levels of detail and so that a client may interactively query against this information.

Each node also includes a user-defined function (UDF) 626. The UDF provides a mechanism for the DBMS 628 to transfer data to or receive data from the database stored in the data stores 624 that are managed by the DBMS. For example, UDF 626 can be invoked by the DBMS to provide data to the GESC for processing. The UDF 626 may establish a socket connection (not shown) with the GESC to transfer the data. Alternatively, the UDF 626 can transfer data to the GESC by writing data to shared memory accessible by both the UDF and the GESC.

The GESC 620 at the nodes 602 and 620 may be connected via a network, such as network 108 shown in FIG. 1. Therefore, nodes 602 and 620 can communicate with each other via the network using a predetermined communication protocol such as, for example, the Message Passing Interface (MPI). Each GESC 620 can engage in point-to-point communication with the GESC at another node or in collective communication with multiple GESCs via the network. The GESC 620 at each node may contain identical (or nearly identical) software instructions. Each node may be capable of operating as either a control node or a worker node. The GESC at the control node 602 can communicate, over a communication path 652, with a client deice 630. More specifically, control node 602 may communicate with client application 632 hosted by the client device 630 to receive queries and to respond to those queries after processing large amounts of data.

DBMS 628 may control the creation, maintenance, and use of database or data structure (not shown) within a nodes 602 or 610. The database may organize data stored in data stores 624. The DBMS 628 at control node 602 may accept requests for data and transfer the appropriate data for the request. With such a process, collections of data may be distributed across multiple physical locations. In this example, each node 602 and 610 stores a portion of the total data managed by the management system in its associated data store 624.

Furthermore, the DBMS may be responsible for protecting against data loss using replication techniques. Replication includes providing a backup copy of data stored on one node on one or more other nodes. Therefore, if one node fails, the data from the failed node can be recovered from a replicated copy residing at another node. However, as described herein with respect to FIG. 4, data or status information for each node in the communications grid may also be shared with each node on the grid.

Figure 7:
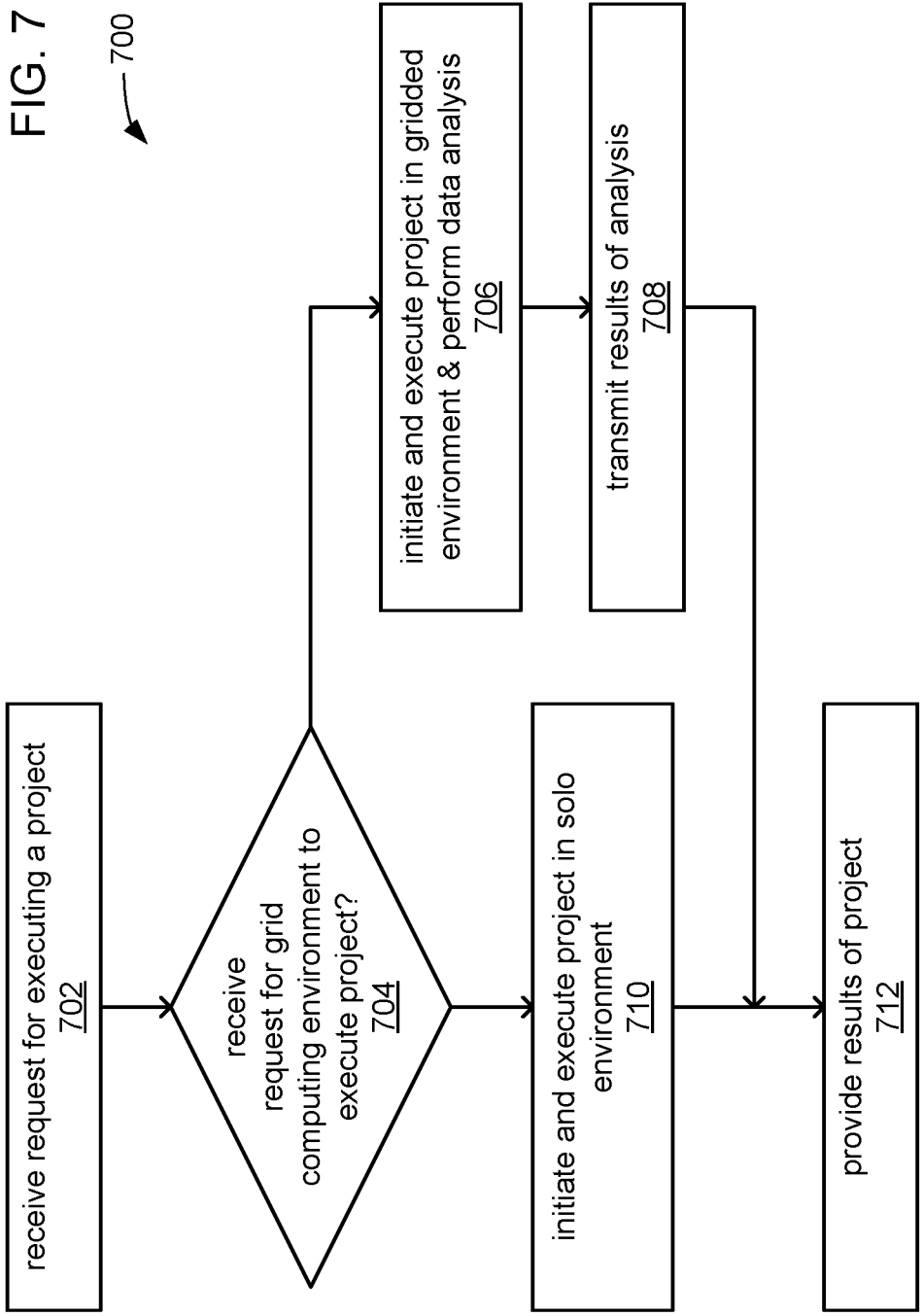
FIG. 7 illustrates a flow chart showing an example process for executing a data analysis or processing project, according to some embodiments of the present technology.

FIG. 7 illustrates a flow chart showing an example method 700 for executing a project within a grid computing system, according to embodiments of the present technology. As described with respect to FIG. 6, the GESC at the control node may transmit data with a client device (e.g., client device 630) to receive queries for executing a project and to respond to those queries after large amounts of data have been processed. The query may be transmitted to the control node, where the query may include a request for executing a project, as described in operation 702. The query can contain instructions on the type of data analysis to be performed in the project and whether the project should be executed using the grid-based computing environment, as shown in operation 704.

To initiate the project, the control node may determine if the query requests use of the grid-based computing environment to execute the project. If the determination is no, then the control node initiates execution of the project in a solo environment (e.g., at the control node), as described in operation 710. If the determination is yes, the control node may initiate execution of the project in the grid-based computing environment, as described in operation 706. In such a situation, the request may include a requested configuration of the grid. For example, the request may include a number of control nodes and a number of worker nodes to be used in the grid when executing the project. After the project has been completed, the control node may transmit results of the analysis yielded by the grid, as described in operation 708. Whether the project is executed in a solo or grid-based environment, the control node provides the results of the project, as described in operation 712.

As noted with respect to FIG. 2, the computing environments described herein may collect data (e.g., as received from network devices, such as sensors, such as network devices 204-209 in FIG. 2, and client devices or other sources) to be processed as part of a data analytics project, and data may be received in real time as part of a streaming analytics environment (e.g., ESP). Data may be collected using a variety of sources as communicated via different kinds of networks or locally, such as on a real-time streaming basis. For example, network devices may receive data periodically from network device sensors as the sensors continuously sense, monitor and track changes in their environments. More specifically, an increasing number of distributed applications develop or produce continuously flowing data from distributed sources by applying queries to the data before distributing the data to geographically distributed recipients. An event stream processing engine (ESPE) may continuously apply the queries to the data as it is received and determines which entities should receive the data. Client or other devices may also subscribe to the ESPE or other devices processing ESP data so that they can receive data after processing, based on for example the entities determined by the processing engine. For example, client devices 230 in FIG. 2 may subscribe to the ESPE in computing environment 214. In another example, event subscription devices 1024a-c, described further with respect to FIG. 10, may also subscribe to the ESPE. The ESPE may determine or define how input data or event streams from network devices or other publishers (e.g., network devices 204-209 in FIG. 2) are transformed into meaningful output data to be consumed by subscribers, such as for example client devices 230 in FIG. 2.

FIG. 8 illustrates a block diagram including components of an Event Stream Processing Engine (ESPE), according to embodiments of the present technology. ESPE 800 may include one or more projects 802. A project may be described as a second-level container in an engine model managed by ESPE 800 where a thread pool size for the project may be defined by a user. Each project of the one or more projects 802 may include one or more continuous queries 804 that contain data flows, which are data transformations of incoming event streams. The one or more continuous queries 804 may include one or more source windows 806 and one or more derived windows 808.

The ESPE may receive streaming data over a period of time related to certain events, such as events or other data sensed by one or more network devices. The ESPE may perform operations associated with processing data created by the one or more devices. For example, the ESPE may receive data from the one or more network devices 204-209 shown in FIG. 2. As noted, the network devices may include sensors that sense different aspects of their environments, and may collect data over time based on those sensed observations. For example, the ESPE may be implemented within one or more of machines 220 and 240 shown in FIG. 2. The ESPE may be implemented within such a machine by an ESP application. An ESP application may embed an ESPE with its own dedicated thread pool or pools into its application space where the main application thread can do application-specific work and the ESPE processes event streams at least by creating an instance of a model into processing objects.

The engine container is the top-level container in a model that manages the resources of the one or more projects 802. In an illustrative embodiment, for example, there may be only one ESPE 800 for each instance of the ESP application, and ESPE 800 may have a unique engine name. Additionally, the one or more projects 802 may each have unique project names, and each query may have a unique continuous query name and begin with a uniquely named source window of the one or more source windows 806. ESPE 800 may or may not be persistent.

Continuous query modeling involves defining directed graphs of windows for event stream manipulation and transformation. A window in the context of event stream manipulation and transformation is a processing node in an event stream processing model. A window in a continuous query can perform aggregations, computations, pattern-matching, and other operations on data flowing through the window. A continuous query may be described as a directed graph of source, relational, pattern matching, and procedural windows. The one or more source windows 806 and the one or more derived windows 808 represent continuously executing queries that generate updates to a query result set as new event blocks stream through ESPE 800. A directed graph, for example, is a set of nodes connected by edges, where the edges have a direction associated with them.

An event object may be described as a packet of data accessible as a collection of fields, with at least one of the fields defined as a key or unique identifier (ID). The event object may be created using a variety of formats including binary, alphanumeric, XML, etc. Each event object may include one or more fields designated as a primary identifier (ID) for the event so ESPE 800 can support operation codes (opcodes) for events including insert, update, upsert, and delete. Upsert opcodes update the event if the key field already exists; otherwise, the event is inserted. For illustration, an event object may be a packed binary representation of a set of field values and include both metadata and field data associated with an event. The metadata may include an opcode indicating if the event represents an insert, update, delete, or upsert, a set of flags indicating if the event is a normal, partial-update, or a retention generated event from retention policy management, and a set of microsecond timestamps that can be used for latency measurements.

An event block object may be described as a grouping or package of event objects. An event stream may be described as a flow of event block objects. A continuous query of the one or more continuous queries 804 transforms a source event stream made up of streaming event block objects published into ESPE 800 into one or more output event streams using the one or more source windows 806 and the one or more derived windows 808. A continuous query can also be thought of as data flow modeling.

The one or more source windows 806 are at the top of the directed graph and have no windows feeding into them. Event streams are published into the one or more source windows 806, and from there, the event streams may be directed to the next set of connected windows as defined by the directed graph. The one or more derived windows 808 are all instantiated windows that are not source windows and that have other windows streaming events into them. The one or more derived windows 808 may perform computations or transformations on the incoming event streams. The one or more derived windows 808 transform event streams based on the window type (that is operators such as join, filter, compute, aggregate, copy, pattern match, procedural, union, etc.) and window settings. As event streams are published into ESPE 800, they are continuously queried, and the resulting sets of derived windows in these queries are continuously updated.

FIG. 9 illustrates a flow chart showing an example process including operations performed by an event stream processing engine, according to some embodiments of the present technology. As noted, the ESPE 800 (or an associated ESP application) defines how input event streams are transformed into meaningful output event streams. More specifically, the ESP application may define how input event streams from publishers (e.g., network devices providing sensed data) are transformed into meaningful output event streams consumed by subscribers (e.g., a data analytics project being executed by a machine or set of machines).

Within the application, a user may interact with one or more user interface windows presented to the user in a display under control of the ESPE independently or through a browser application in an order selectable by the user. For example, a user may execute an ESP application, which causes presentation of a first user interface window, which may include a plurality of menus and selectors such as drop down menus, buttons, text boxes, hyperlinks, etc. associated with the ESP application as understood by a person of skill in the art. As further understood by a person of skill in the art, various operations may be performed in parallel, for example, using a plurality of threads.

At operation 900, an ESP application may define and start an ESPE, thereby instantiating an ESPE at a device, such as machine 220 and/or 240. In an operation 902, the engine container is created. For illustration, ESPE 800 may be instantiated using a function call that specifies the engine container as a manager for the model.

In an operation 904, the one or more continuous queries 804 are instantiated by ESPE 800 as a model. The one or more continuous queries 804 may be instantiated with a dedicated thread pool or pools that generate updates as new events stream through ESPE 800. For illustration, the one or more continuous queries 804 may be created to model business processing logic within ESPE 800, to predict events within ESPE 800, to model a physical system within ESPE 800, to predict the physical system state within ESPE 800, etc. For example, as noted, ESPE 800 may be used to support sensor data monitoring and management (e.g., sensing may include force, torque, load, strain, position, temperature, air pressure, fluid flow, chemical properties, resistance, electromagnetic fields, radiation, irradiance, proximity, acoustics, moisture, distance, speed, vibrations, acceleration, electrical potential, or electrical current, etc.).

ESPE 800 may analyze and process events in motion or "event streams." Instead of storing data and running queries against the stored data, ESPE 800 may store queries and stream data through them to allow continuous analysis of data as it is received. The one or more source windows 806 and the one or more derived windows 808 may be created based on the relational, pattern matching, and procedural algorithms that transform the input event streams into the output event streams to model, simulate, score, test, predict, etc. based on the continuous query model defined and application to the streamed data.

In an operation 906, a publish/subscribe (pub/sub) capability is initialized for ESPE 800. In an illustrative embodiment, a pub/sub capability is initialized for each project of the one or more projects 802. To initialize and enable pub/sub capability for ESPE 800, a port number may be provided. Pub/sub clients can use a host name of an ESP device running the ESPE and the port number to establish pub/sub connections to ESPE 800.

FIG. 10 illustrates an ESP system 1000 interfacing between publishing device 1022 and event subscribing devices 1024*a-c*, according to embodiments of the present technology. ESP system 1000 may include ESP device or subsystem 851, event publishing device 1022, an event subscribing device A 1024*a*, an event subscribing device B 1024*b*, and an event subscribing device C 1024*c*. Input event streams are output to ESP device 851 by publishing device 1022. In alternative embodiments, the input event streams may be created by a plurality of publishing devices. The plurality of publishing devices further may publish event streams to other ESP devices. The one or more continuous queries instantiated by ESPE 800 may analyze and process the input event streams to form output event streams output to event subscribing device A 1024*a*, event subscribing device B 1024*b*, and event subscribing device C 1024*c*. ESP system 1000 may include a greater or a fewer number of event subscribing devices of event subscribing devices.

Publish-subscribe is a message-oriented interaction paradigm based on indirect addressing. Processed data recipients specify their interest in receiving information from ESPE 800 by subscribing to specific classes of events, while information sources publish events to ESPE 800 without directly addressing the receiving parties. ESPE 800 coordinates the interactions and processes the data. In some cases, the data source receives confirmation that the published information has been received by a data recipient.

A publish/subscribe API may be described as a library that enables an event publisher, such as publishing device 1022, to publish event streams into ESPE 800 or an event subscriber, such as event subscribing device A 1024*a*, event subscribing device B 1024*b*, and event subscribing device C 1024*c*, to subscribe to event streams from ESPE 800. For illustration, one or more publish/subscribe APIs may be defined. Using the publish/subscribe API, an event publishing application may publish event streams into a running event stream processor project source window of ESPE 800, and the event subscription application may subscribe to an event stream processor project source window of ESPE 800.

The publish/subscribe API provides cross-platform connectivity and endianness compatibility between ESP application and other networked applications, such as event publishing applications instantiated at publishing device 1022, and event subscription applications instantiated at one or more of event subscribing device A 1024*a*, event subscribing device B 1024*b*, and event subscribing device C 1024*c*.

Referring back to FIG. 9, operation 906 initializes the publish/subscribe capability of ESPE 800. In an operation 908, the one or more projects 802 are started. The one or more started projects may run in the background on an ESP device. In an operation 910, an event block object is received from one or more computing device of the event publishing device 1022.

ESP subsystem 800 may include a publishing client 1002, ESPE 800, a subscribing client A 1004, a subscribing client B 1006, and a subscribing client C 1008. Publishing client 1002 may be started by an event publishing application executing at publishing device 1022 using the publish/subscribe API. Subscribing client A 1004 may be started by an event subscription application A, executing at event subscribing device A 1024*a* using the publish/subscribe API. Subscribing client B 1006 may be started by an event subscription application B executing at event subscribing device B 1024*b* using the publish/subscribe API. Subscribing client C 1008 may be started by an event subscription application C executing at event subscribing device C 1024*c* using the publish/subscribe API.

An event block object containing one or more event objects is injected into a source window of the one or more source windows 806 from an instance of an event publishing application on event publishing device 1022. The event block object may be generated, for example, by the event publishing application and may be received by publishing client 1002. A unique ID may be maintained as the event block object is passed between the one or more source windows 806 and/or the one or more derived windows 808 of ESPE 800, and to subscribing client A 1004, subscribing client B 1006, and subscribing client C 1008 and to event subscription device A 1024*a*, event subscription device B 1024*b*, and event subscription device C 1024*c*. Publishing client 1002 may further generate and include a unique embedded transaction ID in the event block object as the event block object is processed by a continuous query, as well as the unique ID that publishing device 1022 assigned to the event block object.

In an operation 912, the event block object is processed through the one or more continuous queries 804. In an operation 914, the processed event block object is output to one or more computing devices of the event subscribing devices 1024*a-c*. For example, subscribing client A 1004, subscribing client B 1006, and subscribing client C 1008 may send the received event block object to event subscription device A 1024*a*, event subscription device B 1024*b*, and event subscription device C 1024*c*, respectively.

ESPE 800 maintains the event block containership aspect of the received event blocks from when the event block is published into a source window and works its way through the directed graph defined by the one or more continuous queries 804 with the various event translations before being output to subscribers. Subscribers can correlate a group of subscribed events back to a group of published events by comparing the unique ID of the event block object that a publisher, such as publishing device 1022, attached to the event block object with the event block ID received by the subscriber.

In an operation 916, a determination is made concerning whether or not processing is stopped. If processing is not stopped, processing continues in operation 910 to continue receiving the one or more event streams containing event block objects from the, for example, one or more network devices. If processing is stopped, processing continues in an operation 918. In operation 918, the started projects are stopped. In operation 920, the ESPE is shutdown.

As noted, in some embodiments, big data is processed for an analytics project after the data is received and stored. In other embodiments, distributed applications process continuously flowing data in real-time from distributed sources by applying queries to the data before distributing the data to geographically distributed recipients. As noted, an event stream processing engine (ESPE) may continuously apply the queries to the data as it is received and determines which entities receive the processed data. This allows for large amounts of data being received and/or collected in a variety of environments to be processed and distributed in real time. For example, as shown with respect to FIG. 2, data may be collected from network devices that may include devices within the internet of things, such as devices within a home automation network. However, such data may be collected from a variety of different resources in a variety of different environments. In any such situation, embodiments of the present technology allow for real-time processing of such data.

Aspects of the current disclosure provide technical solutions to technical problems, such as computing problems that arise when an ESP device fails which results in a complete service interruption and potentially significant data loss. The data loss can be catastrophic when the streamed data is supporting mission critical operations such as those in support of an ongoing manufacturing or drilling operation. An embodiment of an ESP system achieves a rapid and seamless failover of ESPE running at the plurality of ESP devices without service interruption or data loss, thus significantly improving the reliability of an operational system that relies on the live or real-time processing of the data streams. The event publishing systems, the event subscribing systems, and each ESPE not executing at a failed ESP device are not aware of or effected by the failed ESP device. The ESP system may include thousands of event publishing systems and event subscribing systems. The ESP system keeps the failover logic and awareness within the boundaries of out-messaging network connector and out-messaging network device.

In one example embodiment, a system is provided to support a failover when event stream processing (ESP) event blocks. The system includes, but is not limited to, an out-messaging network device and a computing device. The computing device includes, but is not limited to, a processor and a computer-readable medium operably coupled to the processor. The processor is configured to execute an ESP engine (ESPE). The computer-readable medium has instructions stored thereon that, when executed by the processor, cause the computing device to support the failover. An event block object is received from the ESPE that includes a unique identifier. A first status of the computing device as active or standby is determined. When the first status is active, a second status of the computing device as newly active or not newly active is determined. Newly active is determined when the computing device is switched from a standby status to an active status. When the second status is newly active, a last published event block object identifier that uniquely identifies a last published event block object is determined. A next event block object is selected from a non-transitory computer-readable medium accessible by the computing device. The next event block object has an event block object identifier that is greater than the determined last published event block object identifier. The selected next event block object is published to an out-messaging network device. When the second status of the computing device is not newly active, the received event block object is published to the out-messaging network device. When the first status of the computing device is standby, the received event block object is stored in the non-transitory computer-readable medium.

Figure 11:
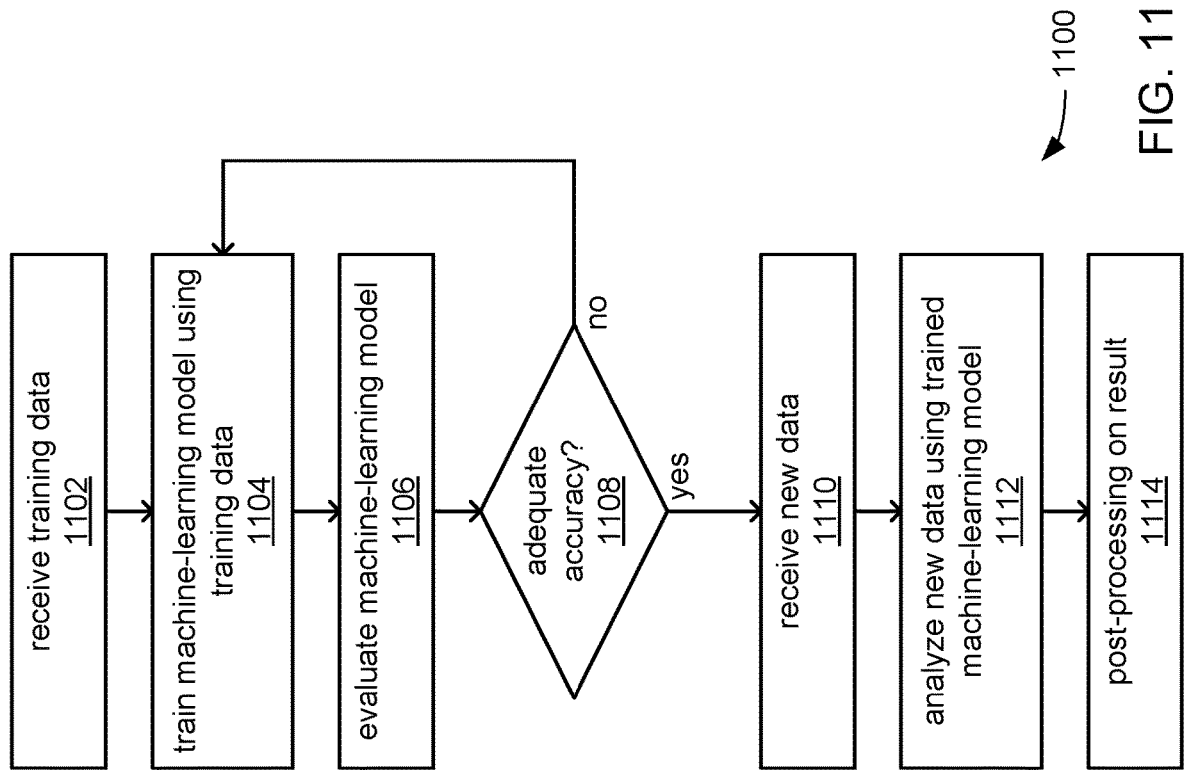
FIG. 11 illustrates a flow chart of an example of a process for generating and using a machine-learning model according to some aspects, according to some embodiments of the present technology.

FIG. 11 is a flow chart of an example of a process for generating and using a machine-learning model according to some aspects. Machine learning is a branch of artificial intelligence that relates to mathematical models that can learn from, categorize, and make predictions about data. Such mathematical models, which can be referred to as machine-learning models, can classify input data among two or more classes; cluster input data among two or more groups; predict a result based on input data; identify patterns or trends in input data; identify a distribution of input data in a space; or any combination of these. Examples of machine-learning models can include (i) neural networks; (ii) decision trees, such as classification trees and regression trees; (iii) classifiers, such as Naïve bias classifiers, logistic regression classifiers, ridge regression classifiers, random forest classifiers, least absolute shrinkage and selector (LASSO) classifiers, and support vector machines; (iv) clusterers, such as k-means clusterers, mean-shift clusterers, and spectral clusterers; (v) factorizers, such as factorization machines, principal component analyzers and kernel principal component analyzers; and (vi) ensembles or other combinations of machine-learning models. In some examples, neural networks can include deep neural networks, feed-forward neural networks, recurrent neural networks, convolutional neural networks, radial basis function (RBF) neural networks, echo state neural networks, long short-term memory neural networks, bi-directional recurrent neural networks, gated neural networks, hierarchical recurrent neural networks, stochastic neural networks, modular neural networks, spiking neural networks, dynamic neural networks, cascading neural networks, neuro-fuzzy neural networks, or any combination of these.

Different machine-learning models may be used interchangeably to perform a task. Examples of tasks that can be performed at least partially using machine-learning models include various types of scoring; bioinformatics; cheminformatics; software engineering; fraud detection; customer segmentation; generating online recommendations; adaptive websites; determining customer lifetime value; search engines; placing advertisements in real time or near real time; classifying DNA sequences; affective computing; performing natural language processing and understanding; object recognition and computer vision; robotic locomotion; playing games; optimization and metaheuristics; detecting network intrusions; medical diagnosis and monitoring; or predicting when an asset, such as a machine, will need maintenance.

Any number and combination of tools can be used to create machine-learning models. Examples of tools for creating and managing machine-learning models can include SAS® Enterprise Miner, SAS® Rapid Predictive Modeler, and SAS® Model Manager, SAS Cloud Analytic Services (CAS)®, SAS Viya® of all which are by SAS Institute Inc. of Cary, North Carolina.

Machine-learning models can be constructed through an at least partially automated (e.g., with little or no human involvement) process called training. During training, input data can be iteratively supplied to a machine-learning model to enable the machine-learning model to identify patterns related to the input data or to identify relationships between the input data and output data. With training, the machine-learning model can be transformed from an untrained state to a trained state. Input data can be split into one or more training sets and one or more validation sets, and the training process may be repeated multiple times. The splitting may follow a k-fold cross-validation rule, a leave-one-out-rule, a leave-p-out rule, or a holdout rule. An overview of training and using a machine-learning model is described below with respect to the flow chart of FIG. 11.

In block 1102, training data is received. In some examples, the training data is received from a remote database or a local database, constructed from various subsets of data, or input by a user. The training data can be used in its raw form for training a machine-learning model or pre-processed into another form, which can then be used for training the machine-learning model. For example, the raw form of the training data can be smoothed, truncated, aggregated, clustered, or otherwise manipulated into another form, which can then be used for training the machine-learning model.

In block 1104, a machine-learning model is trained using the training data. The machine-learning model can be trained in a supervised, unsupervised, or semi-supervised manner. In supervised training, each input in the training data is correlated to a desired output. This desired output may be a scalar, a vector, or a different type of data structure such as text or an image. This may enable the machine-learning model to learn a mapping between the inputs and desired outputs. In unsupervised training, the training data includes inputs, but not desired outputs, so that the machine-learning model has to find structure in the inputs on its own. In semi-supervised training, only some of the inputs in the training data are correlated to desired outputs.

In block 1106, the machine-learning model is evaluated. For example, an evaluation dataset can be obtained, for example, via user input or from a database. The evaluation dataset can include inputs correlated to desired outputs. The inputs can be provided to the machine-learning model and the outputs from the machine-learning model can be compared to the desired outputs. If the outputs from the machine-learning model closely correspond with the desired outputs, the machine-learning model may have a high degree of accuracy. For example, if 90% or more of the outputs from the machine-learning model are the same as the desired outputs in the evaluation dataset, the machine-learning model may have a high degree of accuracy. Otherwise, the machine-learning model may have a low degree of accuracy. The 90% number is an example only. A realistic and desirable accuracy percentage is dependent on the problem and the data.

In some examples, if, at 1108, the machine-learning model has an inadequate degree of accuracy for a particular task, the process can return to block 1104, where the machine-learning model can be further trained using additional training data or otherwise modified to improve accuracy. However, if, at 1108, the machine-learning model has an adequate degree of accuracy for the particular task, the process can continue to block 1110.

In block 1110, new data is received. In some examples, the new data is received from a remote database or a local database, constructed from various subsets of data, or input by a user. The new data may be unknown to the machine-learning model. For example, the machine-learning model may not have previously processed or analyzed the new data.

In block 1112, the trained machine-learning model is used to analyze the new data and provide a result. For example, the new data can be provided as input to the trained machine-learning model. The trained machine-learning model can analyze the new data and provide a result that includes a classification of the new data into a particular class, a clustering of the new data into a particular group, a prediction based on the new data, or any combination of these.

In block 1114, the result is post-processed. For example, the result can be added to, multiplied with, or otherwise combined with other data as part of a job. As another example, the result can be transformed from a first format, such as a time series format, into another format, such as a count series format. Any number and combination of operations can be performed on the result during post-processing.

Figure 12:
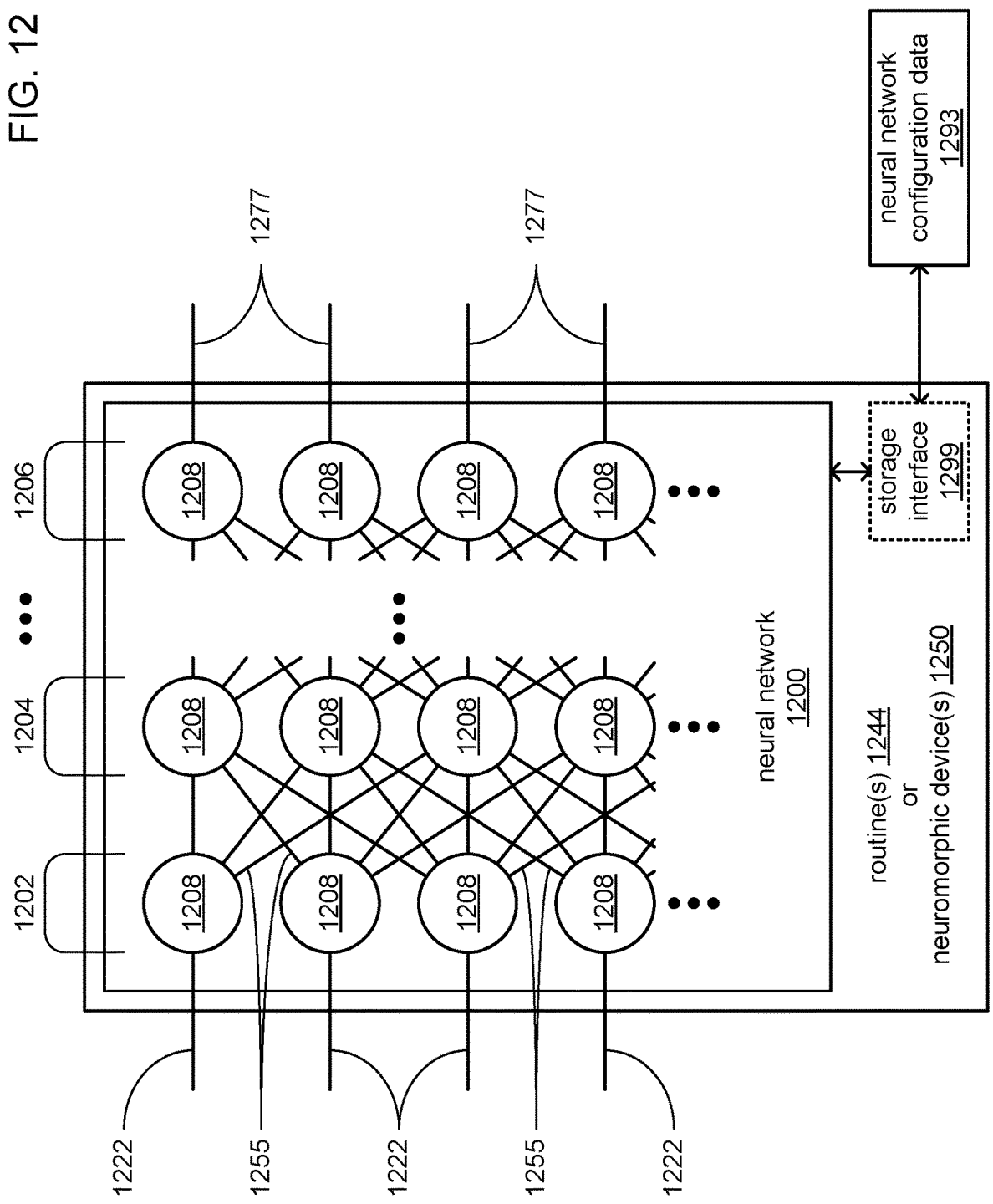
FIG. 12 illustrates an example of a machine-learning model as a neural network, according to some embodiments of the present technology.

A more specific example of a machine-learning model is the neural network 1200 shown in FIG. 12. The neural network 1200 is represented as multiple layers of neurons 1208 that can exchange data between one another via connections 1255 that may be selectively instantiated thereamong. The layers include an input layer 1202 for receiving input data provided at inputs 1222, one or more hidden layers 1204, and an output layer 1206 for providing a result at outputs 1277. The hidden layer(s) 1204 are referred to as hidden because they may not be directly observable or have their inputs or outputs directly accessible during the normal functioning of the neural network 1200. Although the neural network 1200 is shown as having a specific number of layers and neurons for exemplary purposes, the neural network 1200 can have any number and combination of layers, and each layer can have any number and combination of neurons.

The neurons 1208 and connections 1255 thereamong may have numeric weights, which can be tuned during training of the neural network 1200. For example, training data can be provided to at least the inputs 1222 to the input layer 1202 of the neural network 1200, and the neural network 1200 can use the training data to tune one or more numeric weights of the neural network 1200. In some examples, the neural network 1200 can be trained using backpropagation. Backpropagation can include determining a gradient of a particular numeric weight based on a difference between an actual output of the neural network 1200 at the outputs 1277 and a desired output of the neural network 1200. Based on the gradient, one or more numeric weights of the neural network 1200 can be updated to reduce the difference therebetween, thereby increasing the accuracy of the neural network 1200. This process can be repeated multiple times to train the neural network 1200. For example, this process can be repeated hundreds or thousands of times to train the neural network 1200.

In some examples, the neural network 1200 is a feed-forward neural network. In a feed-forward neural network, the connections 1255 are instantiated and/or weighted so that every neuron 1208 only propagates an output value to a subsequent layer of the neural network 1200. For example, data may only move one direction (forward) from one neuron 1208 to the next neuron 1208 in a feed-forward neural network. Such a "forward" direction may be defined as proceeding from the input layer 1202 through the one or more hidden layers 1204, and toward the output layer 1206.

In other examples, the neural network 1200 may be a recurrent neural network. A recurrent neural network can include one or more feedback loops among the connections 1255, thereby allowing data to propagate in both forward and backward through the neural network 1200. Such a "backward" direction may be defined as proceeding in the opposite direction of forward, such as from the output layer 1206 through the one or more hidden layers 1204, and toward the input layer 1202. This can allow for information to persist within the recurrent neural network. For example, a recurrent neural network can determine an output based at least partially on information that the recurrent neural network has seen before, giving the recurrent neural network the ability to use previous input to inform the output.

In some examples, the neural network 1200 operates by receiving a vector of numbers from one layer; transforming the vector of numbers into a new vector of numbers using a matrix of numeric weights, a nonlinearity, or both; and providing the new vector of numbers to a subsequent layer ("subsequent" in the sense of moving "forward") of the neural network 1200. Each subsequent layer of the neural network 1200 can repeat this process until the neural network 1200 outputs a final result at the outputs 1277 of the output layer 1206. For example, the neural network 1200 can receive a vector of numbers at the inputs 1222 of the input layer 1202. The neural network 1200 can multiply the vector of numbers by a matrix of numeric weights to determine a weighted vector. The matrix of numeric weights can be tuned during the training of the neural network 1200. The neural network 1200 can transform the weighted vector using a nonlinearity, such as a sigmoid tangent or the hyperbolic tangent. In some examples, the nonlinearity can include a rectified linear unit, which can be expressed using the equation y=max(x, o) where y is the output and x is an input value from the weighted vector. The transformed output can be supplied to a subsequent layer (e.g., a hidden layer 1204) of the neural network 1200. The subsequent layer of the neural network 1200 can receive the transformed output, multiply the transformed output by a matrix of numeric weights and a nonlinearity, and provide the result to yet another layer of the neural network 1200 (e.g., another, subsequent, hidden layer 1204). This process continues until the neural network 1200 outputs a final result at the outputs 1277 of the output layer 1206.

As also depicted in FIG. 12, the neural network 1200 may be implemented either through the execution of the instructions of one or more routines 1244 by central processing units (CPUs), or through the use of one or more neuromorphic devices 1250 that incorporate a set of memristors (or other similar components) that each function to implement one of the neurons 1208 in hardware. Where multiple neuromorphic devices 1250 are used, they may be interconnected in a depth-wise manner to enable implementing neural networks with greater quantities of layers, and/or in a width-wise manner to enable implementing neural networks having greater quantities of neurons 1208 per layer.

The neuromorphic device 1250 may incorporate a storage interface 1299 by which neural network configuration data 1293 that is descriptive of various parameters and hyper parameters of the neural network 1200 may be stored and/or retrieved. More specifically, the neural network configuration data 1293 may include such parameters as weighting and/or biasing values derived through the training of the neural network 1200, as has been described. Alternatively, or additionally, the neural network configuration data 1293 may include such hyperparameters as the manner in which the neurons 1208 are to be interconnected (e.g., feedforward or recurrent), the trigger function to be implemented within the neurons 1208, the quantity of layers and/or the overall quantity of the neurons 1208. The neural network configuration data 1293 may provide such information for more than one neuromorphic device 1250 where multiple ones have been interconnected to support larger neural networks.

Other examples of the present disclosure may include any number and combination of machine-learning models having any number and combination of characteristics. The machine-learning model(s) can be trained in a supervised, semi-supervised, or unsupervised manner, or any combination of these. The machine-learning model(s) can be implemented using a single computing device or multiple computing devices, such as the communications grid computing system 400 discussed above.

Implementing some examples of the present disclosure at least in part by using machine-learning models can reduce the total number of processing iterations, time, memory, electrical power, or any combination of these consumed by a computing device when analyzing data. For example, a neural network may more readily identify patterns in data than other approaches. This may enable the neural network to analyze the data using fewer processing cycles and less memory than other approaches, while obtaining a similar or greater level of accuracy.

Some machine-learning approaches may be more efficiently and speedily executed and processed with machine-learning specific processors (e.g., not a generic CPU). Such processors may also provide an energy savings when compared to generic CPUs. For example, some of these processors can include a graphical processing unit (GPU), an application-specific integrated circuit (ASIC), a field-programmable gate array (FPGA), an artificial intelligence (AI) accelerator, a neural computing core, a neural computing engine, a neural processing unit, a purpose-built chip architecture for deep learning, and/or some other machine-learning specific processor that implements a machine learning approach or one or more neural networks using semiconductor (e.g., silicon (Si), gallium arsenide (GaAs)) devices. These processors may also be employed in heterogeneous computing architectures with a number of and/or a variety of different types of cores, engines, nodes, and/or layers to achieve various energy efficiencies, processing speed improvements, data communication speed improvements, and/or data efficiency targets and improvements throughout various parts of the system when compared to a homogeneous computing architecture that employs CPUs for general purpose computing.

Figure 13:
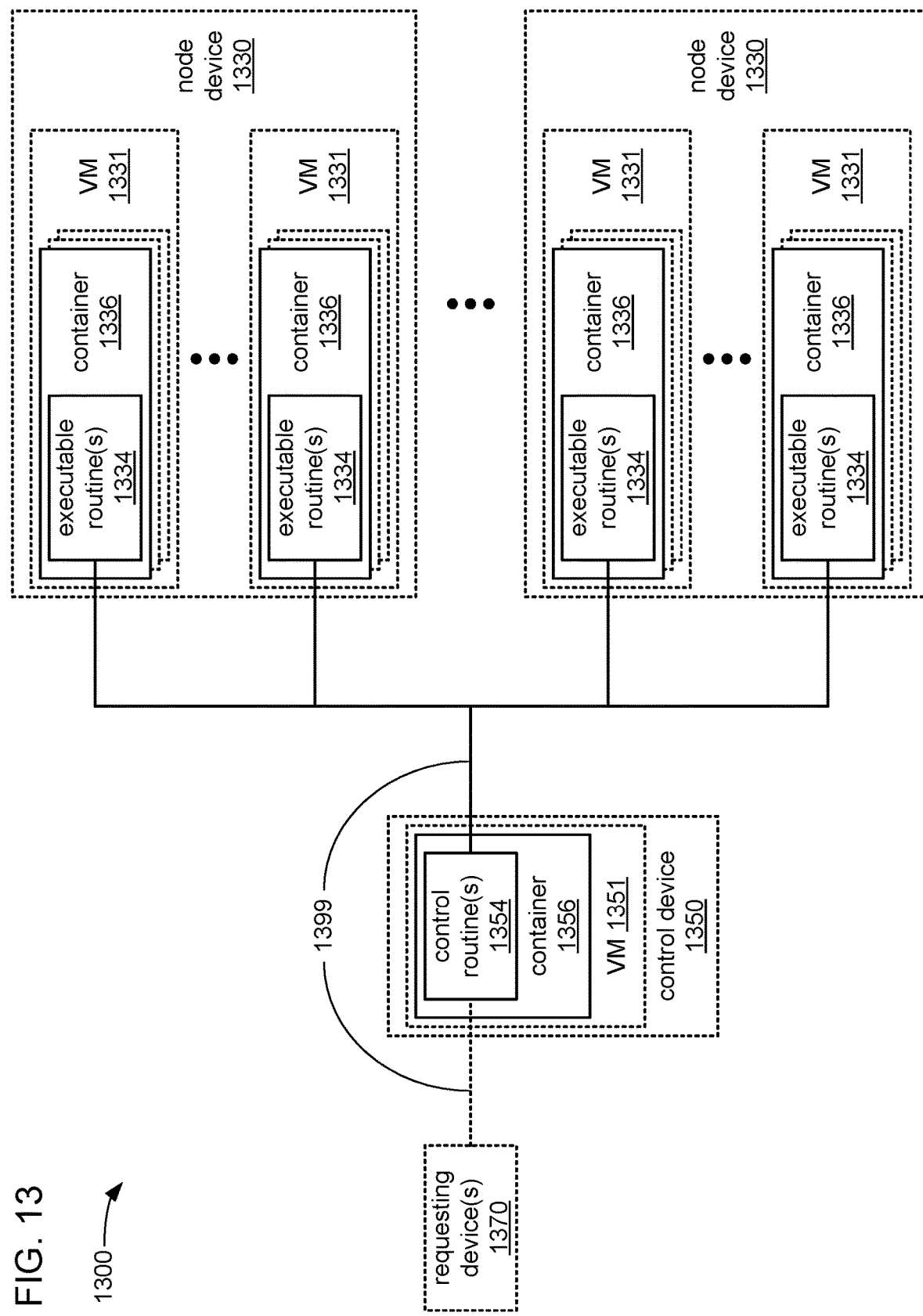
FIG. 13 illustrates various aspects of the use of containers as a mechanism to allocate processing, storage and/or other resources of a processing system to the performance of various analyses, according to some embodiments of the present technology.

FIG. 13 illustrates various aspects of the use of containers 1336 as a mechanism to allocate processing, storage and/or other resources of a processing system 1300 to the performance of various analyses. More specifically, in a processing system 1300 that includes one or more node devices 1330 (e.g., the aforedescribed grid system 400), the processing, storage and/or other resources of each node device 1330 may be allocated through the instantiation and/or maintenance of multiple containers 1336 within the node devices 1330 to support the performance(s) of one or more analyses. As each container 1336 is instantiated, predetermined amounts of processing, storage and/or other resources may be allocated thereto as part of creating an execution environment therein in which one or more executable routines 1334 may be executed to cause the performance of part or all of each analysis that is requested to be performed.

It may be that at least a subset of the containers 1336 are each allocated a similar combination and amounts of resources so that each is of a similar configuration with a similar range of capabilities, and therefore, are interchangeable. This may be done in embodiments in which it is desired to have at least such a subset of the containers 1336 already instantiated prior to the receipt of requests to perform analyses, and thus, prior to the specific resource requirements of each of those analyses being known.

Alternatively, or additionally, it may be that at least a subset of the containers 1336 are not instantiated until after the processing system 1300 receives requests to perform analyses where each request may include indications of the resources required for one of those analyses. Such information concerning resource requirements may then be used to guide the selection of resources and/or the amount of each resource allocated to each such container 1336. As a result, it may be that one or more of the containers 1336 are caused to have somewhat specialized configurations such that there may be differing types of containers to support the performance of different analyses and/or different portions of analyses.

It may be that the entirety of the logic of a requested analysis is implemented within a single executable routine 1334. In such embodiments, it may be that the entirety of that analysis is performed within a single container 1336 as that single executable routine 1334 is executed therein. However, it may be that such a single executable routine 1334, when executed, is at least intended to cause the instantiation of multiple instances of itself that are intended to be executed at least partially in parallel. This may result in the execution of multiple instances of such an executable routine 1334 within a single container 1336 and/or across multiple containers 1336.

Alternatively, or additionally, it may be that the logic of a requested analysis is implemented with multiple differing executable routines 1334. In such embodiments, it may be that at least a subset of such differing executable routines 1334 are executed within a single container 1336. However, it may be that the execution of at least a subset of such differing executable routines 1334 is distributed across multiple containers 1336.

Where an executable routine 1334 of an analysis is under development, and/or is under scrutiny to confirm its functionality, it may be that the container 1336 within which that executable routine 1334 is to be executed is additionally configured assist in limiting and/or monitoring aspects of the functionality of that executable routine 1334. More specifically, the execution environment provided by such a container 1336 may be configured to enforce limitations on accesses that are allowed to be made to memory and/or I/O addresses to control what storage locations and/or I/O devices may be accessible to that executable routine 1334. Such limitations may be derived based on comments within the programming code of the executable routine 1334 and/or other information that describes what functionality the executable routine 1334 is expected to have, including what memory and/or I/O accesses are expected to be made when the executable routine 1334 is executed. Then, when the executable routine 1334 is executed within such a container 1336, the accesses that are attempted to be made by the executable routine 1334 may be monitored to identify any behavior that deviates from what is expected.

Where the possibility exists that different executable routines 1334 may be written in different programming languages, it may be that different subsets of containers 1336 are configured to support different programming languages. In such embodiments, it may be that each executable routine 1334 is analyzed to identify what programming language it is written in, and then what container 1336 is assigned to support the execution of that executable routine 1334 may be at least partially based on the identified programming language. Where the possibility exists that a single requested analysis may be based on the execution of multiple executable routines 1334 that may each be written in a different programming language, it may be that at least a subset of the containers 1336 are configured to support the performance of various data structure and/or data format conversion operations to enable a data object output by one executable routine 1334 written in one programming language to be accepted as an input to another executable routine 1334 written in another programming language.

As depicted, at least a subset of the containers 1336 may be instantiated within one or more VMs 1331 that may be instantiated within one or more node devices 1330. Thus, in some embodiments, it may be that the processing, storage and/or other resources of at least one node device 1330 may be partially allocated through the instantiation of one or more VMs 1331, and then in turn, may be further allocated within at least one VM 1331 through the instantiation of one or more containers 1336.

In some embodiments, it may be that such a nested allocation of resources may be carried out to effect an allocation of resources based on two differing criteria. By way of example, it may be that the instantiation of VMs 1331 is used to allocate the resources of a node device 1330 to multiple users or groups of users in accordance with any of a variety of service agreements by which amounts of processing, storage and/or other resources are paid for each such user or group of users. Then, within each VM 1331 or set of VMs 1331 that is allocated to a particular user or group of users, containers 1336 may be allocated to distribute the resources allocated to each VM 1331 among various analyses that are requested to be performed by that particular user or group of users.

As depicted, where the processing system 1300 includes more than one node device 1330, the processing system 1300 may also include at least one control device 1350 within which one or more control routines 1354 may be executed to control various aspects of the use of the node device(s) 1330 to perform requested analyses. By way of example, it may be that at least one control routine 1354 implements logic to control the allocation of the processing, storage and/or other resources of each node device 1300 to each VM 1331 and/or container 1336 that is instantiated therein. Thus, it may be the control device(s) 1350 that effects a nested allocation of resources, such as the aforedescribed example allocation of resources based on two differing criteria.

As also depicted, the processing system 1300 may also include one or more distinct requesting devices 1370 from which requests to perform analyses may be received by the control device(s) 1350. Thus, and by way of example, it may be that at least one control routine 1354 implements logic to monitor for the receipt of requests from authorized users and/or groups of users for various analyses to be performed using the processing, storage and/or other resources of the node device(s) 1330 of the processing system 1300. The control device(s) 1350 may receive indications of the availability of resources, the status of the performances of analyses that are already underway, and/or still other status information from the node device(s) 1330 in response to polling, at a recurring interval of time, and/or in response to the occurrence of various preselected events. More specifically, the control device(s) 1350 may receive indications of status for each container 1336, each VM 1331 and/or each node device 1330. At least one control routine 1354 may implement logic that may use such information to select container(s) 1336, VM(s) 1331 and/or node device(s) 1330 that are to be used in the execution of the executable routine(s) 1334 associated with each requested analysis.

As further depicted, in some embodiments, the one or more control routines 1354 may be executed within one or more containers 1356 and/or within one or more VMs 1351 that may be instantiated within the one or more control devices 1350. It may be that multiple instances of one or more varieties of control routine 1354 may be executed within separate containers 1356, within separate VMs 1351 and/or within separate control devices 1350 to better enable parallelized control over parallel performances of requested analyses, to provide improved redundancy against failures for such control functions, and/or to separate differing ones of the control routines 1354 that perform different functions. By way of example, it may be that multiple instances of a first variety of control routine 1354 that communicate with the requesting device(s) 1370 are executed in a first set of containers 1356 instantiated within a first VM 1351, while multiple instances of a second variety of control routine 1354 that control the allocation of resources of the node device(s) 1330 are executed in a second set of containers 1356 instantiated within a second VM 1351. It may be that the control of the allocation of resources for performing requested analyses may include deriving an order of performance of portions of each requested analysis based on such factors as data dependencies thereamong, as well as allocating the use of containers 1336 in a manner that effectuates such a derived order of performance.

Where multiple instances of control routine 1354 are used to control the allocation of resources for performing requested analyses, such as the assignment of individual ones of the containers 1336 to be used in executing executable routines 1334 of each of multiple requested analyses, it may be that each requested analysis is assigned to be controlled by just one of the instances of control routine 1354. This may be done as part of treating each requested analysis as one or more "ACID transactions" that each have the four properties of atomicity, consistency, isolation and durability such that a single instance of control routine 1354 is given full control over the entirety of each such transaction to better ensure that either all of each such transaction is either entirely performed or is entirely not performed. As will be familiar to those skilled in the art, allowing partial performances to occur may cause cache incoherencies and/or data corruption issues.

As additionally depicted, the control device(s) 1350 may communicate with the requesting device(s) 1370 and with the node device(s) 1330 through portions of a network 1399 extending thereamong. Again, such a network as the depicted network 1399 may be based on any of a variety of wired and/or wireless technologies, and may employ any of a variety of protocols by which commands, status, data and/or still other varieties of information may be exchanged. It may be that one or more instances of a control routine 1354 cause the instantiation and maintenance of a web portal or other variety of portal that is based on any of a variety of communication protocols, etc. (e.g., a restful API). Through such a portal, requests for the performance of various analyses may be received from requesting device(s) 1370, and/or the results of such requested analyses may be provided thereto. Alternatively, or additionally, it may be that one or more instances of a control routine 1354 cause the instantiation of and maintenance of a message passing interface and/or message queues. Through such an interface and/or queues, individual containers 1336 may each be assigned to execute at least one executable routine 1334 associated with a requested analysis to cause the performance of at least a portion of that analysis.

Although not specifically depicted, it may be that at least one control routine 1354 may include logic to implement a form of management of the containers 1336 based on the Kubernetes container management platform promulgated by Could Native Computing Foundation of San Francisco, CA, USA. In such embodiments, containers 1336 in which executable routines 1334 of requested analyses may be instantiated within "pods" (not specifically shown) in which other containers may also be instantiated for the execution of other supporting routines. Such supporting routines may cooperate with control routine(s) 1354 to implement a communications protocol with the control device(s) 1350 via the network 1399 (e.g., a message passing interface, one or more message queues, etc.). Alternatively, or additionally, such supporting routines may serve to provide access to one or more storage repositories (not specifically shown) in which at least data objects may be stored for use in performing the requested analyses.

Associated Processes

FIG. 14 illustrates one embodiment of method 1400 training a model in a distributed computing environment. It shall be appreciated that other examples contemplated within the scope of the present disclosure may involve more operations, fewer operations, different operations, or a different order of operations than depicted in FIG. 14.

As shown in FIG. 14, in some embodiments, method 1400 may include process 1410. At process 1410, method 1400 receives an input comprising a plurality of pre-defined factor matrices and an implicit feedback dataset partitioned into a plurality of implicit feedback data subsets. Various non-limiting embodiments of process 1410 will now be described with reference to FIG. 15.

Figure 15:
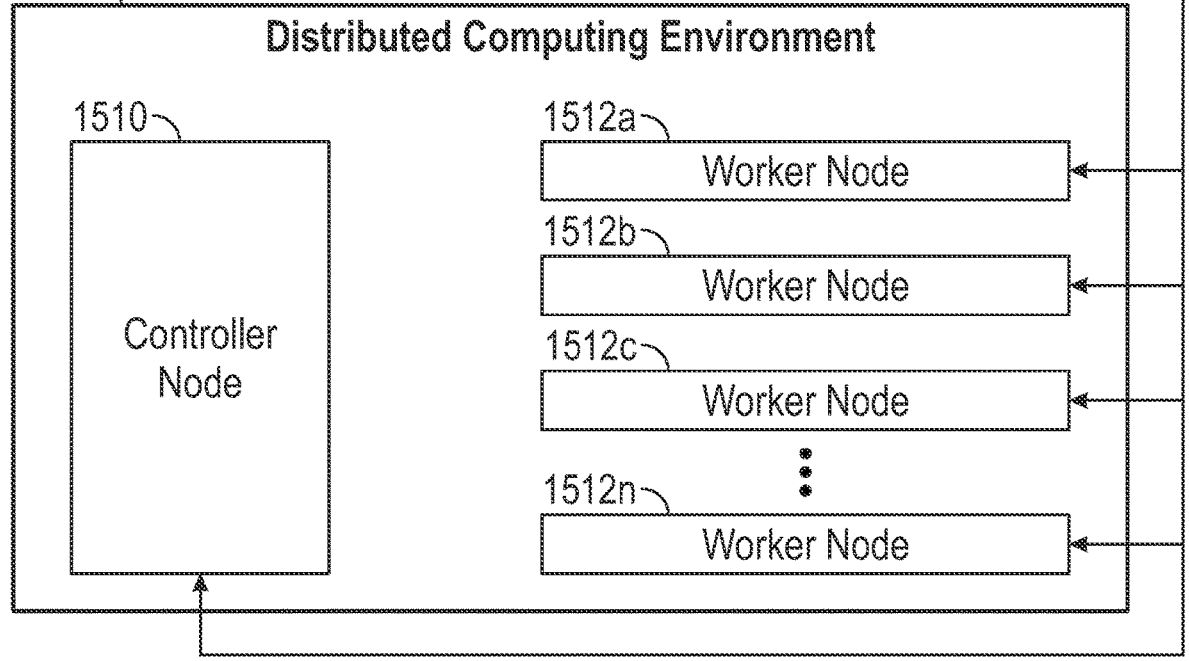
FIG. 15 illustrates an example of distributing model input across a controller node and a plurality of worker nodes, according to some embodiments of the present technology.

In the example of FIG. 15, process 1410 receives an input 1502 that includes a plurality of pre-defined factor matrices 1504 and an implicit feedback dataset 1506. Specifically, in FIG. 15, the plurality of pre-defined factor matrices 1504 include a pre-defined user factors matrix 1504a and a pre-defined item factors matrix 1504b. The pre-defined user factors matrix 1504a, as generally used herein, may refer to a matrix that stores attributes of one or more users, such as demographic data, user preference data, and/or the like. Conversely, in some embodiments, the pre-defined item factors matrix 1504b may refer to a matrix that stores attributes of one or more items, such as product specification data, pricing data, user rating data, item category data, item tag data, historical sales data, and/or the like.

In some embodiments, implicit feedback dataset 1506 may comprise a plurality of user-item interaction tuples. A user-item interaction tuple, as generally used herein, may refer to an association between a respective user and a respective item that such user has interacted with in some manner, such as by viewing, clicking, purchasing, or otherwise engaging with such item. It shall be noted that, in some embodiments, implicit feedback dataset 1506 may not include all possible user-item interaction tuples for a plurality of users and a plurality of items. Rather, implicit feedback dataset 1506 may (e.g., only) include user-item interaction tuples that specifically represent instances where a respective user has interacted with a respective item.

For instance, in a non-limiting example, implicit feedback dataset 1506 may include a plurality of user-item interaction tuples, including a user-item interaction tuple corresponding to User A and Item X, a user-item interaction tuple corresponding to User B and Item Y, and a user-item interaction tuple corresponding to User C and Item Z (among others). However, in some embodiments, implicit feedback dataset 1506 may not include a user-item interaction tuple corresponding to User A and Item Y if User A has not interacted with Item Y. Similarly, if User C has not interacted with Item X, implicit feedback dataset 1506 may not include a user-item interaction tuple corresponding to User C and Item X.

Furthermore, in some embodiments, one or more user-item interaction tuples in implicit feedback dataset 1506 may include an interaction weight. The interaction weight, as generally used herein, may indicate a confidence or strength of a respective user-item interaction tuple. For instance, in a non-limiting example, implicit feedback dataset 1506 may include, among others, a first user-item tuple corresponding to User A and Item X and a second user-item tuple corresponding to User B and Item Y. Thus, in such an example, the first user-item interaction tuple may include an interaction weight that quantifies a strength of the interaction between User A and Item X (e.g., {User A, Item X, Weight}). Similarly, the second user-item interaction tuple may include an interaction weight that quantifies a strength of the interaction between User B and Item Y (e.g., {User B, Item Y, Weight}).

In some embodiments, implicit feedback dataset 1506 may be partitioned into a plurality of implicit feedback data subsets. For instance, as also shown in FIG. 15, implicit feedback dataset 1506 is partitioned into a plurality of implicit feedback data subsets 1506a-1506n. Implicit feedback data subsets 1506a-1506n, in some embodiments, may each include a respective set of user-item interaction tuples. Additionally, in some embodiments, implicit feedback data subsets 1506a-1506n may be disjoint subsets (e.g., mutually exclusive subsets). Disjoint subsets, as generally used herein, may refer to subsets that do not have overlapping elements. For instance, in a non-limiting example, implicit feedback data subset 1506a may include a first set of user-item interaction tuples and implicit feedback data subset 1506b may include a second set of user-item interaction tuples. Accordingly, in such embodiments, implicit feedback data subset 1506a and implicit feedback data subset 1506b may be disjoint subsets if there is no user-item interaction tuple that appears in both subset 1506a and subset 1506b.

Referring to FIG. 14, in some embodiments, method 1400 may include process 1420. At process 1420, method 1400 distributes the input across a controller node and a plurality of worker nodes implemented in a distributed computing environment. Various non-limiting embodiments of process 1420 will now be described with reference to FIG. 15.

In the example of FIG. 15, process 1420 distributes input 1502 at distributed computing environment 1508. As illustrated in FIG. 15, distributed computing environment 1508 includes a controller node 1510 and a plurality of worker nodes 1512a-1512n. Process 1420, in some embodiments, may distribute a copy of pre-defined user factors matrix 1504a to one or more computing nodes in distributed computing environment 1508. For instance, in the example of FIG. 15, process 1420 distributes a copy of pre-defined user factors matrix 1504a to controller node 1510 and to each of the plurality of worker nodes 1512a-1512n. Additionally, in some embodiments, process 1420 may distribute a copy of pre-defined user factors matrix 1504b to one or more computing nodes in distributed computing environment 1508. For instance, as also shown in FIG. 15, process 1420 distributes a copy of pre-defined item factors matrix 1504b to controller node 1510 and to each of the plurality of worker nodes 1512a-1512n.

Furthermore, in some embodiments, process 1420 may distribute each implicit feedback data subset 1506a-1506n to a respective worker node in distributed computing environment 1508. For instance, in the example of FIG. 15, process 1420 distributes implicit feedback dataset 1506a to worker node 1512a, implicit feedback dataset 1506b to worker node 1512b, implicit feedback dataset 1506c to worker node 1512c, and implicit feedback dataset 1506n to worker node 1512n.

Referring to FIG. 14, in some embodiments, method 1400 may include process 1430. At process 1430, method 1400 trains a model using the controller node and the plurality of worker nodes. Training a model, as generally used herein, may refer to training or computing a controller-specific user parameters matrix and a controller specific item parameters matrix. Once trained, the model (also referred to as a "matrix factorization model" or "recommender model") may utilize such matrices to recommend one or more items of the plurality of items to a user. Various non-limiting examples of process 1430 will now be described with reference to FIGS. 16-18B.

Figure 16:
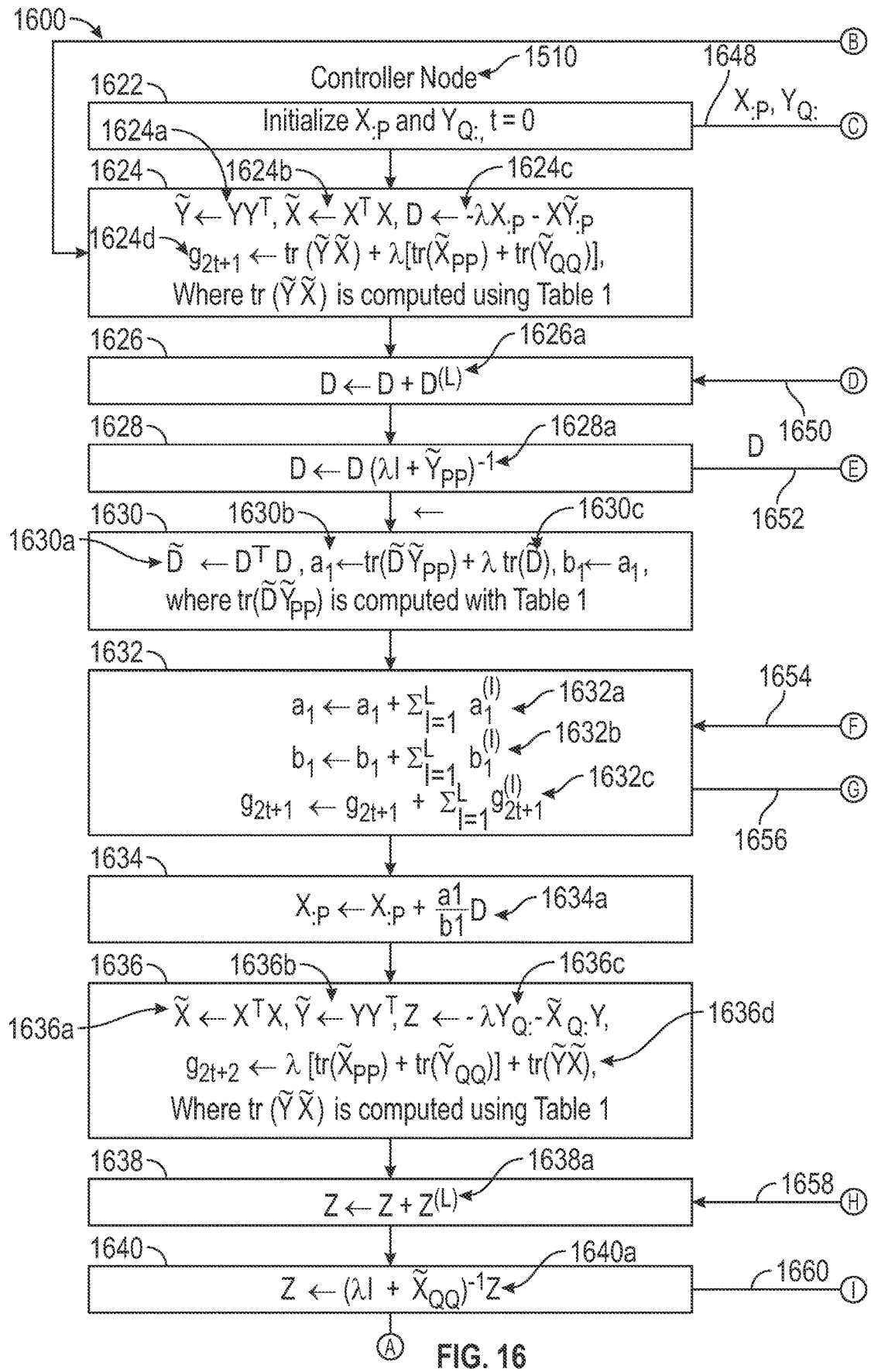
FIG. 16 illustrates an example schematic of a multithread distributed data translation with optimal step-size (DTOS) algorithm, according to some embodiments of the present technology.
Figure 16:
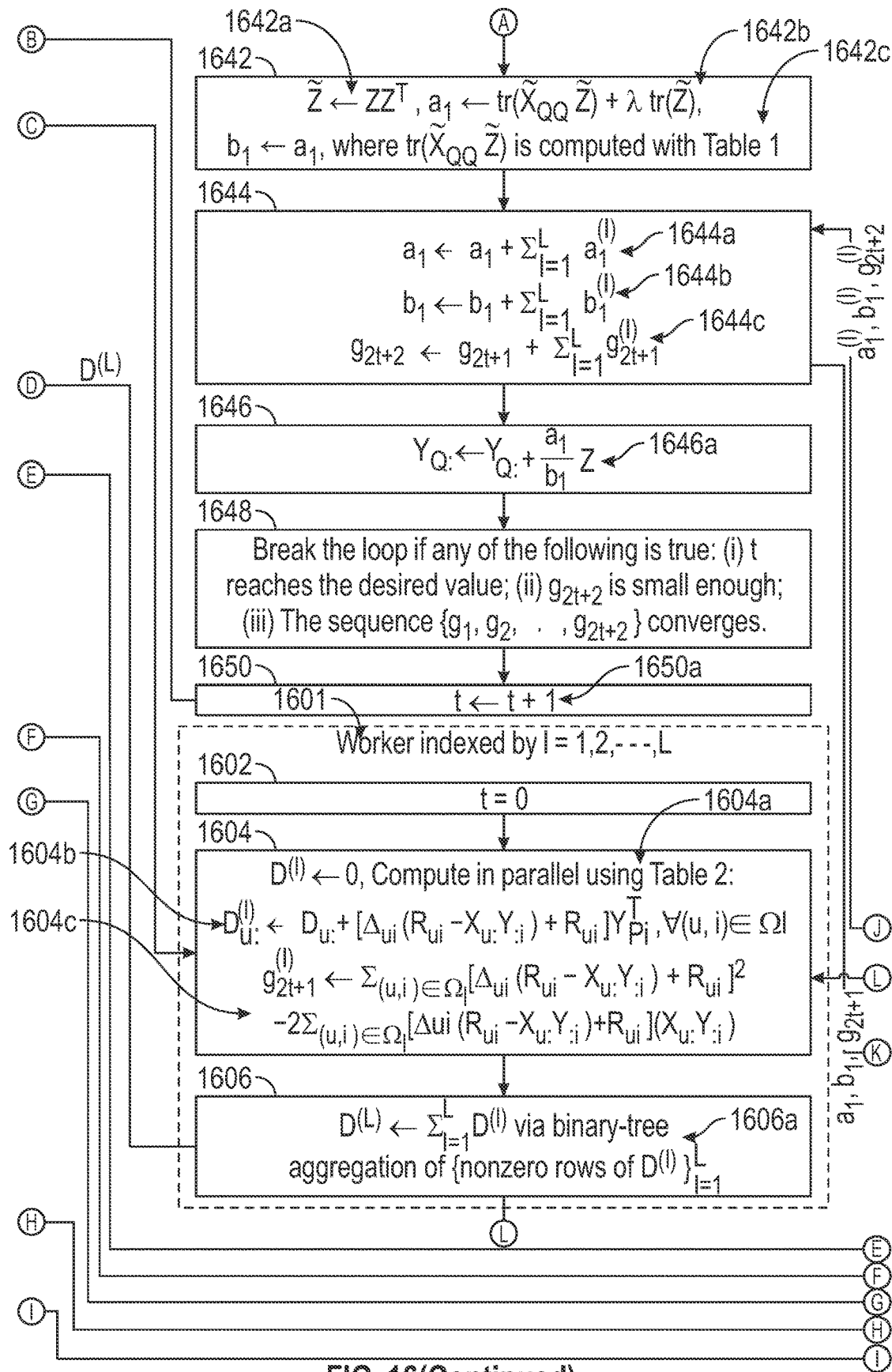
Figure 16:
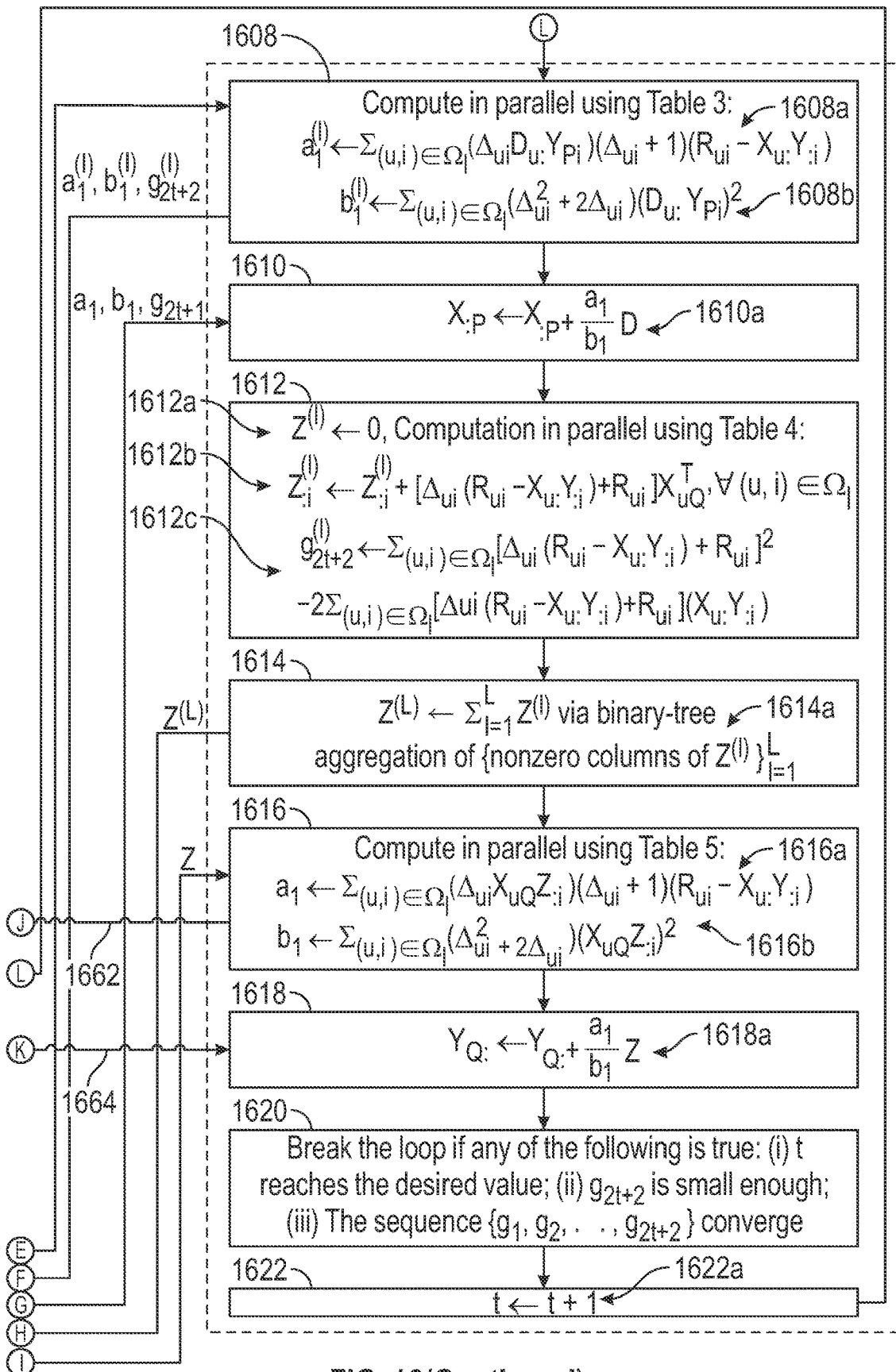

In some embodiments, as illustrated in FIG. 16, process 1430 may train a model using multithread distributed data translation with optimal step-size (DTOS) algorithm 1600. As will be described in more detail herein, multithread distributed DTOS algorithm 1600 offers numerous technical advantages-a subset of which will now be described. Firstly, multithread distributed DTOS algorithm 1600 overcomes the computational bottlenecks associated with the Alternating Weighted Least Squares (AWLS) algorithm. Specifically, and contrary to multithread DTOS algorithm 1600, the AWLS algorithm requires the inversion of a separate matrix for every user and item, and further requires each factor matrix to be updated in a column-wise fashion, which is inefficient for distributed computation when the dataset is not partitioned in such a way that each user or item has its data centralized in a single machine. Secondly, multithread distributed DTOS algorithm 1600 supports arbitrary partitioning of training data (e.g., any user or item can have its data distributed across multiple machines). Thirdly, multithread distributed DTOS algorithm 1600 performs exact computation, with no approximation resulting from the multithread distributed computation.

It shall be noted that the design of multithread distributed DTOS algorithm 1600 is not merely a trivial extension of existing algorithms to a distributed computing environment. Instead, as described herein, multithread distributed DTOS algorithm 1600 may compute model updates via a controller node and a plurality of worker nodes exchanging messages over multiple time periods. For instance, in some embodiments, a respective worker node may be allocated a specific implicit feedback data subset. Based on the specific subset of data, the respective worker node may perform computations to update a portion of the model parameters relevant to its data subset. The respective worker node may then communicate its computed updates back to the controller node. In turn, the controller node may be responsible for aggregating parameter updates from all worker nodes to form a comprehensive update to the global model parameters. Once the global model is updated, the controller node may then broadcast the updated global model parameters back to the worker nodes, and the process may repeat until a training termination condition is satisfied.

In some embodiments, multithread distributed DTOS algorithm 1600 may include different types of training computations. For instance, in a non-limiting example, multithread distributed DTOS algorithm 1600 may perform a first type of training computations and a second type of training computations. The first type of training computations, as described in more detail herein, may require a user-to-item feedback matrix and a user-item interaction weight matrix (e.g., blocks 1604-1618). Conversely, as also described in more detail herein, the second type of training computations may not require either the user-to-item feedback matrix or the user-item interaction weight matrix (e.g., blocks 1624-1646).

In some embodiments, as illustrated in FIG. 16, controller node 1510 may perform the second type of training computations (e.g., blocks 1624-1646) and, additionally, the computations related to blocks 1622, 1648, and 1650. Conversely, in some embodiments, worker nodes 1512a-1512d may each perform the first type of training computations (e.g., blocks 1604-1618) and, additionally, the computations related to blocks 1602, 1620, and 1622. It shall be noted that, in some embodiments, the execution of blocks 1622-1650 (or a subset of blocks 1622-1650) may be referred to as executing an "aggregation model training algorithm." It shall also be noted that, in some embodiments, the execution of blocks 1602-1622 (or a subset of blocks 1602-1622) may be referred to as executing a "localized model training algorithm."

In some embodiments, as illustrated in FIG. 16, blocks 1602-1622 may be executed by a plurality of worker nodes indexed by l, for l=1 (e.g., 1512a), 2 (e.g., 1512b), . . . , L (e.g., 1512n). Each of the plurality of workers nodes 1512a-1512n may perform identical training computations as outlined in blocks 1602-1622. However, the implicit feedback data subset on which blocks 1602-1622 are performed may vary. For instance, as previously described, in FIG. 15, process 1420 distributes implicit feedback data subsets 1506a-1506n to worker nodes 1512a-1512n, respectively. Thus, in such an example, worker node 1512a (e.g., l=1) may perform blocks 1602-1622 based on implicit feedback data subset 1506a. Conversely, worker node 1512b (e.g., l=2) may perform blocks 1602-1622 based on implicit feedback data subset 1506b. Worker node 1512c (e.g., l=3) may perform blocks 1602-1622 based on implicit feedback data subset 1506c. Lastly, worker node 1512n (e.g., l=4) may perform blocks 1602-1622 based on implicit feedback data subset 1506n.

As shown in FIG. 16, worker node 1601 with index 1 (hereafter referred to as worker node (1601) may perform block 1602. At block 1602, worker node 1 1601 may initialize a worker-specific iteration number t to zero (0). Worker node 1 1601, in some embodiments, may execute block 1602 while controller node 1510 executes block 1622. At block 1622, controller node 1510 may initialize a controller-specific user parameters matrix $X_{:\mathbb{P}}$ and a controller-specific item parameters matrix $Y_{\mathbb{Q}:}$. Additionally, at block 1622, controller node 1510 may initialize a controller-specific iteration number t to zero (0). It shall be noted that, in some embodiments, process 1432 illustrated in FIG. 14 may include one or more of the above-described operations.

After initializing controller-specific user parameters matrix $X_{:\mathbb{P}}$ and controller-specific item parameters matrix $Y_{\mathbb{Q}:}$ at block 1622, controller node 1510 may broadcast message 1649 to worker node 1 1601. Message 1649, as illustrated in FIG. 16, may include controller-specific user parameters matrix $X_{:\mathbb{P}}$ and controller-specific item parameters matrix $Y_{\mathbb{Q}:}$ (e.g., global model parameters). Additionally, as illustrated in FIG. 16, worker node 1 1601 may receive message 1649 at block 1604. At block 1604, worker node 1 1601 may initialize worker-specific direction matrix $D^{(l)}$ using training computation 1604a. Specifically, as illustrated in FIG. 16, training computation 1604a uses $D^{(l)} \leftarrow 0$ to initialize worker-specific direction matrix $D^{(l)}$. It shall be noted that, in some embodiments, process 1434 illustrated in FIG. 14 may include one or more of the above-described operations.

Furthermore, as also illustrated in FIG. 16, at block 1604, worker node 1 1601 may compute updates to worker-specific direction matrix $D^{(l)}$ and updates to, worker-specific objective function $g_{2t+1}^{(l)}$ in parallel using training computations 1604b and 1604c, respectively. Specifically, training computation 1604b uses $D_{u:}^{(l)} \leftarrow D_{u:} + [\Delta_{ui}(R_{ui} - X_{u:}Y_{:i}) + R_{ui}]Y_{\mathbb{P}i}^T$, $\forall (u,i) \in \Omega_l$ to update worker-specific direction matrix $D^{(l)}$. The notation $\Omega_l$, as generally used herein, may correspond to the implicit feedback data subset allocated to worker node 1 1601. For instance, in a non-limiting example, $\Omega_l$ may correspond to implicit feedback data subset 1506a when worker node 1 1601 corresponds to worker node 1512a. The notation (u,i), as generally used herein, may correspond to a respective user-item interaction tuple in implicit feedback data subset $\Omega_l$. The notation $D_{u:}$, as generally used herein, may correspond to a row in worker-specific direction matrix $D^{(l)}$ that corresponds to user u of user-item interaction tuple (u,i).

Furthermore, the notation $\Delta_{ui}$, as generally used herein, may correspond to a weight associated with user u and item i of user-item interaction tuple (u,i). The notation $R_{ui}$, as generally used herein, may correspond to a response of user u to item i. The notation $X_{u:}$, as generally used herein, may correspond to a row in controller-specific user parameters matrix X that corresponds to user u, where X includes both $X_{:\mathbb{P}}$ and $X_{:\overline{\mathbb{P}}}$. The notation $Y_{:i}$, as generally used herein, may correspond to a column in controller-specific item parameters matrix Y that corresponds to item i, where Y includes $Y_{\mathbb{Q}:}$ and $Y_{\overline{\mathbb{Q}}:}$. Lastly, the notation $Y_{\mathbb{P}i}^T$, as generally used herein, may correspond to a transpose of a column in controller-specific item parameters matrix $Y_{\mathbb{Q}:}$ that corresponds to item i. It shall be noted that terms that are common across different training computations described herein may not be repeated in each instance to maintain brevity and avoid redundancy.

Additionally, as illustrated in FIG. 16, training computation 1604c uses $g_{2t+1}^{(l)} \leftarrow \Sigma_{(u,i) \in \Omega_l} [\Delta_{ui}(R_{ui} - X_{u:}Y_{:i}) + R_{ui}]^2 - 2\Sigma_{(u,i) \in \Omega_l} [\Delta_{ui}(R_{ui} - X_{u:}Y_{:i}) + R_{ui}](X_{u:}Y_{:i})$ to compute worker-specific objective function $g_{2t+1}^{(l)}$. The notation t, as generally used herein, may correspond to the current value of controller-specific iteration number t. Worker node 1 1601, in some embodiments, may concurrently perform computations 1604b and 1604c via algorithm 1704 illustrated in FIG. 17B. As shown in FIG. 17B, worker node 1 1601 may provide input 1704a to algorithm 1704. Input 1704a, in some embodiments, may include implicit feedback data subset $\Omega_l$, user parameters matrix X, item parameters matrix Y, and worker-specific direction matrix D. Input 1704a, in some embodiments, may also presume that worker node 1 1601 includes H threads indexed by 1, 2, . . . , H and that user parameters matrix X includes m user rows. Additionally, as illustrated in FIG. 17B, algorithm 1704 may produce an output 1704b that includes partially computed worker-specific direction matrix D, partially computed partially computed worker-specific objective function $g_{2t+1}$, and intermediate variables $\{e_{ui}\}$.

As shown in FIG. 17B, for any respective h∈{1, 2, . . . , H}, algorithm 1704 may include steps 1704c-1704m. At step 1704c, algorithm 1704 may assign a loop variable u to a current thread index h and initialize local accumulator $g_{2t+1}^{(h)}$ to zero. At step 1704d, algorithm 1704 may determine if loop variable u exceeds the number of users rows m in user parameters matrix X. If algorithm 1704 determines, at step 1704*d*, that loop variable u does exceed the number of users rows m, algorithm 1704 may terminate. Conversely, if algorithm 1704 determines, at step 1704*d*, that loop variable u does not exceed the number of users rows m, algorithm 1704 may proceed to step 1704*e*. At step 1704*e*, for each item i that has an interaction with user u in implicit feedback data subset $\Omega_l$, algorithm 1704 may perform steps 1704*f*-1704*i*. At step 1704*f*, algorithm 1704 computes intermediate variable $e_{ui}$ using $e_{ui} \leftarrow R_{ui} - X_{u:} Y_{:i}$. At step 1704*g*, algorithm 1704 may compute an adjusted intermediate variable $\epsilon_{ui}$ using $\epsilon_{ui} \leftarrow \Delta_{ui} e_{ui} + R_{ui}$. At step 1704*h*, algorithm 1704 updates $D_{u:}$ (e.g., a row in worker-specific direction matrix D corresponding to variable u). Specifically, in step 1704*h*, algorithm 1704 updates $D_{u:}$ using $D_{u:} \leftarrow D_{u:} + \epsilon_{ui} Y_{\mathbb{P}i}^T$.

Furthermore, as shown in FIG. 17B, at step 1704*i* local accumulator $g_{2t+1}^{(h)}$ is updated using $g_{2t+1}^{(h)} \leftarrow g_{2t+1}^{(h)} + \epsilon_{ui}^2 \epsilon_{ui}(X_{u:} Y_{:i})$. At step 1704*j*, algorithm 1704 updates loop variable u using u←u+H. Specifically, step 1704*j* increments loop variable u by the total number of threads H. At step 1704*k*, algorithm 1704 returns to step 1704*d* to determine if the new value of loop variable u is greater than the number of user rows m in user parameters matrix X. If a negative determination is made at step 1704*d*, algorithm 1704 may perform steps 1704*e*-1704*k* until such criteria is satisfied. Conversely, if a positive determination is made at step 1704*d*, algorithm 1704 may proceed to step 17041. At step 17041, global accumulator $g_{2t+1}$ is initialized using $g_{2t+1} \leftarrow 0$. At step 1704*m*, algorithm 1704 updates global accumulator $g_{2t+1}$. Specifically, at step 1704*m*, sums all local accumulators $g_{2t+1}^{(h)}$ for h=1, 2, . . . , H using $g_{2t+1} \leftarrow g_{2t+1} + g_{2t+1}^{(h)}$.

Referring to FIG. 16, after performing block 1604, worker node 1 1601 may proceed to block 1606. At block 1606, worker node 1 1601 may execute training computation 1606*a*. As illustrated in FIG. 16, training computation 1606*a* may compute global worker-specific direction matrix $D^{(L)}$ using a tree-based aggregation method (e.g., a binary-tree aggregation method). The tree-based aggregation method, as generally used herein, may aggregate non-zero rows in (e.g., a portion of) the worker-specific direction matrices computed via the plurality of worker nodes 1512*a*-1512*n* (represented as $\{\text{nonzero rows of } D^{(l)}\}_{l=1}^L$ in FIG. 16).

In some embodiments, after computing global worker-specific direction matrix $D^{(L)}$ at block 1606, a respective worker node L (e.g., worker node (1601) may send message 1651 to controller node 1510. Message 1651, as illustrated in FIG. 16, may include worker-specific direction matrix $D^{(L)}$ (e.g., a worker-specific model parameter). Additionally, as illustrated in FIG. 16, controller node 1510 may receive message 1651 at block 1626. In some embodiments, controller node 1510 may execute block 1626 after block 1624, which will now be described.

In some embodiments, controller node 1510 may execute block 1624 while respective worker node 1 1601 executes block 1604. At block 1624, controller node 1510 may include training computations 1624*a*-1624*d*. Training computation 1624*a*, in some embodiments, may compute an item covariance matrix $\tilde{Y}$ using $\tilde{Y} + YY^T$. The notation Y, as generally used herein, may correspond to controller-specific item factor matrix Y. The notation $Y^T$, as generally used herein, may correspond to a transpose of Y. Conversely, training computation 1624*b* may compute user covariance matrix $\tilde{X}$ using $\tilde{X} \leftarrow XX^T$. The notation X, as generally used herein, may correspond to controller-specific user factor matrix X. The notation $X^T$, as generally used herein, may correspond to a transpose of X.

It shall also be noted that, in some embodiments, X and Y may be computed using $$X = [X_{:\mathbb{F}_1}, X_{:\mathbb{F}_2}, X_{:\mathbb{F}_3}]$$

and $$Y = \begin{bmatrix} Y_{\mathbb{F}_1:} \\ Y_{\mathbb{F}_2:} \\ Y_{\mathbb{F}_3:} \end{bmatrix},$$

respectively. The notation $Y_{\mathbb{F}_1:}$, as generally used herein, may correspond to linear regression coefficients for $X_{:\mathbb{F}_1}$. The notation $X_{:\mathbb{F}_1}$, as generally used herein, may correspond to pre-defined factors (PDF) of users. The notation $Y_{\mathbb{F}_2:}$, as generally used herein, may correspond to latent factors of items (also referred to as "latent item factors"). The notation $X_{:\mathbb{F}_2}$, as generally used herein, may correspond to latent factors of users (also referred to as "latent user factors"). The notation $Y_{\mathbb{F}_3:}$, as generally used herein, may correspond to pre-defined factors of items. Lastly, the notation $X_{:\mathbb{F}_3}$, as generally used herein, may correspond to linear regression coefficients for $Y_{\mathbb{F}_3:}$.

Additionally, it shall also be noted that the notation $\mathbb{P}$, as generally used herein may be represented as $\mathbb{P} = \mathbb{F}_2 \cup \mathbb{F}_3$. The notation $\mathbb{Q}$, as generally used herein, may be represented as $\mathbb{Q} = \mathbb{F} \cup \mathbb{F}_2$. Lastly, the notations $X_{:\mathbb{P}}$ and $Y_{\mathbb{Q}:}$, as generally used herein, may correspond to a user parameter matrix and an item parameter matrix, respectively.

Furthermore, training computation 1624*c*, in some embodiments, may compute controller-specific global direction matrix D using $D \leftarrow -\lambda X_{:\mathbb{P}} - X \tilde{Y}_{:\mathbb{P}}$. The notation $\lambda$, as generally used herein, may correspond to a pre-determined regularization parameter. The notation $\tilde{Y}_{:\mathbb{P}}$, as generally used herein, may refer to a sub-matrix of $\tilde{Y}$ indexed by the set of elements in $\mathbb{P}$. Lastly, training computation 1624*d*, in some embodiments, may compute controller-specific global objective function $g_{2t+1}$ using $g_{2t+1} \leftarrow \text{tr}(\tilde{Y}\tilde{X}) + \lambda[\text{tr}(\tilde{X}_{\mathbb{P}\mathbb{P}}) + \text{tr}(\tilde{Y}_{\mathbb{Q}\mathbb{Q}})]$. The notation $\text{tr}(\tilde{Y}\tilde{X})$, as generally used herein, may refer to a trace of a matrix product between item covariance matrix $\tilde{Y}$ and user covariance matrix $\tilde{X}$. The notation $\text{tr}(\tilde{X}_{\mathbb{P}\mathbb{P}})$, as generally used herein, may refer to a submatrix of user covariance matrix $\tilde{X}$ indexed by $\mathcal{P}$ rows and $\mathcal{P}$ columns. Lastly, the notation $\text{tr}(\tilde{Y}_{\mathbb{Q}\mathbb{Q}})$, as generally used herein, may refer to a submatrix of item covariance matrix $\tilde{Y}$ indexed by $\mathbb{Q}$ rows and $\mathbb{Q}$ columns.

In some embodiments, controller node 1510 may compute $\text{tr}(\tilde{Y}\tilde{X})$ using algorithm 1702 illustrated in FIG. 17A. As illustrated in FIG. 17A, algorithm 1702 may receive input 1702*a*. Input 1702*a* may include a first matrix A (e.g., $\tilde{Y}$) and a second matrix B (e.g., $\tilde{X}$) that each have a same number of rows and a same number of columns (as indicated by the notation A, B $\in \mathbb{R}^{k \times k}$ in FIG. 17A). Input 1702*a* may also presume that worker node 1 1601 includes H threads indexed by 1, 2, . . . , H. Additionally, as illustrated in FIG. 17A, algorithm 1702 may produce an output 1702*b* that includes the trace of matrix product c=tr(AB).

As shown in FIG. 17A, algorithm 1702 may perform steps 1702*a*-1702*g* for any h∈{1, 2, . . . , H}. At step 1702*a*, algorithm 1702 may assign a loop index variable j to a respective thread h. At step 1702b, algorithm 1702 may determine if loop index variable j is greater than k (e.g., the size of the matrices A and B). If step 1702b determines that loop index variable j is greater than k, algorithm 1702 may terminate. Conversely, if step 1702b determines that loop index variable j is less than k, algorithm 1702 may proceed to step 1702c. At step 1702c, algorithm 1702 computes partial sum $c^{(h)}$ using $c^{(h)} \leftarrow A_j B_j$. After step 1702c, algorithm 1702 proceeds to step 1702d. At step 1702d, algorithm 1702 updates loop index variable j using j←j+H.

Furthermore, after step 1702d, algorithm 1702 may proceed to step 1702e. At step 1702e, algorithm 1702 returns to step 1702b to determine if the new value of loop index variable j is greater than k (e.g., the size of the matrices A and B). If a negative determination is made at step 1702b, algorithm 1702 may perform steps 1704c-1704e until such criteria is satisfied. Conversely, if a positive determination is made at step 1702b, algorithm 1702 may proceed to step 1702f. At step 1702f, global accumulator variable c is initialized using c←0. After step 1702f, algorithm 1702 may proceed to step 1702g that updates global accumulator variable c. Specifically, at step 1702g, algorithm 1702 aggregates partial sum $c^{(h)}$ for h=1, 2, . . . , H using $c \leftarrow c+c^{(h)}$.

Referring to FIG. 16, after performing block 1624, controller node 1510 may proceed to block 1626. As described previously above, block 1626 may receive global worker-specific direction matrix $D^{(L)}$. Additionally, as illustrated in FIG. 16, block 1626 may include training computation 1626a. Training computation 1626a may update controller-specific global direction matrix D using $D \leftarrow D+D^{(L)}$. After block 1626, controller node 1510 may proceed to block 1628. At block 1628, controller node 1510 may perform training computation 1628a. Specifically, as illustrated in FIG. 16, training computation 1628a may further update global direction matrix D using $D \leftarrow D(\lambda I + \widetilde{Y}_{\mathbb{PP}})^{-1}$. The notation I, as generally used herein, may refer to an identity matrix with a size equivalent to $\widetilde{Y}_{\mathbb{PP}}$. The notation $\widetilde{Y}_{\mathbb{PP}}$, as generally used herein, may refer to a submatrix of item covariance matrix $\hat{Y}$ indexed by $\mathbb{P}$ rows and $\mathbb{P}$ columns.

Furthermore, as illustrated in FIG. 16, after performing training computation 1628a, controller node 1510 may broadcast message 1652 to worker node l 1601. Message 1652, in some embodiments, may include the value of global direction matrix D after training computation 1628a (e.g., a global model parameter). Additionally, as illustrated in FIG. 16, worker node l 1601 may receive message 1652 at block 1608. Specifically, at block 1608, worker node l 1601 may perform training computations 1608a and 1608b. Training computation 1608a, in some embodiments, may compute worker-specific model parameter $a_1^{(l)}$ using $a_1^{(l)} \leftarrow \Sigma_{(u,i) \in \Omega_l}(\Delta_{ui} D_{u:} Y_{\mathbb{P}i})(\Delta_{ui}+1)(R_{ui}-X_{u:}Y_{:i})$. The notation $D_{u:}$ as generally used herein, may refer to a row in global direction matrix D that corresponds to user u. The notation $Y_{\mathbb{P}i}$, as generally used herein, may refer to a submatrix of controller-specific item parameters matrix Y that includes $\mathbb{P}$ user rows and a column corresponding to item i. Conversely, as also illustrated in FIG. 16, training computation 1608b may compute worker-specific model parameter $b_1^{(l)}$ using $b_1^{(l)} \leftarrow \Sigma_{(u,i) \in \Omega_l}(\Delta_{ui}^2+2\Delta_{ui})(D_{u:}Y_{\mathbb{P}i})^2$.

In some embodiments, worker node l 1601 may compute training computations 1608a and 1608b in parallel via algorithm 1706 illustrated in FIG. 17C. As shown in FIG. 17C, worker node/1601 may provide input 1706a to algorithm 1706. Input 1706a, in some embodiments, may include implicit feedback data subset $\Omega_l$, user parameters matrix X, item parameters matrix Y, global direction matrix D, and intermediate variables $\{e_{ui}\}$. Input 1706a may also presume that worker node l 1601 includes H threads indexed by 1, 2, . . . , H and that user parameters matrix X includes m user rows. Additionally, as illustrated in FIG. 17C, algorithm 1706 may produce an output 1706b that includes partially computed $a_1^{(l)}$ and $b_1^{(l)}$ for $X_{:\mathbb{P}}$.

As shown in FIG. 17C, for any respective h∈{1, 2, . . . , H}, algorithm 1706 may include steps 1706c-1706k. At step 1706c, algorithm 1706 may assign a loop variable u to a current thread index h and initialize thread-specific model parameters $a_1^{(h)}$ and $b_1^{(h)}$ to zero (0). At step 1706d, algorithm 1706 may determine if loop variable u exceeds the number of users rows m included in user parameters matrix X. If algorithm 1706 determines, at step 1706d, that the loop variable u does exceed the number of users rows m, algorithm 1706 may terminate. Conversely, if algorithm 1706 determines, at step 1706d, that loop variable u does not exceed the number of users rows m, algorithm 1706 may proceed to step 1706e. At step 1706e, for each item i that has an interaction with user u in the implicit feedback data subset $\Omega_l$, algorithm 1706 performs steps 1706f-1706g. Step 1706f may update thread-specific model parameter $a_1^{(h)}$ using $a_1^{(h)} \leftarrow a_1^{(h)}+(\Delta_{ui} D_{u:} Y_{\mathbb{P}i})(\Delta_{ui}+1)e_{ui}$. Similarly, step 1706g may update thread-specific model parameter $b_1^{(h)}$ using $b_1^{(h)} \leftarrow b_1^{(h)}+(\Delta_{ui}^2+2\Delta_{ui})(D_{u:}Y_{\mathbb{P}i})^2$.

Furthermore, as illustrated in FIG. 17C, after performing 1706e-1706g, algorithm 1706 may proceed to step 1706h. At step 1706h, algorithm 1706 increments loop variable u using u←u+H. Specifically, step 1706h increments loop variable u by the total number of threads H. After step 1706h, algorithm 1706 may proceed to step 1706i. At step 1706i, algorithm 1706 returns to step 1706d to determine if the new value of loop variable u is greater than the number of user rows m in user parameters matrix X. If a negative determination is made at step 1706d, algorithm 1706 may perform steps 1706e-1706g until such criteria is satisfied.

Conversely, if a positive determination is made at step 1706d, algorithm 1706 may proceed to step 1706j. At step 1706j, algorithm 1706 may initialize worker-specific model parameters $a_1$ and $b_1$ to zero (0). After step 1706j, algorithm 1706 may proceed to step 1706k. At step 1706k, algorithm 1706 respectively updates worker-specific model parameters $a_1$ and $b_1$ using $a_1 \leftarrow a_1+a_1^{(h)}$ and $b_1 \leftarrow b_1+b_1^{(h)}$ for h=1, 2, . . . , H.

Referring to FIG. 16, after performing training computations 1608a and 1608b at block 1608, worker node l 1601 may send message 1654 to controller node 1510. Message 1654, as illustrated in FIG. 16, may include a plurality of worker-specific model parameters $a_1^{(l)}$, $b_1^{(l)}$, and $g_{2t+1}^{(l)}$. Additionally, as illustrated in FIG. 16, controller node 1510 may receive message 1654 at block 1632. In some embodiments, controller node 1510 may execute block 1632 after block 1630, which will now be described.

In some embodiments, controller node 1510 may execute block 1630 while worker node/1601 executes block 1608. At block 1630, controller node 1510 may perform training computations 1630a-1630c. Training computation 1630a, in some embodiments, may compute a global direction covariance matrix $\tilde{D}$ using $\tilde{D} \leftarrow D^T D$. The notation $D^T$, as generally used herein, may refer to a transpose of global direction matrix D. Training computation 1630b, in some embodiments, may compute controller-specific model parameter $a_1$ using $a_1 \leftarrow \text{tr}(\tilde{D} \widetilde{Y}_{\mathbb{PP}})+\lambda \text{tr}(\tilde{D})$. Lastly, in some embodiments, training computation 1630c may compute controller-specific model parameter $b_1$ using $b_1 \leftarrow a_1$. It shall be noted that the notation $\tilde{Y}_{\mathbb{PP}}$, as generally used herein, may refer to a submatrix of item covariance matrix $\tilde{Y}$ indexed by $\mathbb{P}$ rows and $\mathbb{P}$ columns. It shall also be noted that, in some embodiments, controller node 1510 may compute the trace of matrix product $\tilde{D}$ and $\tilde{Y}_{\mathbb{PP}}$ (denoted as $tr(\tilde{D}\tilde{Y}_{\mathbb{PP}})$ in FIG. 16) using algorithm 1702 illustrated in FIG. 17A. Algorithm 1702 may perform analogous computations as previously described with respect to computing $tr(\tilde{Y}\tilde{X})$ at block 1624. However, in such an example, matrices A and B for training computation 1630b may instead correspond to global direction covariance matrix $\tilde{D}$ and submatrix $\tilde{Y}_{\mathbb{PP}}$, respectively.

Referring to FIG. 16, after performing block 1630, controller node 1510 may proceed to block 1632. At block 1632, controller node 1510 may perform training computations 1632a-1632c. Training computation 1632a, in some embodiments, may update controller-specific model parameter $a_1$ using $a_1 \leftarrow a_1 + \Sigma_{l=1}^L a_1^{(l)}$. The notation $\Sigma_{l=1}^L a_1^{(l)}$, as generally used herein, may refer to a sum of worker-specific model parameters $a_1^{(l)}$ collected from worker nodes with indexes in L. Conversely, training computation 1632b, in some embodiments, may update controller-specific model parameter $b_1$ using $b_1 \leftarrow b_1 + \Sigma_{l=1}^L b_1^{(l)}$. (. The notation $\Sigma_{l=1}^L b_1^{(l)}$, as generally used herein, may refer to a sum of worker-specific model parameters $b_1^{(l)}$ collected from worker nodes with indexes in L. Lastly, training computation 1632c, in some embodiments, may update controller-specific global objective function $g_{2t+1}$ using $g_{2t+1} \leftarrow g_{2t+1} + \Sigma_{l=1}^L g_{2t+1}^{(l)}$. The notation $\Sigma_{l=1}^L g_{2t+1}^{(l)}$, as generally used herein, may refer to a sum of worker-specific objective functions $g_{2t+1}^{(l)}$ collected from worker nodes with indexes in L.

Additionally, as illustrated in FIG. 16, after performing block 1632, controller node 1510 may broadcast message 1656 to worker node l 1601. Message 1656, as illustrated in FIG. 16, may include controller-specific model parameters $a_1$, $b_1$, and $g_{2t+1}$ (e.g., a plurality of global model parameters). Additionally, as illustrated in FIG. 16, worker node l 1601 may receive message 1656 at block 1610. At block 1610, worker node l 1601 may perform training computation 1610a. Training computation 1610a may update worker-specific user parameters matrix $X_{:\mathbb{P}}$ using $$X_{:\mathbb{P}} \leftarrow X_{:\mathbb{P}} + \frac{a_1}{b_1} D.$$

Furthermore, as illustrated in FIG. 16, after performing block 1632, controller node 1510 may proceed to block 1634. At block 1634, controller node 1510 may perform training computation 1634a. Specifically, in some embodiments, training computation 1634a may update controller-specific user parameters matrix $X_{:\mathbb{P}}$ using $$X_{:\mathbb{P}} \leftarrow X_{:\mathbb{P}} + \frac{a_1}{b_1} D.$$

It shall be noted that, in some embodiments, controller node 1510 may execute block 1634 while worker node l 1601 executes block 1610.

In some embodiments, after executing block 1610, worker node l 1601 may proceed to block 1612. At block 1612, worker node l 1601 may perform training computations 1612a-1612c. Specifically, as illustrated in FIG. 16, training computation 1612a may initialize worker-specific direction matrix $z^{(l)}$ using $z^{(l)} \leftarrow 0$. Conversely, in FIG. 16, training computation 1612b may update one or more columns in worker-specific direction matrix $Z^{(l)}$ using $z_{:i}^{(l)} \leftarrow z_{:i}^{(l)} + [\Delta_{ui}(R_{ui} - X_{u:}Y_{:i}) + R_{ui}] X_{u\mathbb{Q}}^T$, $\forall (u,i) \in \Omega_l$. The notation $Z_{:i}^{(l)}$, as generally used herein, may refer to a column in worker-specific direction matrix $Z^{(l)}$ that corresponds to item i of user-item interaction tuple (u,i). Additionally, the notation $X_{u\mathbb{Q}}^T$, as generally used herein, may correspond to a transpose of a row in controller-specific item parameters submatrix $X_{:\mathbb{Q}}$ that comprises columns of X that are indexed by $\mathbb{Q}$. Lastly, training computation 1612c may compute worker-specific objective function $g_{2t+2}^{(l)}$ using $g_{2t+2}^{(l)} \leftarrow \Sigma_{(u,i) \in \Omega_l} [\Delta_{ui}(R_{ui} - X_{u:}Y_{:i}) + R_{ui}]^2 - 2\Sigma_{(u,i) \in \Omega_l} [\Delta_{ui}(R_{ui} - X_{u:}Y_{:i}) + R_{ui}](X_{u:}Y_{:i})$. It shall be noted that the other terms described with respect to training computations 1612a-1612c may be the same as or similar to the terms described with respect to training computation 1604a-1604c.

In some embodiments, as illustrated in FIG. 16, worker node l 1601 may concurrently perform training computations 1612b and 1612c via algorithm 1708 illustrated in FIG. 17D. As shown in FIG. 17D, worker node l 1601 may provide input 1708a to algorithm 1708. Input 1708a, in some embodiments, may include implicit feedback data subset $\Omega_l$, user parameters matrix X, item parameters matrix Y, and worker-specific direction matrix Z. Input 1708a, in some embodiments, may also presume that worker node l 1601 includes H threads indexed by 1, 2, ..., H and that item parameters matrix Y includes n item columns. Additionally, as illustrated in FIG. 17D, algorithm 1708 may produce an output 1708b that includes partially computed worker-specific direction matrix Z, partially computed worker-specific objective function $g_{2t+2}$, and intermediate variables $\{e_{ui}\}$.

As shown in FIG. 17D, for any respective $h \in \{1, 2, ..., H\}$, algorithm 1708 may include steps 1708c-1708m. At step 1708c, algorithm 1708 may assign loop variable i to a current thread index h (e.g., $i \leftarrow h$) and initialize local accumulator $g_{2t+2}^{(h)}$ to zero (e.g., $g_{2t+2}^{(h)} \leftarrow 0$). At step 1708d, algorithm 1708 may determine if loop variable i exceeds the number of item columns n in item parameters matrix Y. If algorithm 1708 determines, at step 1708d, that the loop variable i does exceed the number of item columns n, algorithm 1708 may terminate. Conversely, if algorithm 1708 determines, at step 1708d, that loop variable i does not exceed the number of item columns n, algorithm 1708 may proceed to step 1708e. At step 1708e, for each user u that has an interaction with item i in implicit feedback data subset $\Omega_l$, algorithm 1708 may perform steps 1708f-1708i. At step 1708f, algorithm 1708 computes intermediate variable $e_{ui}$ using $e_{ui} \leftarrow R_{ui} - X_{u:}Y_{:i}$. At step 1708g, algorithm 1708 may compute adjusted intermediate variable $\epsilon_{ui}$ using $\epsilon_{ui} \leftarrow \Delta_{ui} e_{ui} + R_{ui}$. At step 1708h, algorithm 1708 updates $Z_{:i}$ (e.g., a column in worker-specific direction matrix X corresponding to variable i). Specifically, in 1708h, algorithm 1708 updates $Z_{:i}$ using $Z_{:i} \leftarrow Z_{:i} + \epsilon_{ui} X_{u\mathbb{Q}}^T$.

Furthermore, as shown in FIG. 17D, at step 1708i local accumulator $g_{2t+2}^{(h)}$ is updated using $g_{2t+2}^{(h)} \leftarrow g_{2t+2}^{(h)} + \epsilon_{ui}^2 - 2\epsilon_{ui}(X_{u:}Y_{:i})$. At step 1708j, algorithm 1708 updates loop variable i using $i \leftarrow i + H$. Specifically, step 1708j increments loop variable i by the total number of threads H. At step 1708k, algorithm 1708 returns to step 1708d to determine if the new value of loop variable i is greater than the number of item columns n in item parameters matrix Y. If a negative determination is made at step 1708d, algorithm 1708 may perform steps 1708e-1708k until such criteria is satisfied.

Conversely, if a positive determination is made at step 1708d, algorithm 1708 may proceed to step 17081. At step 17081, global accumulator $g_{2t+2}$ is initialized using $g_{2t+2} \leftarrow 0$. At step 1708m, algorithm 1708 updates global accumulator $g_{2t+2}$. Specifically, at step 1708m, algorithm 1708 sums all local accumulators $g_{2t+2}^{(h)}$ for h=1, 2, . . . , H using $g_{2t+2} \leftarrow g_{2t+2} + g_{2t+2}^{(h)}$.

Referring to FIG. 16, after performing block 1612, worker node 1 1601 may proceed to block 1614. At block 1614, worker node 1 1601 may execute training computation 1614a. As illustrated in FIG. 16, training computation 1614a may compute a global worker-specific direction matrix $Z^{(L)}$ using a tree-based aggregation method (e.g., a binary-tree aggregation method). The tree-based aggregation method, as generally used herein, may aggregate non-zero columns in the worker-specific direction matrices computed via the plurality of worker nodes 1512a-1512n (represented as {nonzero columns of $Z^{(l)}\}_{l=1}^{L}$ in FIG. 16).

In some embodiments, after computing global worker-specific direction matrix $Z^{(L)}$ at block 1614, worker node 1 1601 may send message 1658 to controller node 1510. Message 1658, as illustrated in FIG. 16, may include worker-specific direction matrix $Z^{(L)}$ (e.g., a worker-specific model parameter). Additionally, as illustrated in FIG. 16, controller node 1510 may receive message 1658 at block 1638. In some embodiments, controller node 1510 may execute block 1638 after block 1636, which will now be described.

In some embodiments, controller node 1510 may execute block 1636 while respective worker node 1 1601 executes block 1612. At block 1636, controller node 1510 may perform training computations 1636a-1636d. Training computation 1636a, in analogous ways as training computation 1624b, may compute a user covariance matrix $\tilde{X}$ using $\tilde{X} + XX^T$. Similarly, in analogous ways as training computation 1624a, training computation 1636b may compute item covariance matrix $\tilde{Y}$ using $\tilde{Y} \leftarrow YY^T$.

Furthermore, training computation 1636c, in some embodiments, may compute controller-specific global direction matrix Z using $Z \leftarrow -\lambda Y_{\mathbb{Q}:} - \tilde{X}_{\mathbb{Q}:} Y$. The notation $\tilde{X}_{\mathbb{Q}:}$, as generally used herein, may refer to a sub-matrix of $\tilde{X}$ indexed by the set of elements in $\mathbb{Q}$. Lastly, training computation 1636d, in some embodiments, may compute controller-specific global objective function $g_{2t+2}$ using $g_{2t+2} \leftarrow \lambda[\text{tr}(\tilde{X}_{\mathbb{PP}}) + \text{tr}(\tilde{Y}_{\mathbb{QQ}})] + \text{tr}(\tilde{Y}\tilde{X})$. It shall be noted that the other terms described with respect to training computations 1636a-1636d may be the same as or similar to the terms described with respect to training computation 1624a-1604d.

In some embodiments, after performing block 1636, controller node 1510 may proceed to block 1638. As described previously above, block 1638 may receive global worker-specific direction matrix $Z^{(L)}$. Additionally, as illustrated in FIG. 16, block 1638 may include training computation 1638a. Training computation 1638a may update controller-specific global direction matrix Z using $Z \leftarrow Z + Z^{(L)}$. After block 1638, controller node 1510 may proceed to block 1640. At block 1640, controller node 1510 may perform training computation 1640a. Specifically, as illustrated in FIG. 16, training computation 1640a may further update global direction matrix Z using $Z \leftarrow (\lambda I + \tilde{X}_{\mathbb{QQ}})^{-1} Z$. The notation I, as generally used herein, may refer to an identity matrix with a size equivalent to $\tilde{X}_{\mathbb{QQ}}$. The notation $\tilde{X}_{\mathbb{QQ}}$, as generally used herein, may refer to a submatrix of user covariance matrix $\tilde{X}$ indexed by $\mathbb{Q}$ rows and $\mathbb{Q}$ columns.

Furthermore, as illustrated in FIG. 16, after performing training computation 1640a, controller node 1510 may broadcast message 1660 to worker node 1 1601. Message 1660, in some embodiments, may include the value of global direction matrix Z after training computation 1640a (e.g., a global model parameter). Additionally, as illustrated in FIG. 16, worker node 1 1601 may receive message 1660 at block 1616. Specifically, at block 1616, worker node 1 1601 may perform training computations 1616a and 1616b. Training computation 1616a, in some embodiments, may compute worker-specific model parameter $a_1^{(l)}$ using $a_1^{(l)} \leftarrow \Sigma_{(u,i) \in \Omega_I} (\Delta_{ui} X_{u\mathbb{Q}} Z_{:i})(\Delta_{ui}+1)(R_{ui}-X_{u:}Y_{:i})$. The notation $Z_{:i}$, as generally used herein, may refer to a column in global direction matrix Z that correspond to item i. The notation $X_{u\mathbb{Q}}$, as generally used herein, may refer to a submatrix of controller-specific user parameters matrix X that includes $\mathbb{Q}$ item columns and a row corresponding to user u. Conversely, as also illustrated in FIG. 16, training computation 1616b may compute worker-specific model parameter $b_1^{(l)}$ using $b_1^{(l)} \leftarrow \Sigma_{(u,i) \in \Omega_I}(\Delta_{ui}^2 + 2\Delta_{ui})(X_{u\mathbb{Q}} Z_{:i})^2$.

In some embodiments, worker node 1 1601 may compute training computations 1616a and 1616b in parallel via algorithm 1710 illustrated in FIG. 17E. As shown in FIG. 17E, worker node 1 1601 may provide input 1710a to algorithm 1710. Input 1710a, in some embodiments, may include implicit feedback data subset $\Omega_I$, user parameters matrix X, item parameters matrix Y, global direction matrix Z, and intermediate variables $\{e_{ui}\}$. Input 1710a may also presume that worker node 1 1601 includes H threads indexed by 1, 2, . . . , H and that item parameters matrix Y includes n item columns. Additionally, as illustrated in FIG. 17E, algorithm 1710 may produce an output 1710b that includes partially computed $a_1$ and $b_1$ for $Y_{\mathbb{Q}:}$.

As shown in FIG. 17E, for any respective h∈{1, 2, . . . , H}, algorithm 1710 may include steps 1710c-1710k. At step 1710c, algorithm 1710 may assign loop variable i to current thread index h (e.g., i←h) and initialize thread-specific model parameters $a_1^{(h)}$ and $b_1^{(h)}$ to zero (0) (e.g., $a_1^{(h)} \leftarrow 0$ and $b_1^{(h)} \leftarrow 0$). At step 1710d, algorithm 1710 may determine if loop variable i exceeds the number of item columns n included in item parameters matrix Y. If algorithm 1710 determines, at step 1710d, that loop variable i does exceed the number of item columns n, algorithm 1710 may terminate. Conversely, if algorithm 1710 determines, at step 1710d, that loop variable i does not exceed the number of item columns n, algorithm 1710 may proceed to step 1710e. At step 1710e, for each user u that has an interaction with item i in the implicit feedback data subset $\Omega_I$, algorithm 1710 performs steps 1710f-1710g. Specifically, step 171 of may update thread-specific model parameter $a_1^{(h)}$ using $a_1^{(h)} \leftarrow a_1^{(h)} + (\Delta_{ui} X_{u\mathbb{Q}} Z_{:i})(\Delta_{ui}+1)e_{ui}$. Similarly, step 1710g may update thread-specific model parameter $b_1^{(h)}$ using $b_1^{(h)} \leftarrow b_1^{(h)} + (\Delta_{ui}^2 + 2\Delta_{ui})(X_{u\mathbb{Q}} Z_{:i})^2$.

Furthermore, as illustrated in FIG. 17E, after performing steps 1710e-1710g, algorithm 1710 may proceed to step 1710h. At step 1710h, algorithm 1710 increments loop variable i using i←i+H. Specifically, step 1710h increments loop variable i by the total number of threads H. After step 1710h, algorithm 1710 may proceed to step 1710i. At step 1710i, algorithm 1710 returns to step 1710d to determine if the new value of loop variable i is greater than the number of item columns n in item parameters matrix Y. If a negative determination is made at step 1710*d*, algorithm 1710 may perform steps 1710*e*-1710*g* until such criteria is satisfied.

Conversely, if a positive determination is made at step 1710*d*, algorithm 1710 may proceed to step 1710*j*. At step 1710*j*, algorithm 1710 may initialize worker-specific model parameters $a_1$ and $b_1$ to zero (0). After step 1710*j*, algorithm 1710 may proceed to step 1710*k*. At step 1710*k*, algorithm 1710 respectively updates worker-specific model parameters $a_1$ and $b_1$ using $a_1 \leftarrow a_1 + a_1^{(h)}$ and $b_1 \leftarrow b_1 + b_1^{(h)}$ for h=1, 2, ..., H.

Referring to FIG. 16, after performing training computations 1616*a* and 1616*b* at block 1616, worker node 1 1601 may send message 1662 to controller node 1510. Message 1662, as illustrated in FIG. 16, may include a plurality of worker-specific model parameters, including $a_1^{(l)}$, $b_1^{(l)}$, and $g_{2t+1}^{(l)}$. Additionally, as illustrated in FIG. 16, controller node 1510 may receive message 1662 at block 1644. In some embodiments, controller node 1510 may execute block 1644 after block 1642, which will now be described. It shall be noted that, as illustrated and described in FIG. 16, messages 1651, 1654, 1658, and 1662 may be sent (e.g., transmitted) following a completion of a respective computation or task, and thus may be referred to as being sent to controller node 1510 at one or more pre-determined stages of execution.

In some embodiments, controller node 1510 may execute block 1642 while worker node 1 1601 executes block 1616. At block 1642, controller node 1510 may perform training computations 1642*a*-1642*c*. Training computation 1642*a*, in some embodiments, may compute global direction covariance matrix $\tilde{Z}$ using $\tilde{Z} \leftarrow Z^T Z$. The notation $Z^T$, as generally used herein, may refer to a transpose of global direction matrix Z. Training computation 1642*b*, in some embodiments, may compute controller-specific model parameter $a_1$ using $a_1 \leftarrow \text{tr}(\tilde{X}_{\mathbb{Q}\mathbb{Q}} \tilde{Z}) + \lambda \text{tr}(\tilde{Z})$. Lastly, in some embodiments, training computation 1642*c* may compute controller-specific model parameter $b_1$ using $b_1 \leftarrow a_1$. It shall be noted that the notation $\tilde{X}_{\mathbb{Q}\mathbb{Q}}$, as generally used herein, may refer to a submatrix of user covariance matrix $\tilde{X}$ indexed by $\mathbb{Q}$ rows and $\mathbb{Q}$ columns. It shall also be noted that, in some embodiments, controller node 1510 may compute the trace of matrix product $\tilde{Z}$ and $\tilde{X}_{\mathbb{Q}\mathbb{Q}}$ (denoted as tr($\tilde{X}_{\mathbb{Q}\mathbb{Q}} \tilde{Z}$) in FIG. 16) using algorithm 1702 illustrated in FIG. 17A. Algorithm 1702 may perform analogous computations as previously described with respect to computing tr($\tilde{Y}\tilde{X}$) at block 1624. However, in such an example, matrices A and B for training computation 1642*c* may instead correspond to global direction covariance matrix $\tilde{Z}$ and submatrix $\tilde{X}_{\mathbb{Q}\mathbb{Q}}$, respectively.

Furthermore, as illustrated in FIG. 16, after performing block 1642, controller node 1510 may proceed to block 1644. At block 1644, controller node 1510 may perform training computations 1644*a*-1644*c*. Training computation 1644*a*, in some embodiments, may update controller-specific model parameter $a_1$ using $a_1 \leftarrow a_1 + \Sigma_{l=1}^{L} a_1^{(l)}$. The notation $\Sigma_{l=1}^{L} a_1^{(l)}$, as generally used herein, may refer to a sum of worker-specific model parameters $a_1^{(l)}$ collected from worker nodes with indices in L. Conversely, training computation 1644*b*, in some embodiments, may update controller-specific model parameter $b_1$ using $b_1 \leftarrow b_1 + \Sigma_{l=1}^{L} b_1^{(l)}$. The notation $\Sigma_{l=1}^{L} b_1^{(l)}$, as generally used herein, may refer to a sum of worker-specific model parameters $b_1^{(l)}$ collected from worker nodes with indexes in L. Lastly, training computation 1644*c*, in some embodiments, may update controller-specific global objective function $g_{2t+2}$ using $g_{2t+2} \leftarrow g_{2t+2} + \Sigma_{l=1}^{L} g_{2t+2}^{(l)}$. The notation $\Sigma_{l=1}^{L} g_{2t+2}^{(l)}$, as generally used herein, may refer to a sum of worker-specific objective function $g_{2t+2}^{(l)}$ collected from worker nodes with indexes in L.

Additionally, as illustrated in FIG. 16, after performing block 1644, controller node 1510 may broadcast message 1664 to worker node 1 1601. Message 1664, as illustrated in FIG. 16, may include controller-specific model parameter $a_1$, controller-specific model parameter $b_1$, and controller-specific objective function $g_{2t+1}$ (e.g., a plurality of global model parameters). Additionally, as illustrated in FIG. 16, worker node 1 1601 may receive message 1664 at block 1618. At block 1618, worker node 1 1601 may perform training computation 1618*a*. Training computation 1618*a* may update worker-specific item parameters matrix $Y_{\mathbb{Q}:}$ using $$Y_{\mathbb{Q}:} \leftarrow Y_{\mathbb{Q}:} + \frac{a_1}{b_1} Z.$$

It shall be noted that, in some portions of the disclosure, updating worker-specific user parameters matrix $X_{:\mathbb{P}}$ at block 1610 and, subsequently, updating worker-specific item parameters matrix $Y_{\mathbb{Q}:}$ at block 1618 may be referred to as alternately updating such matrices. It shall be noted that, as illustrated and described in FIG. 16, messages 1649, 1652, 1656, 1660, and 1664 may be sent (e.g., transmitted) following a completion of a respective computation or task, and thus may be referred to as being broadcasted (e.g., transmitted) to worker nodes 1512*a*-1512*n* at one or more pre-determined stages of execution.

Furthermore, as also illustrated in FIG. 16, after performing block 1644, controller node 1510 may proceed to block 1646. At block 1646, controller node 1510 may perform training computation 1646*a*. Specifically, in some embodiments, training computation 1646*a* may update controller-specific item parameters matrix $Y_{\mathbb{Q}:}$ using $$Y_{\mathbb{Q}:} \leftarrow Y_{\mathbb{Q}:} + \frac{a_1}{b_1} Z.$$

It shall be noted that, in some embodiments, controller node 1510 may execute block 1646 while worker node 1 1601 executes block 1618. It shall be noted that, in some portions of the disclosure, updating controller-specific user parameters matrix $X_{:\mathbb{P}}$ at block 1634 and, subsequently, updating controller-specific item parameters matrix $Y_{\mathbb{Q}:}$ at block 1646 may be referred to as alternately updating such matrices.

In some embodiments, as also illustrated in FIG. 16, after performing block 1646, controller node 1510 may proceed to block 1648. At block 1648, controller node 1510 may terminate execution of the aggregation model training algorithm executing at controller node 1510 if a controller-specific training termination condition is satisfied. The controller-specific training termination condition, in some embodiments, may be satisfied when controller-specific iteration number t reaches a pre-determined maximum number of training iterations (e.g., 50, 100, 200, 600, 1200, 2400, 4800, etc.). Additionally, or alternatively, in some embodiments, the controller-specific training termination may be satisfied when the value of controller-specific objective function $g_{2t+2}$ is less than a pre-determined value (e.g., $1e^{-5}$, $1e^{-6}$, etc.). Lastly, in some embodiments, the controller-specific training termination ("convergence criteria") may be satisfied when the sequence $\{g_1, g_2, \ldots, g_{2t+2}\}$ converges (e.g., changes between successive values in the sequence are less than a threshold amount of difference). For instance, in a non-limiting, the controller-specific training termination may be satisfied if successive values in the sequence vary by less than 0.1, 0.05, 0.003, 0.0001, 0.0001, 0.00001, or the like.

In some embodiments, as illustrated in FIG. 16, when controller node 1510 determines that the controller-specific training termination is not satisfied at block 1648, controller node 1510 may proceed to block 1650. At block 1650, controller node 1510 may perform training computation 1650a. Specifically, in some embodiments, training computation 1650a may update controller-specific iteration number t using t←t+1. It shall be noted that, in some embodiments, controller node 1510 may continuously perform blocks 1624-1650 until controller node 1510 determines that the controller-specific training termination at block 1648 is satisfied.

In some embodiments, as illustrated in FIG. 16, while controller node 1510 executes blocks 1648 and 1650, worker node 1 1601 may execute blocks 1620 and 1622, respectively. Similar to block 1648, at block 1620, worker node 1 1601 may terminate execution of the localized model training algorithm executing at worker node/1601 if a worker-specific training termination condition is satisfied. The worker-specific training termination condition, in some embodiments, may be satisfied when worker-specific iteration number t reaches a pre-determined value (e.g., 50, 100, 200, 600, 1200, 2400, 4800, etc.). Additionally, or alternatively, in some embodiments, the worker-specific training termination may be satisfied when the value of worker-specific objective function $g_{2t+2}$ is less than a pre-determined value (e.g., $1e^{-5}$, $1e^{-6}$, etc.). Lastly, in some embodiments, the worker-specific training termination may be satisfied when the sequence $\{g_1, g_2, \ldots, g_{2t+2}\}$ converges (e.g., changes between successive values in the sequence are less than a threshold amount of difference). For instance, in a non-limiting, the controller-specific training termination may be satisfied if successive values in the sequence vary by less than 0.1, 0.05, 0.003, 0.0001, 0.0001, 0.00001, or the like.

Additionally, as illustrated in FIG. 16, when worker node 1 1601 determines that the worker-specific training termination is not satisfied at block 1648, worker node 1 1601 may proceed to block 1622. At block 1622, worker node 1 1601 may perform training computation 1622a. Specifically, in some embodiments, training computation 1622a may update worker-specific iteration number t using t←t+1. It shall be noted that, in some embodiments, worker node 1 1601 may continuously perform blocks 1604-1622 until worker node 1 1601 determines that the worker-specific training termination at block 1620 is satisfied. It shall be noted that, in some embodiments, process 1436 illustrated in FIG. 14 may include one or more of the operations described with respect to blocks 1602-1650.

Figure 18A:
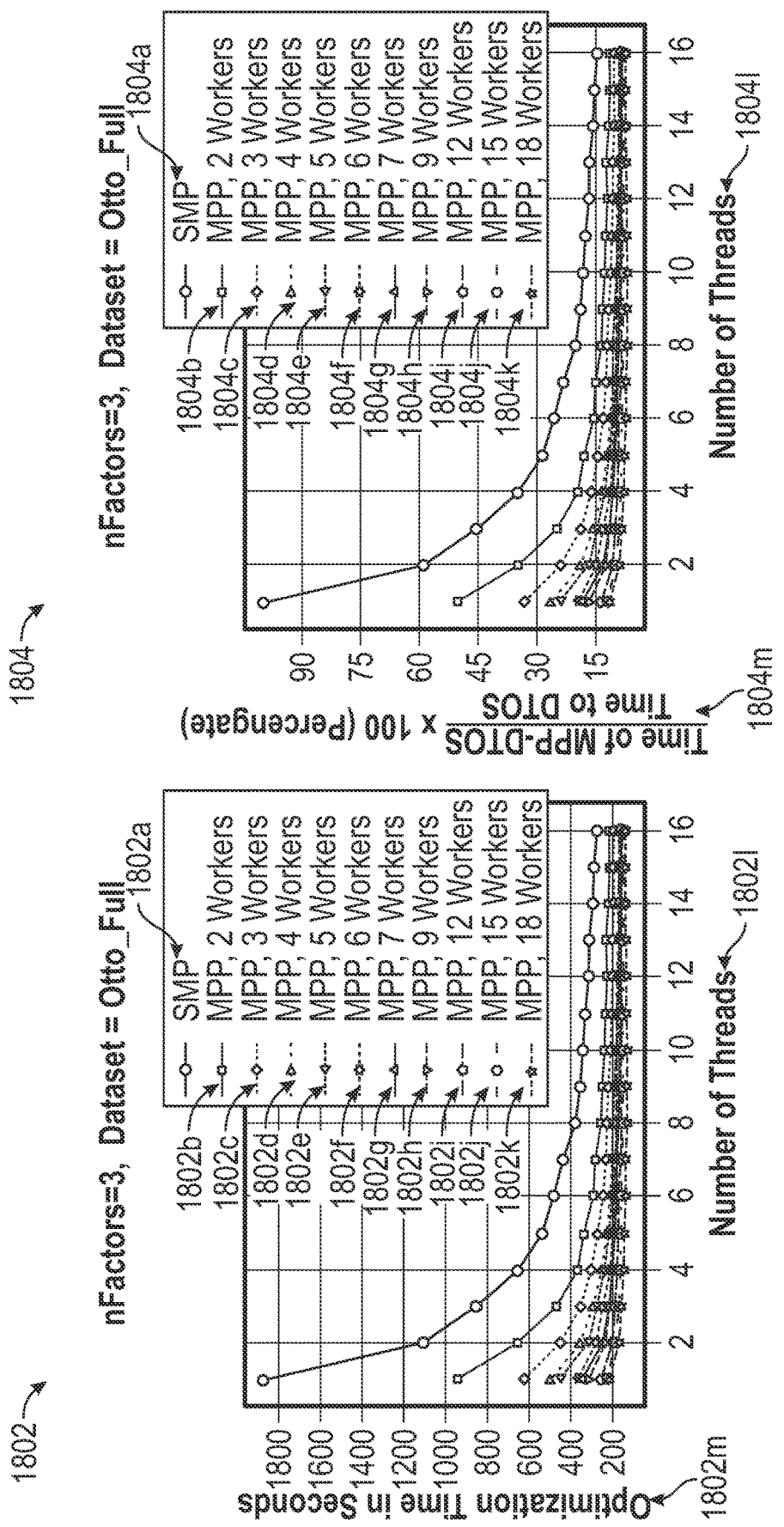
FIGS. 18A and 18B graphically illustrate results of training the multithread distributed DTOS algorithm with various number of threads and/or computing nodes, according to some embodiments of the present technology.
Figure 18A:
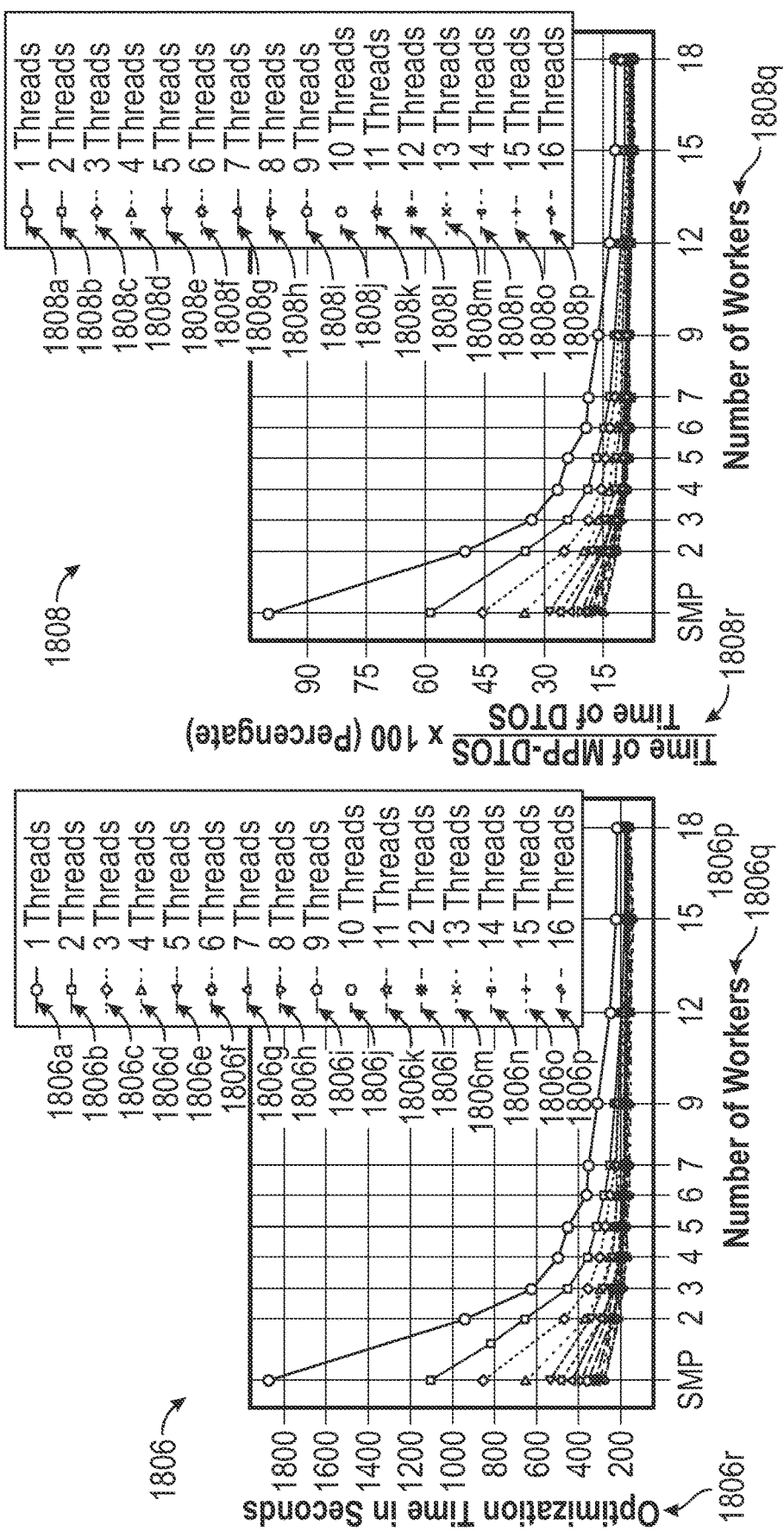
Figure 18B:
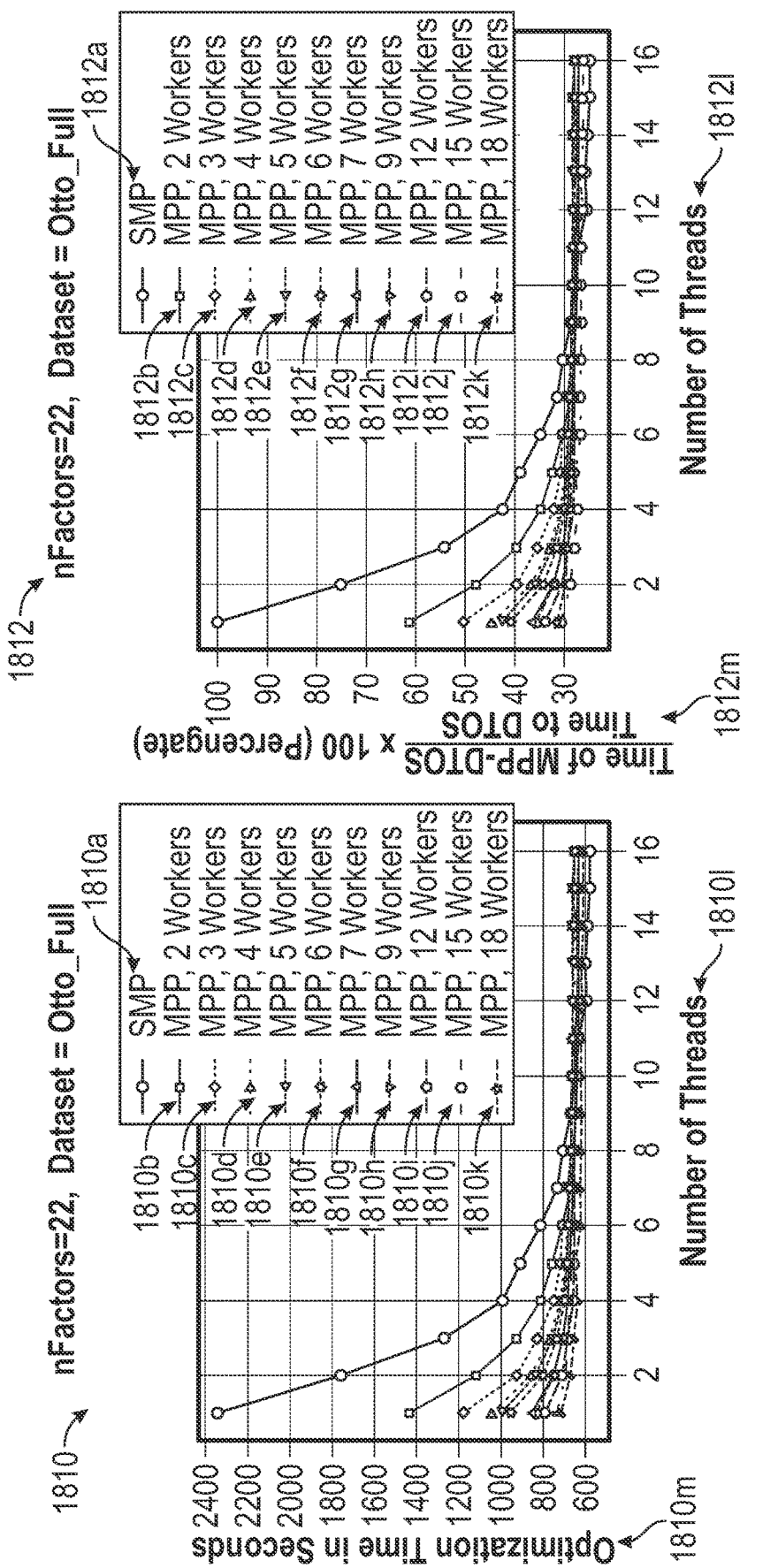

Computational advantages of multi-thread distributed DTOS algorithm 1600 will now be described with reference to FIGS. 18A and 18B. In FIGS. 18A and 18B, a plurality of graphs 1802-1816 are illustrated. Specifically, graphs 1802-1808 in FIG. 18A illustrate computation time results when multi-thread distributed DTOS algorithm 1600 trains a model on the OTTO recommender systems dataset ("otto_full") with a model size of k=3 (e.g., three (3) factors). Conversely, graphs 1810-1816 in FIG. 18B illustrate computation time results when multi-thread distributed DTOS algorithm 1600 trains a model on the OTTO recommender systems dataset ("otto_full") with a model size of k=22 (e.g., twenty-two (22) factors).

In general, the results depicted in FIGS. 18A and 18B illustrate that the execution time of multi-thread distributed DTOS algorithm 1600 decreases substantially as the number of worker nodes or threads increase. This reduction in execution time highlights the efficiency of the multithread distributed numerical computations described in FIG. 16, as well as the low overhead in communication between controller node 1510 and worker nodes 1512a-1512n. Specifically, it was observed that multi-thread distributed DTOS algorithm 1600 spends less than 8% of the time DTOS takes to train three (3) factors, using sixteen (16) threads and up to eighteen (18) workers, which again indicates communication efficiency of multi-thread distributed DTOS algorithm 1600. Additionally, it was also observed that multi-thread distributed DTOS algorithm 1600 requires less than 27.5% of the time that DTOS takes to train 22 factors, using sixteen (16) threads and up to eighteen (18) workers.

As multi-thread distributed DTOS algorithm 1600 makes no numerical approximations, the model parameters produced by multi-thread distributed DTOS algorithm 1600 are equivalent to the model parameters produced by the DTOS algorithm in terms of numerical accuracy. Thus, multi-thread distributed DTOS algorithm 1600 produces the same recommender model as DTOS in a much smaller amount of time. Stated in another way, the amount of time savings (as measured by axes 1804m, 1808m, 1812m, and 1816m), is significant up to a large number of workers and a large number of threads.

Notably, FIGS. 18A and 18B illustrate that the aforementioned time savings decreases monotonically as more threads are used. This is because multi-thread distributed DTOS algorithm 1600 performs complete concurrent computation with respect to threads, with the jobs in different threads independent of each other in terms of computation as well as memory writing (as previously mentioned above). As a result, each thread does not have to wait for other threads and there is no lock or mutex (mutual exclusion) required for use.

Furthermore, it shall also be noted that FIGS. 18A and 18B illustrate that the aforementioned time savings is persistent even when a large number of worker nodes are implemented (e.g., the time multi-thread distributed DTOS algorithm 1600 spends on numerical computations decreases monotonically as more worker nodes are added). However, as generally observed in distributed computations, the communication overhead typically increases as more worker nodes are added. Therefore, the persistent time saving in multi-thread distributed DTOS algorithm 1600 indicates that the growth of communication overhead, as more workers are added, can be offset such that the increased cost in communication is overshadowed by the decreased cost in numerical computation. It shall be noted the communication efficiency may be largely attributed to the tree-based sparse communication strategy described in FIG. 16. That is, multi-thread distributed DTOS algorithm 1600 benefits from communicating sparse directional matrices D and Z, instead of dense parameter matrices $X_{:\mathbb{P}}$ and $Y_{\mathbb{Q}:}$, among the worker nodes, from worker node L to the controller, and from the controller node to the worker nodes.

Lastly, as the number of threads increase, the aforementioned time savings may overshadow the time savings observed as the number of worker nodes increase. That is, in some embodiments, having more worker nodes may lead to less time savings when the execution time of multi-thread distributed DTOS algorithm 1600 has already been reduced by implementing a sufficiently large number of threads (e.g., 5 threads, 6 threads, 8 threads, 14 threads, 18 threads, and/or the like). This phenomenon may be attributed to the sparsity of the above-described directional matrices. Specifically, the directional matrices may be sparse with respect to either rows or columns (e.g., D can have zero rows but cannot have zero columns, while Z can have zero columns but cannot have zero rows). As k controls the number of columns in D and the number of rows in Z, the level of sparsity (i.e., the number of nonzeros) in D and Z monotonically decreases as k becomes larger. With D and Z being sparse in these particular ways, a larger k generally makes the communication cost increase, diminishing the time saving from more workers. On the other hand, the time saving from threads decreases monotonically as more threads are used. As a result, the time saving from more threads may eventually overshadow the time saving from more workers when k reaches a large enough value.

In FIG. 18A, graph 1802 includes x-axis 18021 that represents number of threads and y-axis 1802m that represents optimization time in seconds. Additionally, as illustrated in FIG. 18A, graph 1802 includes curves 1802a-1802k that represent training scenarios ranging from one (1) worker node to eighteen (18) worker nodes, respectively. Specifically, in FIG. 18A, curves 1802a-1802k generally indicate that the optimization time decreases as the number of threads increases.

Additionally, as shown in FIG. 18A, graph 1804 includes x-axis 18041 that represents number of threads and y-axis 1804m that represents time of multithread distributed DTOS algorithm 1600 as a percentage of computation time of a single-threaded, centralized DTOS algorithm. Additionally, as illustrated in FIG. 18A, graph 1804 includes curves 1804a-1804k that represent training scenarios ranging from one (1) worker node to eighteen (18) worker nodes, respectively. Specifically, in FIG. 18A, curves 1804a-1804k generally indicate that the percentage of time required by multi-thread distributed DTOS algorithm 1600 as compared to single-threaded, centralized DTOS algorithm decreases as the number of threads increase.

Furthermore, as shown in FIG. 18A, graph 1806 includes x-axis 1806q that represents number of workers and y-axis 1806r that represents optimization time in seconds. Additionally, as illustrated in FIG. 18A, graph 1806 includes curves 1806a-1806p that represent training scenarios ranging from one (1) thread to sixteen (16) threads, respectively. Specifically, in FIG. 18A, curves 1806a-1806p generally indicate that the optimization time decreases as the number of threads increases.

Lastly, as shown in FIG. 18A, graph 1808 includes x-axis 1808q that represents number of workers and y-axis 1808r that represents time of multithread distributed DTOS algorithm 1600 as a percentage of computation time of a single-threaded, centralized DTOS algorithm. Additionally, as illustrated in FIG. 18A, graph 1808 includes curves 1808a-1808p that represent training scenarios ranging from one (1) thread to sixteen (16) threads, respectively. Specifically, in FIG. 18A, curves 1808a-1808p generally indicate that the percentage of time required by multi-thread distributed DTOS algorithm 1600 as compared to single-threaded, centralized DTOS algorithm decreases as the number of threads increase.

Now transitioning to FIG. 18B. As previously described above, graphs 1810-1816 illustrate computation time results when multithread distributed DTOS algorithm 1600 trains a model on the OTTO recommender systems dataset ("otto_full") with a model size of k=22 (e.g., twenty-two (22) factors). Specifically, in FIG. 18B, graph 1810 includes x-axis 18101 that represents number of threads and y-axis 1810m that represents optimization time in seconds. Additionally, as illustrated in FIG. 18B, graph 1810 includes curves 1810a-1810k that represent training scenarios ranging from one (1) worker node to eighteen (18) worker nodes, respectively. Specifically, in FIG. 18B, curves 1810a-1810k generally indicate that the optimization time decreases as the number of threads increases.

Additionally, as shown in FIG. 18B, graph 1812 includes x-axis 18121 that represents number of threads and y-axis 1812m that represents time of multi-thread distributed DTOS algorithm 1600 as a percentage of computation time of a single-threaded, centralized DTOS algorithm. Additionally, as illustrated in FIG. 18B, graph 1812 includes curves 1812a-1812k that represent training scenarios ranging from one (1) worker node to eighteen (18) worker nodes, respectively. Specifically, in FIG. 18B, curves 1812a-1812k generally indicate that the percentage of time required by multi-thread distributed DTOS algorithm 1600 as compared to single-threaded, centralized DTOS algorithm decreases as the number of threads increase.

Furthermore, as shown in FIG. 18B, graph 1814 includes x-axis 1814q that represents number of workers and y-axis 1814r that represents optimization time in seconds. Additionally, as illustrated in FIG. 18B, graph 1814 includes curves 1814a-1814p that represent training scenarios ranging from one (1) thread to sixteen (16) threads, respectively. Specifically, in FIG. 18B, curves 1814a-1814p generally indicate that the optimization time decreases as the number of worker nodes increase.

Lastly, as shown in FIG. 18B, graph 1816 includes x-axis 1816q that represents number of threads and y-axis 1816r that represents time of multithread distributed DTOS algorithm 1600 as a percentage of computation time of a single-threaded, centralized DTOS algorithm. Additionally, as illustrated in FIG. 18B, graph 1816 includes curves 1816a-1816p that represent training scenarios ranging from one (1) thread to sixteen (16) threads, respectively. Specifically, in FIG. 18B, curves 1816a-1816p generally indicate that the percentage of time required by multi-thread distributed DTOS algorithm 1600 as compared to single-threaded, centralized DTOS algorithm decreases as the number of worker nodes increase.

It shall be noted that the system and methods described herein can be embodied and/or implemented at least in part as a machine configured to receive a computer-readable medium storing computer-readable instructions. The instructions are preferably executed by computer-executable components preferably integrated with the system and one or more portions of the processors and/or the controllers. The computer-readable medium can be stored on any suitable computer-readable media such as RAMs, ROMs, flash memory, EEPROMs, optical devices (CD or DVD), hard drives, floppy drives, memory sticks (e.g., SD cards, USB flash drives), cloud-based services (e.g., cloud storage), magnetic storage devices, Solid-State Drives (SSDs), or any suitable device. The computer-executable component is preferably a general or application-specific processor, but any suitable dedicated hardware or hardware/firmware combination device can alternatively or additionally execute the instructions.

The systems and methods of the preferred embodiments may additionally, or alternatively, be implemented on an integrated data analytics software application and/or software architecture such as those offered by SAS Institute Inc. of Cary, N.C., USA. Merely for illustration, the systems and methods of the preferred embodiments may be implemented using or integrated with one or more SAS software tools such as SAS® Viya™ which is developed and provided by SAS Institute Inc. of Cary, N.C., USA.

Although omitted for conciseness, the preferred embodiments include every combination and permutation of the implementations of the systems and methods described herein.

As a person skilled in the art will recognize from the previous detailed description and from the figures and claims, modifications and changes can be made to the embodiments of the disclosure without departing from the scope of the various described embodiments.

What is claimed is:

1. A computer-program product embodied in a non-transitory machine-readable storage medium storing computer instructions that, when executed by one or more processors, perform operations comprising:
   receiving an input comprising a plurality of pre-defined factor matrices and an implicit feedback dataset partitioned into a plurality of implicit feedback data subsets;
   distributing the input across a controller node and a plurality of worker nodes implemented in a distributed computing environment; and
   training a model using the controller node and the plurality of worker nodes, wherein training the model includes:
     initializing, by the controller node, a controller-specific user parameters matrix and a controller-specific item parameters matrix,
     broadcasting, by the controller node, the controller-specific user parameters matrix and the controller-specific item parameters matrix to each worker node of the plurality of worker nodes, and
     concurrently executing an aggregation model training algorithm at the controller node, a first localized model training algorithm at a first worker node of the plurality of worker nodes, and a plurality of additional localized model training algorithms across a remainder of the plurality of worker nodes until a training termination condition is satisfied, wherein:
       the plurality of additional localized model training algorithms compute a plurality of worker-specific direction matrices,
       the first localized model training algorithm aggregates the plurality of worker-specific direction matrices into an aggregate worker-specific direction matrix using a binary tree,
       the aggregation model training algorithm iteratively updates the controller-specific user parameters matrix and the controller-specific item parameters matrix for at least a first iteration and a second iteration,
       the first iteration of the aggregation model training algorithm updates the controller-specific user parameters matrix and the controller-specific item parameters matrix based on a first plurality of messages received from the first localized model training algorithm and each of the plurality of additional localized model training algorithms, wherein the first plurality of messages at least include the aggregate worker-specific direction matrix, and
       the second iteration of the aggregation model training algorithm updates the controller-specific user parameters matrix and the controller-specific item parameters matrix based on a second plurality of messages received from the first localized model training algorithm and each of the plurality of additional localized model training algorithms, different from the first plurality of messages.

2. The computer-program product according to claim 1, wherein:
   the implicit feedback dataset comprises a plurality of user-item interaction tuples, wherein a respective user-item interaction tuple of the plurality of user-item interaction tuples represents an interaction between a respective user and a respective item and a weight of the interaction, and
   the plurality of implicit feedback data subsets are disjoint subsets, wherein a first respective implicit feedback data subset and a second implicit feedback data subset are disjoint subsets when the first respective implicit feedback data subset and the second respective implicit feedback data subset do not share a common user-item interaction tuple.

3. The computer-program product according to claim 1, wherein:
   the plurality of pre-defined factor matrices include a pre-defined user factors matrix and a pre-defined item factors matrix, and
   distributing the input across the controller node and the plurality of worker nodes includes:
     distributing a copy of the pre-defined user factors matrix to the controller node and each of the plurality of worker nodes,
     distributing a copy of the pre-defined item factors matrix to the controller node and each of the plurality of worker nodes, and
     distributing each of the plurality of implicit feedback data subsets to a respective worker node of the plurality of worker nodes.

4. The computer-program product according to claim 1, wherein:
   the implicit feedback dataset comprises a plurality of user-item interaction tuples that represent interactions between a plurality of users and a plurality of items,
   the training termination condition is satisfied when the controller-specific user parameters matrix and the controller-specific item parameters matrix satisfy convergence criteria, and
   the model is a matrix factorization model that, once trained, utilizes the controller-specific user parameters matrix and the controller-specific item parameters matrix derived from the training to recommend one or more items of the plurality of items to a user.

5. The computer-program product according to claim 4, wherein the training termination condition is further satisfied when a number of iterations for training the model exceeds a pre-determined maximum number of training iterations.

6. The computer-program product according to claim 1, wherein:
   training the model includes performing a first type of computations and a second type of computations,
   the first type of computations requires a user-to-item feedback matrix and a user-item interaction weight matrix,
   the second type of computations do not require the user-to-item feedback matrix and the user-item interaction weight matrix,
   the first localized model training algorithm and the plurality of additional localized model training algorithms executing across the first worker node and the remainder of the plurality of worker nodes perform the first type of computations, and the aggregation model training algorithm executing at the controller node performs the second type of computations.

7. The computer-program product according to claim 1, wherein the first localized model training algorithm executing at the first worker node of the plurality of worker nodes:
generates a plurality of worker-specific model parameters based on a respective implicit feedback data subset allocated to the first worker node, wherein the plurality of worker-specific model parameters include one or more sparse directional matrices, and
transmits, to the controller node, at one or more pre-determined stages of execution, a respective message of the first plurality of messages that includes the plurality of worker-specific model parameters.

8. The computer-program product according to claim 1, wherein the first iteration of the aggregation model training algorithm:
updates a plurality of global model parameters, including the controller-specific user parameters matrix and the controller-specific item parameters matrix, based on a plurality of worker-specific model parameters included in the first plurality of messages, and
transmits, at one or more pre-determined stages of execution, one or more of the plurality of global model parameters to the plurality of worker nodes.

9. The computer-program product according to claim 1, wherein the first localized model training algorithm executing at the first worker node of the plurality of worker nodes alternates in updating a worker-specific user parameters matrix and a worker-specific item parameters matrix based at least on an implicit feedback data subset allocated to the first worker node and a plurality of global model parameters received from the controller node.

10. The computer-program product according to claim 9, wherein the first localized model training algorithm executing at the first worker node updates the worker-specific user parameters matrix by:
initializing and updating a first worker-specific direction matrix and a first worker-specific objective function,
transmitting, to the controller node, a first respective message of the first plurality of messages that includes the aggregate worker-specific direction matrix that further aggregates at least a portion of the first worker-specific direction matrix,
receiving, from the controller node, a first aggregated direction matrix that is computed from the aggregate worker-specific direction matrix,
initializing and updating a plurality of worker-specific model parameters based on the first aggregated direction matrix,
transmitting, to the controller node, a second respective message of the first plurality of messages that includes the plurality of worker-specific model parameters and the first worker-specific objective function,
receiving, from the controller node, a subset of the plurality of global model parameters that aggregate the plurality of worker-specific model parameters computed by each of the plurality of worker nodes, and
updating the worker-specific user parameters matrix based at least on the subset of the plurality of global model parameters and the first aggregated direction matrix.

11. The computer-program product according to claim 10, wherein the first localized model training algorithm executing at the first worker node updates the worker-specific item parameters matrix by:
initializing and updating a second worker-specific direction matrix and a second worker-specific objective function,
transmitting, to the controller node, a third respective message of the first plurality of messages that includes at least a portion of the second worker-specific direction matrix,
receiving, from the controller node, a second aggregated direction matrix that is computed from the portion of the second worker-specific direction matrix received from each of the plurality of worker nodes,
updating a plurality of worker-specific model parameters based on the second aggregated direction matrix,
transmitting, to the controller node, a fourth respective message of the first plurality of messages that includes the plurality of worker-specific model parameters and the second worker-specific objective function,
receiving, from the controller node, updates to at least a subset of the plurality of global model parameters, and
updating the worker-specific item parameters matrix based at least on the updates to the subset of the plurality of global model parameters and the second aggregated direction matrix.

12. The computer-program product according to claim 1, wherein:
the aggregation model training algorithm executing at the controller node iteratively updates the controller-specific user parameters matrix and the controller-specific item parameters matrix for at least the first iteration and the second iteration, and alternates in updating the controller-specific user parameters matrix and the controller-specific item parameters matrix, and
updating the controller-specific user parameters matrix for the first iteration of the aggregation model training algorithm includes:
initializing and computing an item parameters transformation matrix, a user parameters transformation matrix, a first global direction matrix, and a first global objective function,
receiving a first subset of the first plurality of messages comprising the aggregate worker-specific direction matrix,
updating the first global direction matrix based at least on the aggregate worker-specific direction matrix,
receiving a second subset of the first plurality of messages comprising a plurality of worker-specific model parameters from each of the plurality of worker nodes,
initializing and updating a plurality of global model parameters based at least on the plurality of worker-specific model parameters received from each of the plurality of worker nodes, and
updating the controller-specific user parameters matrix based on the plurality of global model parameters and the first global direction matrix.

13. The computer-program product according to claim 12, wherein updating the controller-specific item parameters matrix for the first iteration of the aggregation model training algorithm includes:
updating the user parameters transformation matrix and the item parameters transformation matrix,
computing a second global direction matrix and a second global objective function, receiving a third subset of the first plurality of messages comprising a second worker-specific direction matrix from each of the plurality of worker nodes, updating the second global direction matrix based at least on the second worker-specific direction matrix received from each of the plurality of worker nodes, receiving a fourth subset of the first plurality of messages comprising a plurality of updated worker-specific model parameters from each of the plurality of worker nodes, updating the plurality of global model parameters based at least on the plurality of updated worker-specific model parameters, and updating the controller-specific item parameters matrix based on the plurality of global model parameters.

14. The computer-program product according to claim 1, wherein:

the aggregation model training algorithm executing at the controller node iteratively updates the controller-specific user parameters matrix and the controller-specific item parameters matrix for at least the first iteration and the second iteration, and alternates in updating the controller-specific user parameters matrix and the controller-specific item parameters matrix, and the first localized model training algorithm executing at the first worker node of the plurality of worker nodes alternates in updating a worker-specific user parameters matrix and a worker-specific item parameters matrix based on an implicit feedback data subset allocated to the respective worker node and a plurality of global model parameters received from the controller node.

15. The computer-program product according to claim 1, wherein training the model includes:

after broadcasting the controller-specific user parameters matrix and the controller-specific item parameters matrix to each worker node of the plurality of worker nodes:

concurrently executing the aggregation model training algorithm at the controller node, the first localized model training algorithm at the first worker node of the plurality of worker nodes, and the plurality of additional localized model training algorithms across the remainder of the plurality of worker nodes until the training termination condition is satisfied.

16. A computer-implemented method comprising:

receiving an input comprising a plurality of pre-defined factor matrices and an implicit feedback dataset partitioned into a plurality of implicit feedback data subsets;

distributing the input across a controller node and a plurality of worker nodes implemented in a distributed computing environment; and training a model using the controller node and the plurality of worker nodes, wherein training the model includes:

initializing, by the controller node, a controller-specific user parameters matrix and a controller-specific item parameters matrix, broadcasting, by the controller node, the controller-specific user parameters matrix and the controller-specific item parameters matrix to each worker node of the plurality of worker nodes, and concurrently executing an aggregation model training algorithm at the controller node, a first localized model training algorithm at a first worker node of the plurality of worker nodes, and a plurality of additional localized model training algorithms across a remainder of the plurality of worker nodes until a training termination condition is satisfied, wherein:

the plurality of additional localized model training algorithms compute a plurality of worker-specific direction matrices, the first localized model training algorithm aggregates the plurality of worker-specific direction matrices into an aggregate worker-specific direction matrix using a binary tree, the aggregation model training algorithm iteratively updates the controller-specific user parameters matrix and the controller-specific item parameters matrix for at least a first iteration and a second iteration, the first iteration of the aggregation model training algorithm updates the controller-specific user parameters matrix and the controller-specific item parameters matrix based on a first plurality of messages received from the first localized model training algorithm and each of the plurality of additional localized model training algorithms, wherein the first plurality of messages at least include the aggregate worker-specific direction matrix, and the second iteration of the aggregation model training algorithm updates the controller-specific user parameters matrix and the controller-specific item parameters matrix based on a second plurality of messages received from the first localized model training algorithm and each of the plurality of additional localized model training algorithms, different from the first plurality of messages.

17. The computer-implemented method according to claim 16, wherein:

the implicit feedback dataset comprises a plurality of user-item interaction tuples, wherein a respective user-item interaction tuple of the plurality of user-item interaction tuples represents an interaction between a respective user and a respective item and a weight of the interaction, and the plurality of implicit feedback data subsets are disjoint subsets, wherein a first respective implicit feedback data subset and a second implicit feedback data subset are disjoint subsets when the first respective implicit feedback data subset and the second respective implicit feedback data subset do not share a common user-item interaction tuple.

18. The computer-implemented method according to claim 16, wherein:

the plurality of pre-defined factor matrices include a pre-defined user factors matrix and a pre-defined item factors matrix, and distributing the input across the controller node and the plurality of worker nodes includes:

distributing a copy of the pre-defined user factors matrix to the controller node and each of the plurality of worker nodes, distributing a copy of the pre-defined item factors matrix to the controller node and each of the plurality of worker nodes, and distributing each of the plurality of implicit feedback data subsets to a respective worker node of the plurality of worker nodes.

19. The computer-implemented method according to claim 16, wherein:
the implicit feedback dataset comprises a plurality of user-item interaction tuples that represent interactions between a plurality of users and a plurality of items,
the training termination condition is satisfied when the controller-specific user parameters matrix and the controller-specific item parameters matrix satisfy convergence criteria, and
the model is a matrix factorization model that, once trained, utilizes the controller-specific user parameters matrix and the controller-specific item parameters matrix derived from the training to recommend one or more items of the plurality of items to a user.

20. The computer-implemented method according to claim 19, wherein the training termination condition is further satisfied when a number of iterations for training the model exceeds a pre-determined maximum number of training iterations.

21. The computer-implemented method according to claim 16, wherein:
training the model includes performing a first type of computations and a second type of computations,
the first type of computations requires a user-to-item feedback matrix and a user-item interaction weight matrix,
the second type of computations do not require the user-to-item feedback matrix and the user-item interaction weight matrix,
the first localized model training algorithm and the plurality of additional localized model training algorithms executing across the first worker node and the remainder of the plurality of worker nodes perform the first type of computations, and
the aggregation model training algorithm executing at the controller node performs the second type of computations.

22. The computer-implemented method according to claim 16, wherein the first localized model training algorithm executing at the first worker node of the plurality of worker nodes:
generates a plurality of worker-specific model parameters based on a respective implicit feedback data subset allocated to the first worker node, wherein the plurality of worker-specific model parameters include one or more sparse directional matrices, and
transmits, to the controller node, at one or more pre-determined stages of execution, a respective message of the first plurality of messages that includes the plurality of worker-specific model parameters.

23. The computer-implemented method according to claim 16, wherein the first iteration of the aggregation model training algorithm:
updates a plurality of global model parameters, including the controller-specific user parameters matrix and the controller-specific item parameters matrix, based on a plurality of worker-specific model parameters included in the first plurality of messages, and
transmits, at one or more pre-determined stages of execution, one or more of the plurality of global model parameters to the plurality of worker nodes.

24. A computer-implemented system comprising:
one or more processors;
a memory;
a computer-readable medium operably coupled to the one or more processors, the computer-readable medium having computer-readable instructions stored thereon that, when executed by the one or more processors, cause a computing device to perform operations comprising:
receiving an input comprising a plurality of pre-defined factor matrices and an implicit feedback dataset partitioned into a plurality of implicit feedback data subsets;
distributing the input across a controller node and a plurality of worker nodes implemented in a distributed computing environment; and
training a model using the controller node and the plurality of worker nodes, wherein training the model includes:
initializing, by the controller node, a controller-specific user parameters matrix and a controller-specific item parameters matrix,
broadcasting, by the controller node, the controller-specific user parameters matrix and the controller-specific item parameters matrix to each worker node of the plurality of worker nodes, and
concurrently executing an aggregation model training algorithm at the controller node, a first localized model training algorithm at a first worker node of the plurality of worker nodes, and a plurality of additional localized model training algorithms across a remainder of the plurality of worker nodes until a training termination condition is satisfied, wherein:
the plurality of additional localized model training algorithms compute a plurality of worker-specific direction matrices,
the first localized model training algorithm aggregates the plurality of worker-specific direction matrices into an aggregate worker-specific direction matrix using a binary tree,
the aggregation model training algorithm iteratively updates the controller-specific user parameters matrix and the controller-specific item parameters matrix for at least a first iteration and a second iteration,
the first iteration of the aggregation model training algorithm updates the controller-specific user parameters matrix and the controller-specific item parameters matrix based on a first plurality of messages received from the first localized model training algorithm and each of the plurality of additional localized model training algorithms, wherein the first plurality of messages at least include the aggregate worker-specific direction matrix, and
the second iteration of the aggregation model training algorithm updates the controller-specific user parameters matrix and the controller-specific item parameters matrix based on a second plurality of messages received from the first localized model training algorithm and each of the plurality of additional localized model training algorithms, different from the first plurality of messages.

25. The computer-implemented system according to claim 24, wherein the first iteration of the aggregation model training algorithm:
updates a plurality of global model parameters, including the controller-specific user parameters matrix and the controller-specific item parameters matrix, based on a plurality of worker-specific model parameters included in the first plurality of messages, and transmits, at one or more pre-determined stages of execution, one or more of the plurality of global model parameters to the plurality of worker nodes.

26. The computer-implemented system according to claim 24, wherein the first localized model training algorithm executing at the first worker node of the plurality of worker nodes alternates in updating a worker-specific user parameters matrix and a worker-specific item parameters matrix based at least on an implicit feedback data subset allocated to the first worker node and a plurality of global model parameters received from the controller node.

27. The computer-implemented system according to claim 26, wherein the first localized model training algorithm executing at the first worker node updates the worker-specific user parameters matrix by:
   initializing and updating a first worker-specific direction matrix and a first worker-specific objective function,
   transmitting, to the controller node, a first respective message of the first plurality of messages that includes the aggregate worker-specific direction matrix that further aggregates at least a portion of the first worker-specific direction matrix,
   receiving, from the controller node, a first aggregated direction matrix that is computed from the aggregate worker-specific direction matrix,
   initializing and updating a plurality of worker-specific model parameters based on the first aggregated direction matrix,
   transmitting, to the controller node, a second respective message of the first plurality of messages that includes the plurality of worker-specific model parameters and the first worker-specific objective function,
   receiving, from the controller node, a subset of the plurality of global model parameters that aggregate the plurality of worker-specific model parameters computed by each of the plurality of worker nodes, and
   updating the worker-specific user parameters matrix based at least on the subset of the plurality of global model parameters and the first aggregated direction matrix.

28. The computer-implemented system according to claim 27, wherein the first localized model training algorithm executing at the first worker node updates the worker-specific item parameters matrix by:
   initializing and updating a second worker-specific direction matrix and a second worker-specific objective function,
   transmitting, to the controller node, a third respective message of the first plurality of messages that includes at least a portion of the second worker-specific direction matrix,
   receiving, from the controller node, a second aggregated direction matrix that is computed from the portion of the second worker-specific direction matrix received from each of the plurality of worker nodes,
   updating a plurality of worker-specific model parameters based on the second aggregated direction matrix,
   transmitting, to the controller node, a fourth respective message of the first plurality of messages that includes the plurality of worker-specific model parameters and the second worker-specific objective function,
   receiving, from the controller node, updates to at least a subset of the plurality of global model parameters, and
   updating the worker-specific item parameters matrix based at least on the updates to the subset of the plurality of global model parameters and the second aggregated direction matrix.

29. The computer-implemented system according to claim 24, wherein:
   the aggregation model training algorithm executing at the controller node iteratively updates the controller-specific user parameters matrix and the controller-specific item parameters matrix for at least the first iteration and the second iteration, and alternates in updating the controller-specific user parameters matrix and the controller-specific item parameters matrix, and
   updating the controller-specific user parameters matrix for the first iteration of the aggregation model training algorithm includes:
      initializing and computing an item parameters transformation matrix, a user parameters transformation matrix, a first global direction matrix, and a first global objective function,
      receiving a first subset of the first plurality of messages comprising the aggregate worker-specific direction matrix,
      updating the first global direction matrix based at least on the aggregate worker-specific direction matrix,
      receiving a second subset of the first plurality of messages comprising a plurality of worker-specific model parameters from each of the plurality of worker nodes,
      initializing and updating a plurality of global model parameters based at least on the plurality of worker-specific model parameters received from each of the plurality of worker nodes, and
      updating the controller-specific user parameters matrix based on the plurality of global model parameters and the first global direction matrix.

30. The computer-implemented system according to claim 29, wherein updating the controller-specific item parameters matrix for the first iteration of the aggregation model training algorithm includes:
   updating the user parameters transformation matrix and the item parameters transformation matrix,
   computing a second global direction matrix and a second global objective function,
   receiving a third subset of the first plurality of messages comprising a second worker-specific direction matrix from each of the plurality of worker nodes,
   updating the second global direction matrix based at least on the second worker-specific direction matrix received from each of the plurality of worker nodes,
   receiving a fourth subset of the first plurality of messages comprising a plurality of updated worker-specific model parameters from each of the plurality of worker nodes,
   updating the plurality of global model parameters based at least on the plurality of updated worker-specific model parameters, and
   updating the controller-specific item parameters matrix based on the plurality of global model parameters.

* * * * *